United States Patent [19]

Tsubouchi et al.

[11] Patent Number: 5,208,187
[45] Date of Patent: May 4, 1993

[54] METAL FILM FORMING METHOD

[76] Inventors: Kazuo Tsubouchi, 30-38 Hitokita 2-chrome; Kazuya Masu, 3-3-201, Mikamine 1-chrome, both of Taihaku-ku, Sendai-shi, Miyagi-ken, Japan

[21] Appl. No.: 726,995

[22] Filed: Jul. 8, 1991

[30] Foreign Application Priority Data

Jul. 6, 1990 [JP] Japan .................. 2-177554
Jul. 6, 1990 [JP] Japan .................. 2-177555

[51] Int. Cl.$^5$ .................. H01L 21/44; H01L 21/465; B05D 5/12
[52] U.S. Cl. .................. 437/194; 437/245; 427/124; 156/DIG. 61
[58] Field of Search .......... 437/192, 194, 203; 156/603, DIG. 61, DIG. 63, DIG. 93; 148/403, 404, DIG. 93; 228/193; 427/53.1, 383.7

[56] References Cited

U.S. PATENT DOCUMENTS

| | | | |
|---|---|---|---|
| 4,725,561 | 2/1988 | Haond et al. | 437/62 |
| 4,800,179 | 1/1989 | Mukai | 148/DIG. 93 |
| 5,091,210 | 2/1992 | Mikochiba et al. | 427/39 |

FOREIGN PATENT DOCUMENTS 62-123716 11/1985 Japan .
63-047980 2/1988 Japan .
1-109716 4/1989 Japan .
1-120035 5/1989 Japan .
1-251740 10/1989 Japan .

OTHER PUBLICATIONS

International Electron Device meeting; Dec. 1989, Wash. D.C. pp. 677–680.
1990 Symposium VLSI Technology, Apr.–Jul. 6, 1910, pp. 5–6, Tsubouchi, K. et al., "Selective and Nonselective Deposition of Aluminium by LPCVD using DMAH and Microregion Observation of Single Crystal Aluminium with Scanning Micro-RHEED Microscope".

*Primary Examiner*—Olik Chaudhuri
*Assistant Examiner*—Ramamohan R. Paladugu
*Attorney, Agent, or Firm*—Fitzpatrick, Cella, Harper & Scinto

[57] ABSTRACT

A metal film forming method comprises steps of:
forming a non-monocrystalline metal film principally composed of aluminum, in contact, at least in a part thereof, with a monocrystalline metal principally composed of aluminum; and
heating the non-monocrystalline metal film to convert at least a part thereof into monocrystalline state.

14 Claims, 15 Drawing Sheets

CHECKER PATTERN

BEAR HOLE PATTERN

LINE & SPACE PATTERN

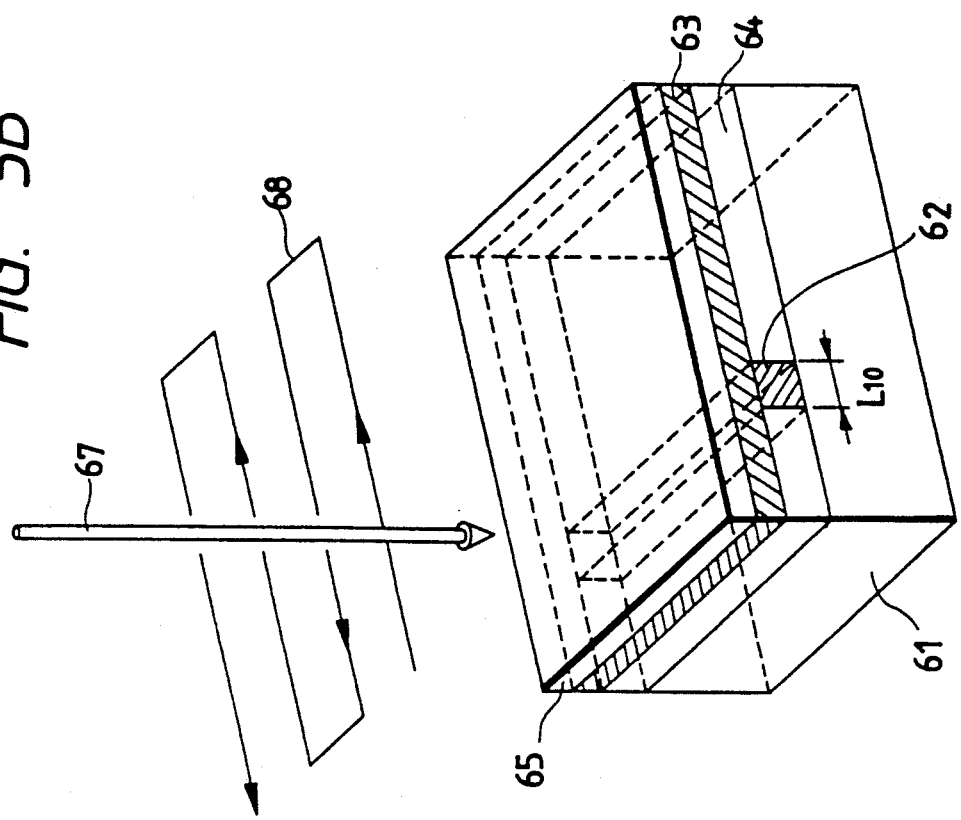
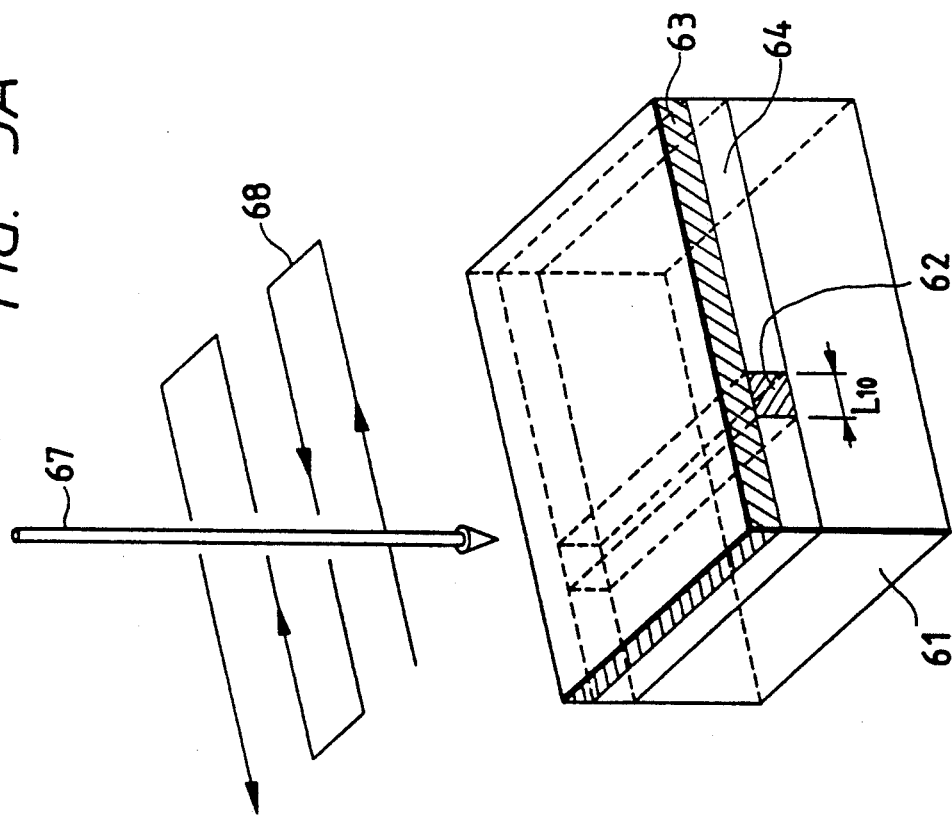

PATTERN ON WAFER

SCANNING μ-RHEED IMAGE

SCANNING μ-RHEED IMAGE

METAL FILM FORMING METHOD

BACKGROUND OF THE INVENTION

1. Field of the Invention

The present invention relates to a method for forming a thin metal film, and more particularly to a method for forming a thin metal film principally composed of aluminum, adapted for use in wirings for example for semiconductor devices.

2. Related Background Art

In the electronic semiconductor devices or integrated circuits, the electrodes and wirings have principally been composed of pure aluminum or a metal principally composed of aluminum, such as Al-Si. Aluminum has various advantages, such as low cost, high electrical conductivity, formation of a dense surficial oxide film capable of chemically protecting the interior, and good adhesion to silicon.

Recent advancements in the level of integration in the ultra large-scale integrated circuits (ULSI) are requiring finer geometry and multi-layered structures in the wirings. For this reason there is required a deposition method for aluminum film, excellent in step coverage, in order to avoid breakage of wirings at a stepped portion. Also required is a deposition method capable of deposition into via holes such as small contact holes or through-holes with satisfactory step coverage, or selective deposition in such via holes. The wirings have to be highly reliable, excellent in resistances to electromigration and stress migration.

In the conventional large-scale integrated circuits (LSI), the deterioration in step coverage at the stepped portions has been prevented by formation of a tapered portion at a step, but the step can no longer be tapered but has become vertical with the miniaturization of geometry. Since sputtering is based on linear particle movement in vacuum, the film thickness at the vertical step becomes inevitably smaller than in other places so that satisfactory step coverage cannot be maintained. Also via holes cannot be filled in completely but generate gaps therein, so that satisfactory contact cannot be expected.

On the other hand, deposition of Al or Al-Si can be deposited by chemical vapor deposition (CVD) in which aluminum-containing gas is transported into a space including a substrate and a desired deposition film is formed by absorption and reaction of a raw material gas on the substrate surface. Such CVD method has a feature of satisfactory step coverage at the stepped portion, because it utilizes the absorption and reaction of the raw material gas on the substrate surface. Selective deposition is also possible, depending on the specy of the substrate surface. The CVD method generally employs an organometallic material, such as trimethylaluminum (TMA; $(CH_3)_6Al_2$), triisobutylaluminum (TIBA; $(iC_4H_9)_3 Al$), or dimethylaluminum hydride (DMAH; $(CH_3)_2HAl$) as the raw material gas. As is already known, the Al film obtained by the CVD method is superior in step coverage to that obtained by sputtering. Also the CVD method is capable of selective deposition on the exposed Si area on a Si substrate bearing $SiO_2$ thereon.

The CVD method utilizing DMAH and hydrogen (Tsubouchi et al., Nikkei Microdevices, Jun. 1, 1990; p.96–102) is capable of selective growth of Al or Al-Si solely on a conductive substrate such as Si or a metal, and the aluminum selectively deposited on Si substrate becomes monocrystalline.

The aluminum area selectively grown on Si, being monocrystalline, is free from errosion or spike generation or deterioration in contact resistance at the Si interface in the thermal treatment. Also after aluminum is selectively deposited in the via hole, it can be deposited over the entire area of the substrate, so that such via hole can be completely planarized by deposition of Al or Al-Si. Consequently satisfactory wirings can be formed, without breakage in the steps, contacts or via holes in the miniaturized ULSI.

Electromigration (EM) is a wiring breakage which occurs when the wiring is continuously given a current, and such breakage is considered to occur at the crystal grain boundary of Al wiring. Also stress migration (SM) is a wiring breakage by a stress in the aluminum wiring, induced by an insulation film such as SiO or SiN provided on said wiring. Al or Al-Si is generally polycrystalline in crystallographic sense. Polycrystals are composed of monocrystalline grains. Each monocrystalline area is called crystal grain, and the interface of grains is called grain boundary. In general, in ULSI's, the size of crystal grain is generally in the order of a micron. The electromigration and the stress migration are major causes deteriorating the reliability of the wirings of Al or Al-Si, and improvement in the resistance to such migration phenomena is an essential condition for improving the reliability of the metal wirings in ULSI's.

Although investigations are being made for improving the resistance to electromigration and stress migration by adding a small amount of Cu or Ti to Al or Al-Si, or by using non-aluminum metal such as W, Mo or Cu, no other materials than Al or Al-Si can be selected for satisfying all the requirements such as adhesion to $SiO_2$, ease of bonding and ease of microworking.

The digest of IEDM (international Electron Devices Meeting) held by IEEE in December 1989 reported, in pages 677–681, that the resistances to EM and SM were significantly improved if Al was monocrystalline.

Thus the wiring of Al or Al-Si, if made in monocrystalline state instead of conventional polycrystalline state, can satisfy the requirements of adhesion, ease of bonding and ease of microworking, and can also attain high reliability without breakage by electromigration or stress migration. However, in the ULSI's, the wirings with monocrystalline Al or Al-Si have not been realized as will be explained in the following.

The monocrystalline thin Al films which have been reported thus far are all formed on monocrystalline Si substrates. The report on improvement in EM/SM resistances by monocrystalline Al (aforementioned 1989 IEDM digest) is also based on the measurement on an Al film formed by CVD on a Si substrate. On the other hand, the Al or Al-Si wirings in ULSI's are formed on an insulating film such as $SiO_2$. On an insulating film such as $SiO_2$, the Al film formed by sputtering, CVD or ICB (ion cluster beam) is polycrystals consisting of crystal grains of the order of a micron.

According to Tsubouchi et al. (reference cited before), after selective deposition of monocrystalline Al (first Al) in the via hole, second Al can be deposited over the entire surface of the substrate. Though the first Al is monocrystalline, the second Al is still polycrystalline, consisting of crystal grains of the order of a micron.

SUMMARY OF THE INVENTION

The present invention, attained in consideration of the foregoing, is based on a new finding of the present inventors, that an Al film present on an insulating member such as $SiO_2$ can also be made monocrystalline by a heat treatment if monocrystalline Al is present in a lower layer.

In the field of semiconductor devices in which a higher level of integration and a higher speed have been sought for by size reduction in circuit geometry as explained above. There is still room for improvement in the reliability of such semiconductor devices which have already been improved in the level of integration and in functions.

An object of the present invention is to provide a method for converting a non-monocrystalline thin metal film, for example a wiring layer, into monocrystalline state, thereby improving the antimigration resistance of the wiring layer.

Another object of the present invention is to provide a thin metal film forming method capable of forming aluminum single crystal on an insulation film.

Still another object of the present invention is to provide a thin metal film forming method comprising steps of forming a non-monocrystalline metal film principally composed of aluminum in contact, at least in a part thereof, with a monocrystalline metal principally composed of aluminum, and heating said non-monocrystalline metal film to convert at least a part thereof into single crystal.

Still another object of the present invention is to provide a thin metal film forming method comprising steps of forming a non-monocrystalline metal film principally composed of aluminum in contact, at least in a part thereof, with a monocrystalline metal principally composed of aluminum, converting said non-monocrystalline metal film into amorphous or microcrystalline state, and heating said non-monocrystalline metal film in said amorphous or microcrystalline state to convert at least a part thereof into monocrystalline state.

Still another object of the present invention is to provide a thin metal film forming method comprising a step of forming an insulation film on a principal face of a semiconductor substrate, a step of forming an aperture in said insulation film thereby exposing the surface of said semiconductor therein, a step of depositing a single crystal of a first metal principally composed of aluminum in said aperture, a step of forming a thin film of a second metal principally composed of aluminum on the single crystal of said first metal and on said insulation film, and a step of heating the thin film of said second metal thereby converting at least a part thereof into a single crystal, utilizing said single crystal of said first metal as a seed crystal.

Still another object of the present invention is to provide a thin metal film forming method comprising a step of forming an insulation film on a principal face of a semiconductor substrate, a step of forming an aperture in said insulation film thereby exposing the surface of said semiconductor, a step of depositing a single crystal of a first metal principally composed of aluminum in said aperture, a step of forming a thin film of a second metal principally composed of aluminum on the single crystal of said first metal and on said insulation film, a step of converting the thin film of said second metal into amorphous or microcrystalline state, and a step of heating the thin film of said second metal to convert at least a part thereof into monocrystalline state, utilizing said single crystal of said first metal as a seed crystal.

The present invention can convert a non-monocrystalline thin metal film, formed in contact with a monocrystalline metal, into monocrystalline state by heating said metal film, utilizing said monocrystalline metal as a seed crystal. Such monocrystalline thin film can be used as a wiring layer in a semiconductor device, thereby improving the migration resistance.

Alternatively, if the non-monocrystalline thin metal film is in polycrystalline state, it may be once converted into amorphous or microcrystalline state (naturally a state of microcrystals mixed in amorphous substance is also acceptable) prior to heating, and such process further improves the migration resistance of the thin metal film.

BRIEF DESCRIPTION OF THE DRAWINGS

FIGS. 5A and 5B are schematic views showing the shape of specimen applicable to the present invention, and a laser beam irradiating method;

FIGS. 15A–15C, 16A–16C and 17A–17C are views showing examples of scanning $\mu$-RHEED images indicating the crystal grain boundaries of an Al film deposited on the entire surface of a specimen, wherein:

FIGS. 15A, 16A and 17A indicate images prior to heating;

FIGS. 15B, 16B and 17B indicate images after heating (diffraction spot 111); and FIGS. 15C, 16C and 17C indicate images after heating (diffraction spot 202)

DESCRIPTION OF THE PREFERRED EMBODIMENTS

Figure 1A:
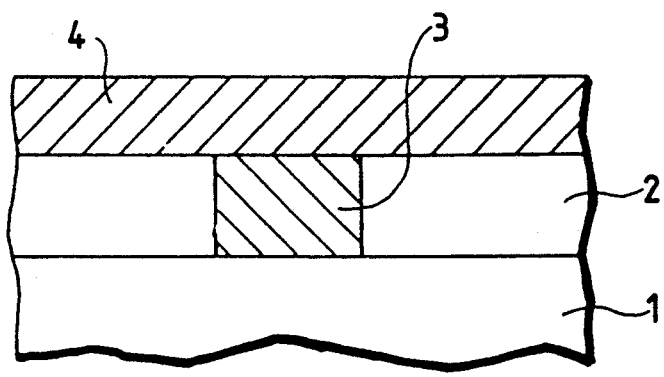
FIGS. 1A to 1C are schematic cross-sectional views showing a method of single crystal formation of the present invention, and a wiring forming method utilizing the same.

In a preferred embodiment of the present invention, a heat treatment is applied to an Al film, containing monocrystalline Al and non-monocrystalline Al in mutual contact in at least a part thereof, thereby converting the non-monocrystalline Al into monocrystalline state.

In another preferred embodiment of the present invention, an ion implantation, followed by a heat treatment, is applied to an Al film, containing monocrystalline Al and non-monocrystalline Al in mutual contact in at least a part thereof, thereby converting the non-monocrystalline Al into monocrystalline state.

The monocrystalline Al used as the seed crystal is preferably formed by aluminum deposition on monocrystalline silicon by a CVD method utilizing dimethylaluminum hydride ($Al(CH_3)_2H$), monomethylaluminum hydride ($Al(CH_3)H_2$) or triisobutylaluminum ($Al(iC_4H_9)_3$) as the raw material gas.

On the other hand, the non-monocrystalline Al may be formed by a method for forming polycrystalline Al by depositing Al by the CVD method utilizing the above-mentioned gas onto a surface of a material other than monocrystalline Al, a method of forming polycrystalline Al by sputtering, or a method of forming polycrystalline Al by a CVD method utilizing trimethylaluminum ($Al(CH_3)_3$) or diethylaluminum chloride ($Al(C_2H_5)_2Cl$).

The monocrystalline Al seed may be so provided that at least a part thereof is in contact with the non-monocrystalline Al to be converted into monocrystalline state. For example the seeds and the insulation film may be arranged in a grating pattern, or the seeds may be deposited in via hole patterns formed in the insulation film, or the seeds and the insulation films may constitute a line-and-space pattern.

In still another preferred embodiment of the present invention, monocrystalline Al formed in an aperture (via hole) in an insulation film is used as the speed crystal, and the non-monocrystalline Al in other parts is converted into monocrystalline state by heating. It is particularly preferable to form monocrystalline Al in the via hole for electrical contact by selective Al deposition therein, then to non-selectively deposit Al also on the insulation film, and to apply the heat treatment thereby converting Al on the insulation film into monocrystalline state. Such method allows to obtain a flat Al film without a recess formation in the Al film on the via hole.

The monocrystalline Al used as the seed is preferably formed by a CVD method utilizing alkylaluminum hydride and hydrogen (said method hereinafter called Al-CVD method). This CVD method is capable of selective Al deposition on an electrondonating surface, such as monocrystalline silicon.

Said alkylaluminum hydride can be dimethylaluminum hydride ($Al(CH_3)_2H$) or monomethylaluminum hydride ($AlCH_3H_2$). The non-monocrystalline Al, prior to conversion to monocrystalline state, can be formed by ordinary sputtering or CVD. The raw material gas for such CVD method can be trimethyl aluminum ($Al(CH_3)_3$), triisobutyl aluminum ($Al(iC_4H_9)_3$), or diethylaluminum chloride ($Al(C_2H_5)_2Cl$). Such method allows to obtain wirings adapted for use in semiconductor devices.

Now the present invention will be clarified in greater detail by embodiments thereof shown in the attached drawings.

FIG. 1 gives schematic cross-sectional views showing the single crystal forming method of the present invention, applied to formation of wirings.

In FIG. 1A, there are shown a substrate 1 composed for example of monocrystalline Si; an insulation film 2 composed for example of silicon oxide; a monocrystalline Al 3 serving as a seed; and an Al layer 4 to be converted into monocrystalline state by the method to be explained later.

At first the insulation film 2 is formed on the substrate 1.

Then a via hole is formed for example by reactive ion etching, thereby exposing a part of the surface of the substrate 1. Said insulation film can be composed, for example, of a silicon oxide film, a silicon nitride film or a silicon oxinitride film such as NSG, PSG, BSG or BPSG. These films can be formed by thermal oxidation, CVD or sputtering already known.

Then monocrystalline Al (first Al) 3 is formed in the via hole. In this operation, the above-explained Al-CVD method may be employed to form monocrystalline Al selectively in said via hole. The substrate surface temperature in this operation is in a range at least equal to the decomposition temperature of alkylaluminum hydride but not exceeding 450° C., more preferably from 260° to 440° C., and most preferably from 270° to 350° C.

Thus formed monocrystalline Al has satisfactory interface with the underlying Si, and also has satisfactory surface properties.

After the formation of monocrystalline Al 3 in the via hole, non-monocrystalline Al (second Al) 4 is formed on the monocrystalline Al 3 and on the insulation film 2. In this case there can be employed already known deposition methods other than said AlCVD method. If the Al-CVD method is to be employed, the insulation film 2, constituting an electron non-donating surface, is subjected to a surface modifying step such as supply of ions or electrons by plasma, plasma damage or ion implantation to obtain a practically electron-donating surface. The non-monocrystalline Al can be formed also on the insulation film by the introduction of such surface modifying step (FIG. 1A).

Subsequently the heat treatment to be explained later is conducted to convert the non-monocrystalline Al into a monocrystalline state. Said heat treatment may be conducted at this point, or after the formation of an insulation film 5.

Also said heat treatment may be conducted after the non-monocrystalline Al, to be converted into monocrystalline state, is patterned into the form of desired wirings, or prior to said patterning.

Figure 1B:
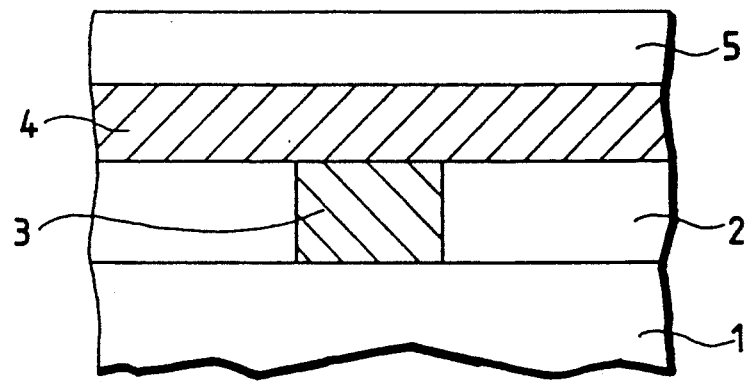

The insulation film 5 is formed after the patterning of Al 4, as shown in FIG. 1B. Said insulation film 5 may be formed, like the insulation film 2, by CVD or sputtering.

The wirings consisting of monocrystalline Al can be obtained in this manner.

Figure 1C:
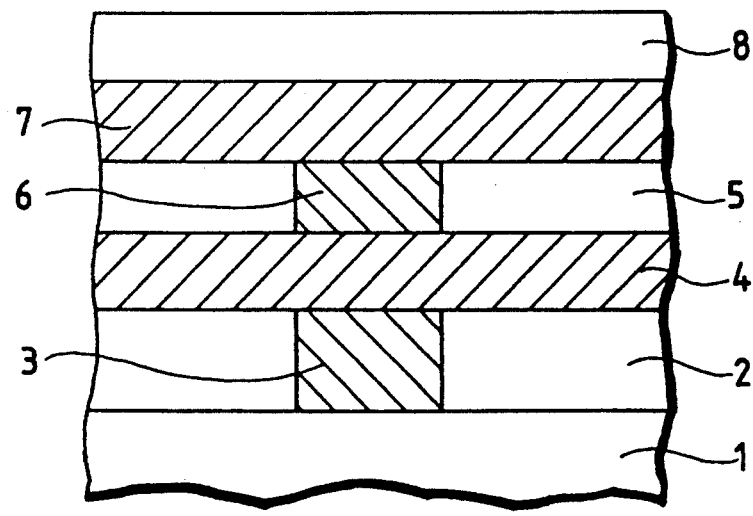

In case of forming multi-layered wirings, the above-explained procedure is repeated to obtain a two-layered wiring structure of monocrystalline Al as shown in FIG. 1C. A three or four-layered wiring structure can also be obtained by repeating said procedure further.

In FIG. 1C, there are shown an interlayer insulation film 5, selectively deposited monocrystalline Al 6, Al 7 in converted monocrystalline state, and a protective insulation film 8.

In the foregoing description, the metal principally composed of Al is limited to pure aluminum, but it is also possible to convert Al containing Si in a small amount, for example 1%, namely Al-Si, to monocrystalline state. In such case, the monocrystalline Al-Si seed can be formed, in the aforementioned Al-CVD method, by introducing Si-containing gas such as $SiH_4$ or $Si_2H_6$ together with alkylaluminum hydride gas and hydrogen gas.

Figure 2A:
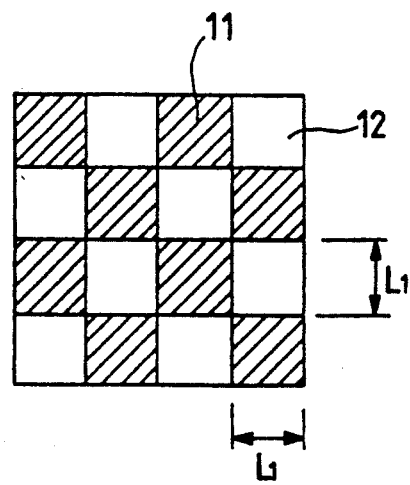
FIGS. 2A, 2B and 2C are schematic plan views showing monocrystalline Al seed patterns applicable to the present invention.
Figure 2B:
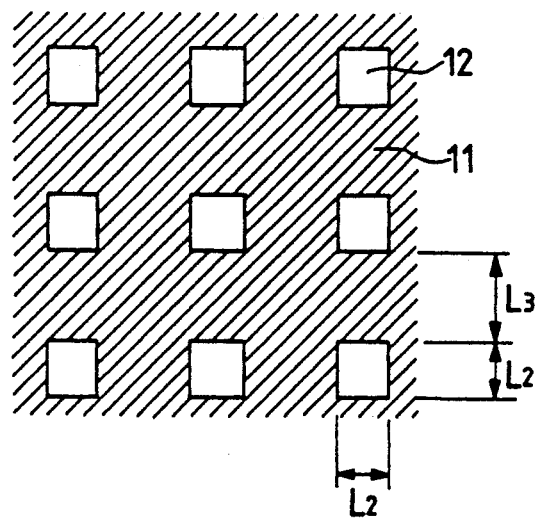
Figure 2C:
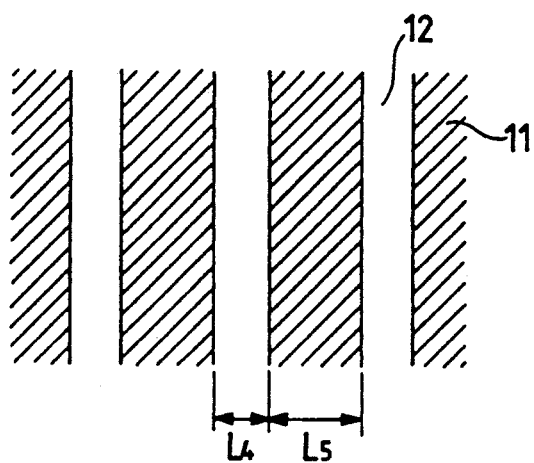

FIG. 2 shows examples of arrangement of monocrystalline Al seeds. In an example shown in FIG. 2A, apertures of a lateral length of L1 are formed in a checkered pattern in an insulation film 11, formed for example on a Si surface, and monocrystalline Al is selectively deposited in said apertures. An unrepresented non-monocrystalline Al film is formed on the insulation film 11 and on the monocrystalline Al in the apertures 12, and is converted into monocrystalline state by heating, utilizing the monocrystalline Al as the seeds. In an example shown in FIG. 2B, apertures of a lateral length L2 are formed as via hole pattern with an interval L3, and, in an example in FIG. 2C, a line-and-space pattern is formed by insulators 11 of a width L5 and apertures 12 of a width L4. In either case the monocrystalline Al is deposited selectively in the apertures, and an unrepresented non-monocrystalline Al film is formed, covering the monocrystalline Al and the insulator. Upon heating, the non-monocrystalline Al film is converted into monocrystalline state, utilizing the monocrystalline Al as the seeds.

In the following there will be explained the heat treating method for converting Al or Al-Si into monocrystalline state.

The basic procedure consists of preparing a specimen of a cross section as shown in FIG. 1A or 1B, and subjecting said specimen to heating step. Observations were made with X-ray diffraction, conventional RHEED and scanning $\mu$-RHEED microscope, before and after the heating.

The transition of the second Al from the polycrystalline state to the monocrystalline state by heating is ascribed to the rearrangement of Al atoms, based on the increased flowability thereof. It is already known that a semiconductor containing a covalent bonding such as Si or GaAs present on a thin insulation film can be converted into monocrystalline state by heating. It is also known that an Al or Al-Si film, present on an insulation film, can be grown into polycrystals consisting of crystal grains of several microns by a heat treatment of 450° C., but the present invention is based on a finding that Al or Al-Si present on an insulator can be converted into monocrystalline state over an area in excess of 10 $\mu$m if a monocrystalline Al area is present under such Al or Al-Si film.

Heating of the specimen can be achieved, for example, by heating in an electric oven with an atmosphere of $H_2$, $N_2$ or Ar or a mixture thereof, heating in vacuum, heating with a rapid thermal annealer (RTA), heating with a laser, heating with a linear heater such as a carbon heater, high frequency heating, lamp heating or electron beam heating.

In a LSI in general, a pure Al film or an Al-Si film formed on Si reacts, when heated, with Si thereby causing erosion of the Si substrate or a leak in the Si pn junction present below the Al or Al-Si film. For this reason, the heating treatment should preferably be conducted at a temperature as low as possible. However, in order that Al or Al-Si can be transformed into monocrystalline state, the Al atoms have to become flowable by thermal energy. Consequently the heating method is preferably such as to heat the Al or Al-Si alone but not the Si substrate present thereunder.

Figure 3:
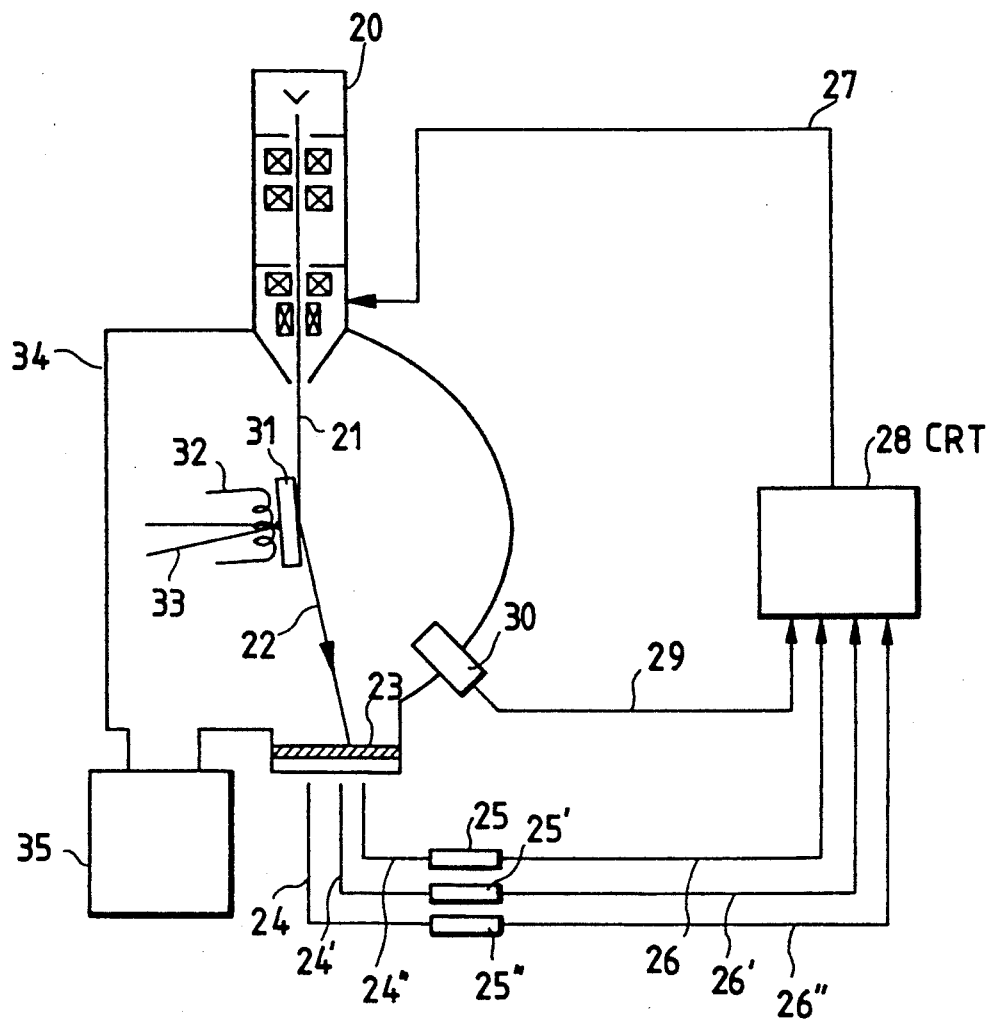
FIG. 3 is a schematic view of a scanning $\mu$-RHEED microscope.

Heating in vacuum can be achieved, in a scanning $\mu$-RHEED microscope shown in FIG. 3, by a heater positioned behind the substrate.

In case of heat treatment in vacuum, there is preferably employed high vacuum of ca. $1 \times 10^{-6}$ Torr or lower, in order to suppress the oxidation of Al surface. In FIG. 3 there are shown an electron gun 20; an electron beam 21; a diffracted electron beam 22; a fluorescent plate 23; optical fibers 24, 24', 24"; photomultipliers 25, 25', 25"; diffraction spot intensity signals 26, 26', 26" converted into electrical signals; a scanning signal 27; a cathode ray tube (CRT) 28; a secondary electron signal 29; a secondary electron detector 30; a specimen 31; a vacuum chamber 34; and a vacuum system 35.

A specimen as shown in FIG. 1A is placed in the vacuum chamber 34, and is heated from the back by a heater 32. The temperature of the specimen is measured from the back thereof by a thermocouple 33. The heating may also be conducted by a lamp or a laser instead of the heater. The vacuum chamber 34 is evacuated by the vacuum system 35, to a level of $5 \times 10^{-10}$ Torr prior to heating, and to a level of $5 \times 10^{-9} - 5 \times 10^{-8}$ Torr during the heating. Though a higher vacuum level is preferable, the conversion to monocrystalline state by heating is still possible even at a higher pressure than stated above.

The transformation of aluminum to the monocrystalline state takes place when the temperature measured by the thermocouple 32 is about 550° C. or higher.

In the following there will be explained a rapid thermal annealer (RTA) which can be employed in the present invention.

The RTA can heat solely the wafer surface within a short period, thereby minimizing the reaction of Al or Al-Si with the Si substrate.

Figure 4:
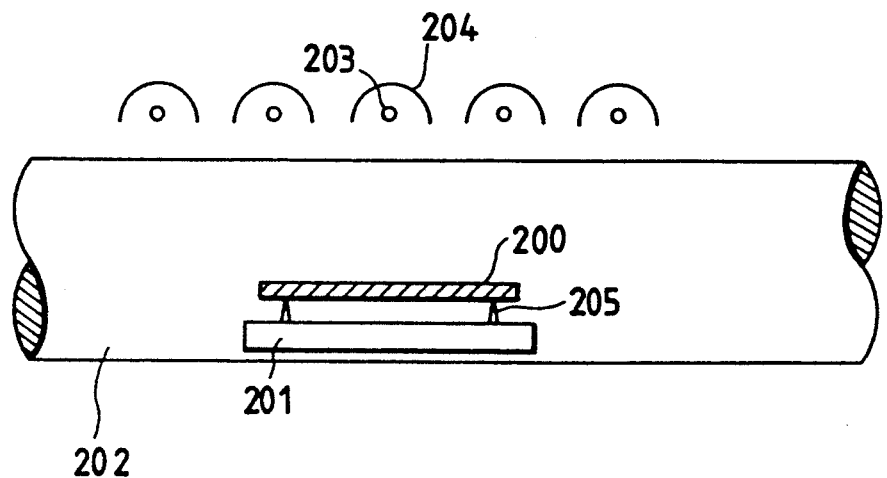
FIG. 4 is a schematic view of an instantaneous heating apparatus (RTA)

FIG. 4 shows an example of the RTA. A substrate 200 is supported by fingers 205 of a quartz substrate support 201. A quartz tube 202 may have a circular or square cross section, or may be replaced by a metal tube, such as a stainless steel tube, equipped with a quartz window. A linear lamp 203, of which light is reflected by a reflector 204 and irradiates the specimen 200 whose Al deposition face is directed to said lamp, may be composed of a halogen lamp, tungsten lamp, a Xe lamp or a Xe-Hg lamp. In the present example there is employed a halogen lamp of a higher heating speed.

At the heating, the interior of the quartz reaction tube is maintained at a low pressure or at atmospheric pressure. The internal atmosphere can be $H_2$, $N_2$ or Ar, or a mixture thereof. The $H_2$ atmosphere is most preferred because highly pure gas, low in contents of moisture and oxygen, is available.

The transformation of Al to monocrystalline state took place when heating was conducted at ca. 550° C. or higher with the RTA of the above-explained structure. Heating from the room temperature to the heat treating temperature took about 5 to 30 seconds, and the heat treatment was conducted for about 10 seconds to 1 minute. No difference was observed in the area of transformation to monocrystalline state, within the above-mentioned range of temperature increasing time or heat treating period.

A heating temperature of ca. 550° C. or higher was necessary for the transformation to monocrystalline state. The substrate temperature was measured at the surface thereof, by means of a radiation thermometer utilizing PbS as a detector.

In the following there will be explained laser heating applicable to the present invention.

Laser heating can also heat the substrate surface only, and has an advantage of providing a wider monocrystalline area than with the RTA.

The laser employable for this purpose can be an argon ion laser (hereinafter represented as Ar laser), a krypton ion laser (hereinafter represented as Kr laser), a He-Ne laser, a $CO_2$ laser, a YAG laser, an excimer laser such as ArF, KrF, XeF or XeCl laser with an output of several to twenty watts. The oscillation frequency can be continuous oscillation or pulsed oscillation of ca. 10-100 Hz.

The laser heating is featured by a fact that the monocrystalline area can be enlarged by scanning of the specimen with the laser beam. Such enlargement of the monocrystalline area by laser scanning will be explained in the following.

Figure 6B:
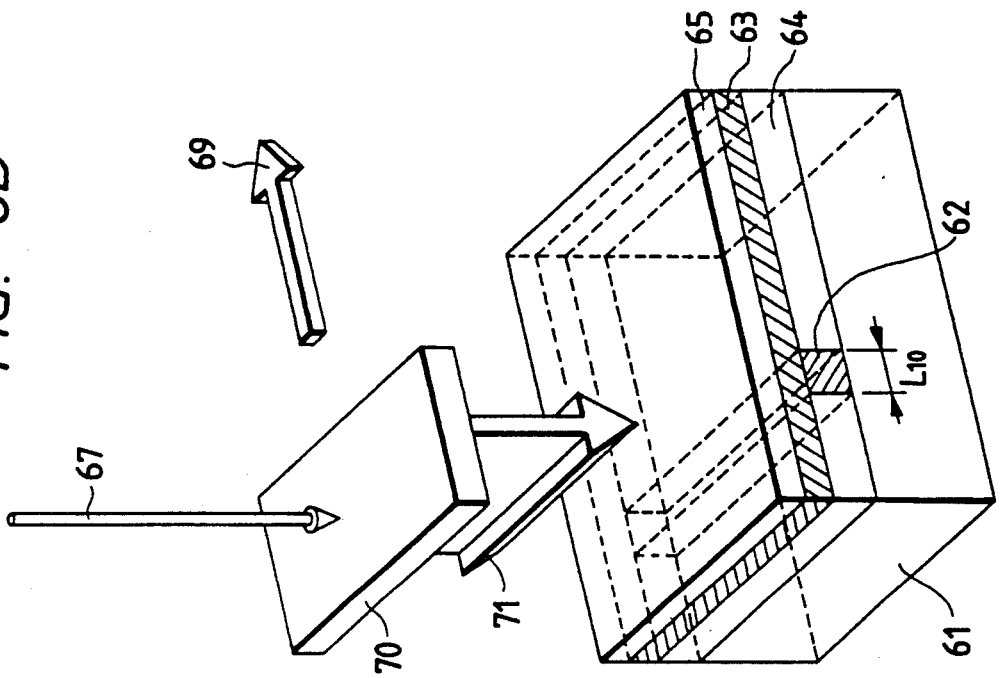
FIGS. 6A and 6B are schematic views showing the shape of specimen applicable to the present invention, and a laser beam irradiating method.
Figure 6A:
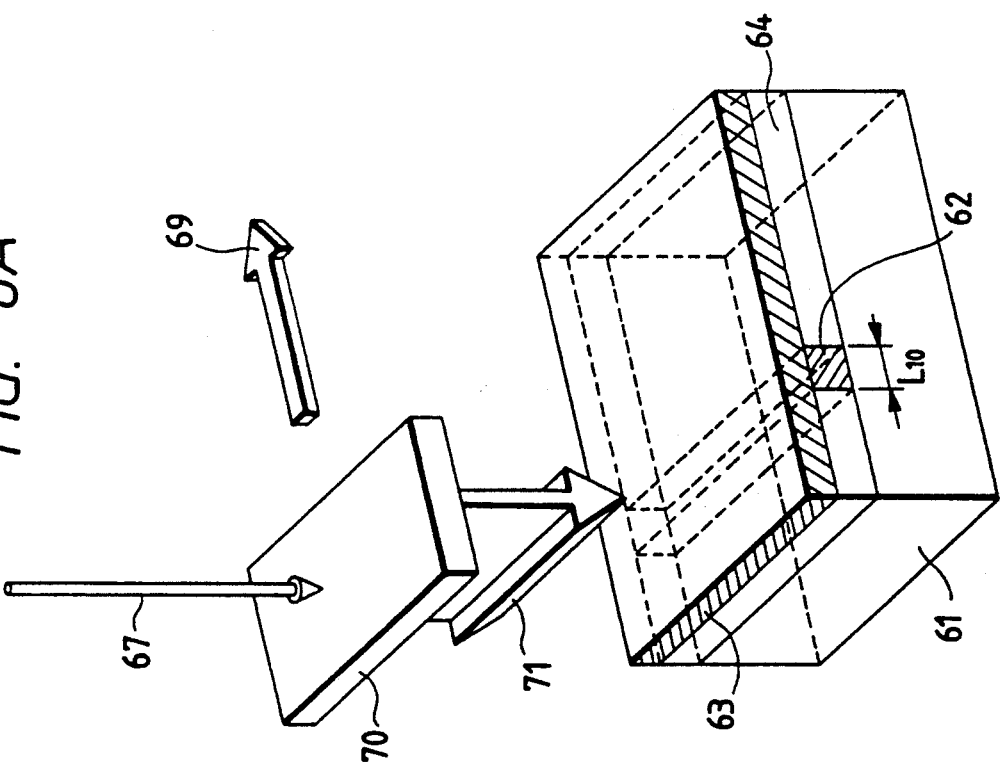
Figure 7A:
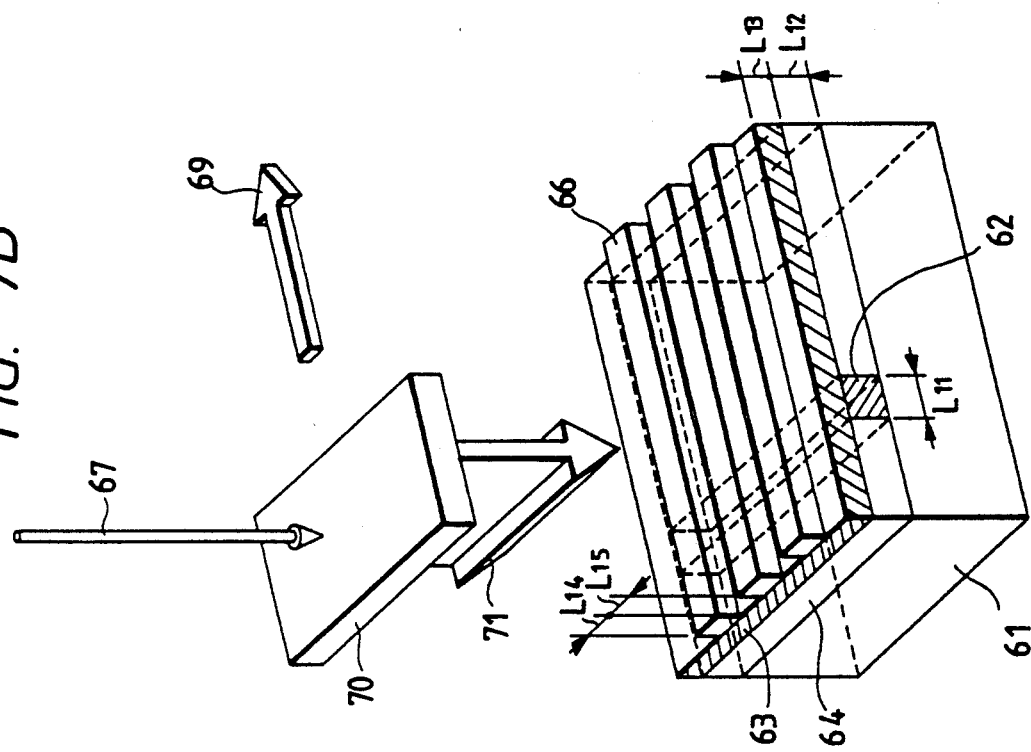
FIGS. 7A and 7B are schematic views showing the shape of specimen applicable to the present invention, and a laser beam irradiating method.
Figure 7B:
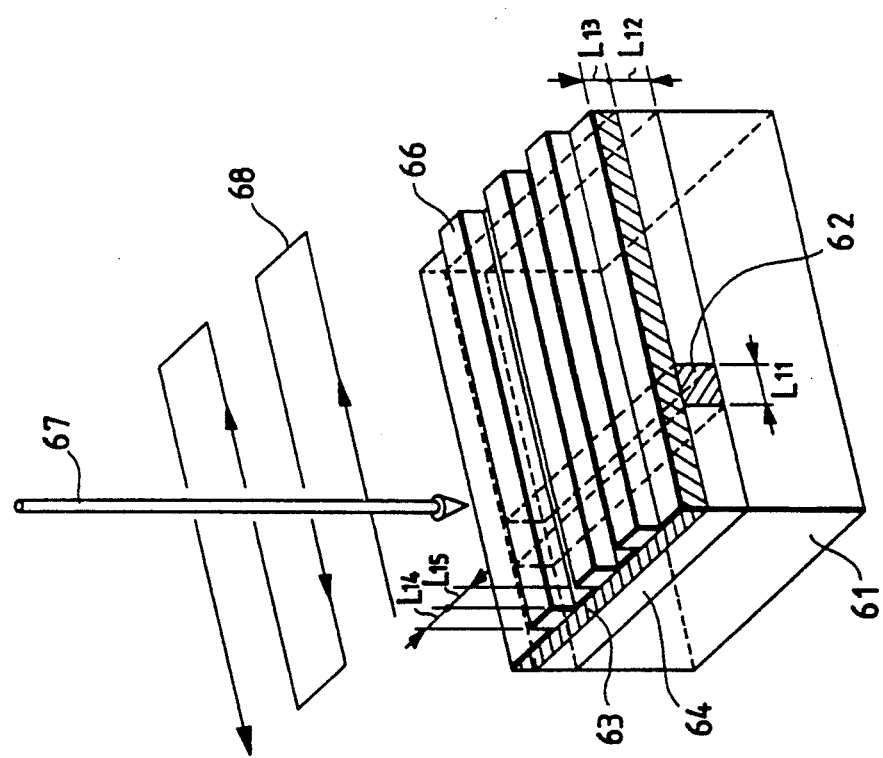

There is employed a specimen on which the first Al 62 is formed with a width L10 on the semiconductor substrate 61, while the second Al 63 is formed over the entire surface of said substrate, as shown in FIGS. 5A, 5B, 6A, 6B, 7A or 7B. On said second Al 63, there may be formed an insulation film 65 over the entire surface as shown in FIG. 5B or 6B. Otherwise an insulation film 66 may be formed in stripes, as shown in FIGS. 7A and 7B, substantially perpendicularly to the lines of the first Al 62.

Said specimen is scanned with a laser beam 67 in reciprocating manner as indicated by a line 68 in FIG. 5A, 5B or 7A, or in one direction as indicated by a line 69 in FIG. 6A, 6B or 7B. In case of FIG. 5A, 5B or 7A, the laser beam is obtained from a continuously oscillated Ar laser or a pulse oscillated XeCl excimer laser and is focused to about 20–100 $\mu$m.

In case of FIG. 6A, 6B or 7B, a laser beam of a circular cross section is converted into a parallel beam 71 by an optical system 70 employing a cylindrical lens.

The scanning direction of such laser beam or parallel laser beam is substantially perpendicular to the line of the first Al 62, as shown in FIG. 5A, 5B, 6A, 6B, 7A or 7B.

In a specimen as shown in FIG. 6A, in which a thermally oxidized $SiO_2$ layer of a thickness of ca. 7000 Å is formed on the Si substrate, with a line width L10 of ca. 10 $\mu$m for the first Al 62 and with a thickness of ca. 5000 Å A for the second Al 63, the beam from an Ar laser is converted into a parallel beam 71 and the specimen is scanned in one direction 69 with a speed of ca. 1 cm/sec. The rear face of the specimen is not heated.

The Ar laser has an output of ca. 20–50 W, with a power density of ca. 50–200 Kw/cm$^2$ on the specimen. The atmosphere of laser heating is $H_2$ gas of 1 atmosphere.

The substrate temperature is measured at the position of irradiation, with a radiation thermometer employing a PbS detector. The transformation to the monocrystalline state of Al on the first insulation film takes place when the substrate temperature is ca. 500° C. or higher.

In the following there will be explained heating with a linear heater, applicable to the present invention.

Figure 8:
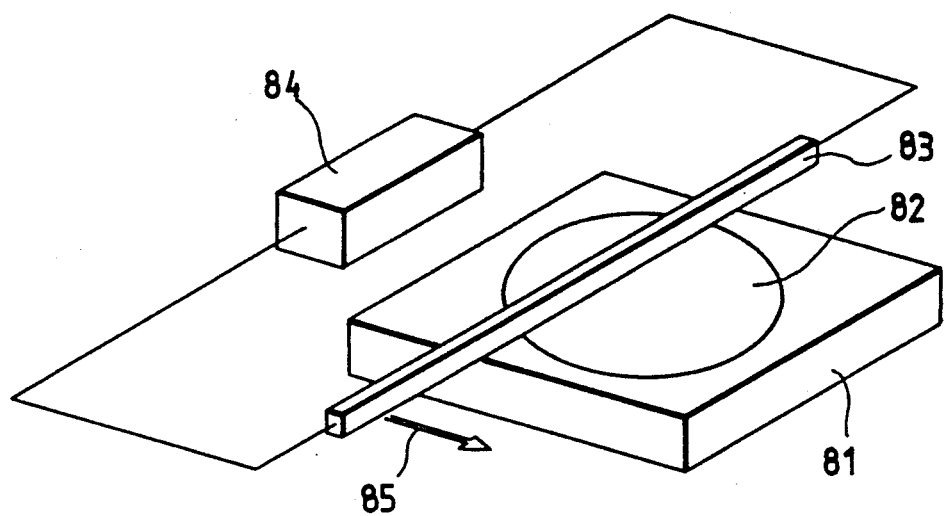
FIG. 8 is a schematic view showing a heating method with a linear heater.

FIG. 8 illustrates the method of heating with a linear heater. The substrate 82 to be heated is placed on a substrate support 81, made of carbon. On said substrate 82 there is positioned a linear heater 83, which is also of carbon and energized by a power source 84. The substrate support 81 is also heated by a heater (not shown) provided at the bottom side of said support. The linear heater 83 moves in a direction 85.

The atmosphere at heating may assume any pressure from vacuum to atmospheric pressure, and is preferably composed of $H_2$, $N_2$ Ar or a mixture thereof in order to prevent the oxidation of Al surface. Single crystal formation is possible also in vacuum, but the structure of the apparatus is simpler when the atmospheric pressure is employed.

The transformation of the second Al to monocrystalline state takes place immediately below the linear heater, when the substrate temperature immediately below the linear heater is ca. 550° C. or higher. The substrate temperature is measured with a radiation thermometer employing a PbS detector.

The feature of heating with such linear heater lies, as in the laser heating, in a fact that the area of monocrystalline transformation can be expanded by scanning the heated area.

In the following there will be explained lamp heating, applicable to the present invention.

Figure 9:
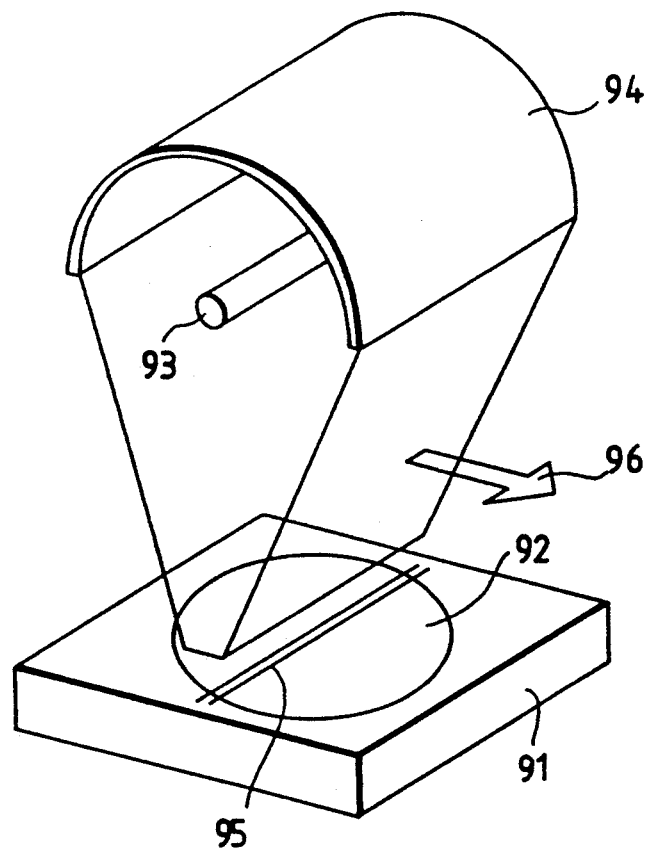
FIG. 9 is a schematic view showing a heating method with a lamp.

FIG. 9 illustrates the heating method with a lamp, wherein a substrate 92 to be heated is placed on a substrate support 91, made of carbon. A lamp 93 can be a mercury lamp, a Hg-Xe lamp, a Xe lamp or a Xe flash lamp, and preferably has a linear structure. The light from the lamp 93 is condensed by a reflector 94 so as to form a line on the substrate surface. The substrate support 91 is also heated by a heater (not shown) provided on the bottom side thereof. The heated area 95 moves on the substrate in a direction 96, by the movement of the lamp. The atmosphere at heating may assume any pressure from atmospheric pressure to vacuum, and is preferably composed of $H_2$, $N_2$, Ar or a mixture thereof, in order to prevent oxidation of the Al surface. The single crystal formation is possible also in vacuum, but the atmospheric pressure allows the employment of a simpler structure of the apparatus.

The transformation of the second Al to monocrystalline state takes place in the heated linear area 95, when the substrate temperature therein is ca. 550° C. or higher. The substrate temperature is measured by a radiation thermometer employing a PbS detector.

In the following there will be explained heating with high frequency, applicable in the present invention.

Figure 10:
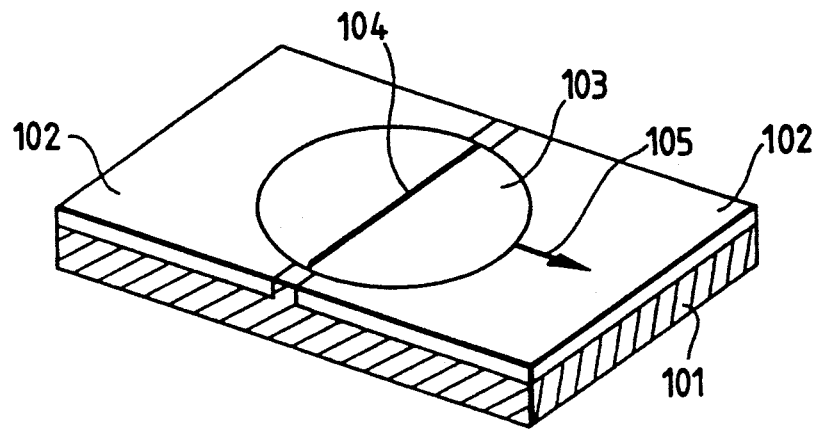
FIG. 10 is a schematic view showing a heating method with a high frequency.

FIG. 10 illustrates the heating method by high frequency heating. A substrate 103 to be heated is placed on a substrate support 101, made of carbon. Quartz plates 102 are provided with a gap therebetween. The substrate support bearing the substrate thereon as shown in FIG. 10 is heated by a high frequency coil (not shown) positioned therearound. Since the quartz plates 102 are not heated by the high frequency, a part 104 of the substrate is heated to a highest temperature.

By a wafer movement in a direction 105, the high temperature area 104 moves on the wafer. The atmosphere at heating may assume any pressure from atmospheric pressure to vacuum, and is preferably composed of $H_2$, $N_2$, Ar or a mixture thereof, in order to prevent oxidation of the Al surface. The single crystal formation is also possible in vacuum, but the atmospheric pressure allows to simplify the structure of the apparatus. In the following embodiment, the pressure of the atmosphere is atmospheric pressure.

The transformation of the second Al to monocrystalline state takes place in the linear heated area 104, when the substrate temperature therein is ca. 550° C. or higher. The substrate temperature is measured with a radiation thermometer employing a PbS detector.

In the following there will be explained heating with an electron beam, applicable to the present invention.

Figure 11:
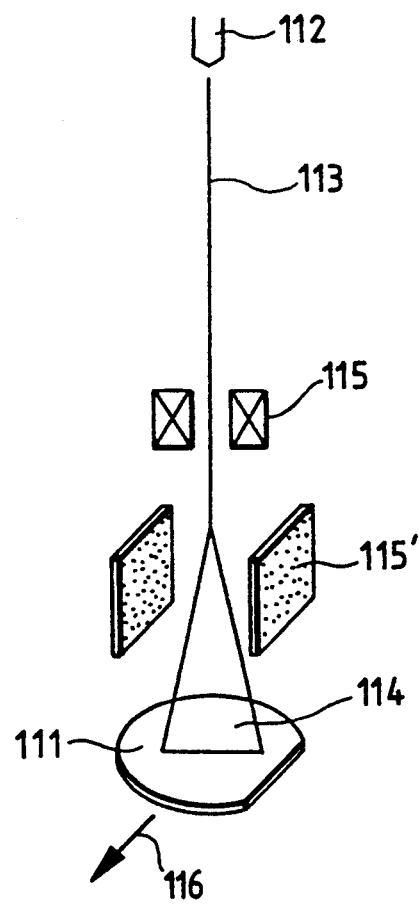
FIG. 11 is a schematic view showing a heating method with an electron beam.

FIG. 11 illustrates the heating method with an electron beam. An electron beam 113 from a filament 112 is focused in the form of a line on a substrate 111 to be heated, by means of a condensing coil 115, a scanning coil and deflecting plates 115'. Thus, on the substrate, a linear portion 114 is heated to a high temperature. With a wafer movement in a direction 116, the heated area 114 also moves on the wafer.

The atmosphere of heating is preferably high vacuum in order to prevent oxidation of the Al surface. The transformation of Al to monocrystalline state takes place at a pressure of ca. $10^{-6}$ Torr or lower. The moving speed of the substrate is ca. 0.5–10 cm/min. The substrate surface temperature in the heated area is measured with a radiation thermometer employing a PbS detector, and the monocrystalline transformation of Al takes place when said temperature is ca. 450° C. or higher.

In the following there will be explained the method of observation of a monocrystalline area with a scanning $\mu$-RHEED microscope shown in FIG. 3.

Figure 12:
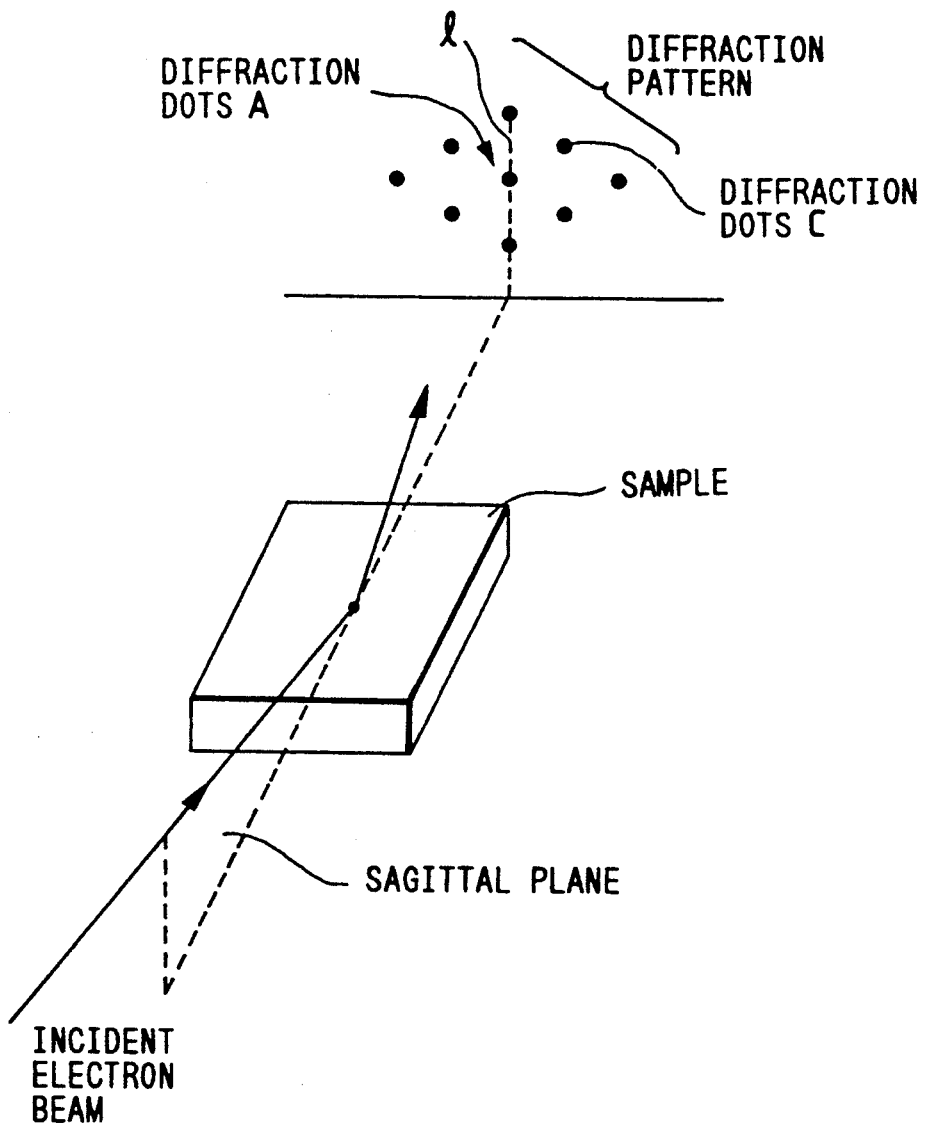
FIG. 12 is a schematic view showing the principle of a scanning $\mu$-RHEED.
Figure 13:
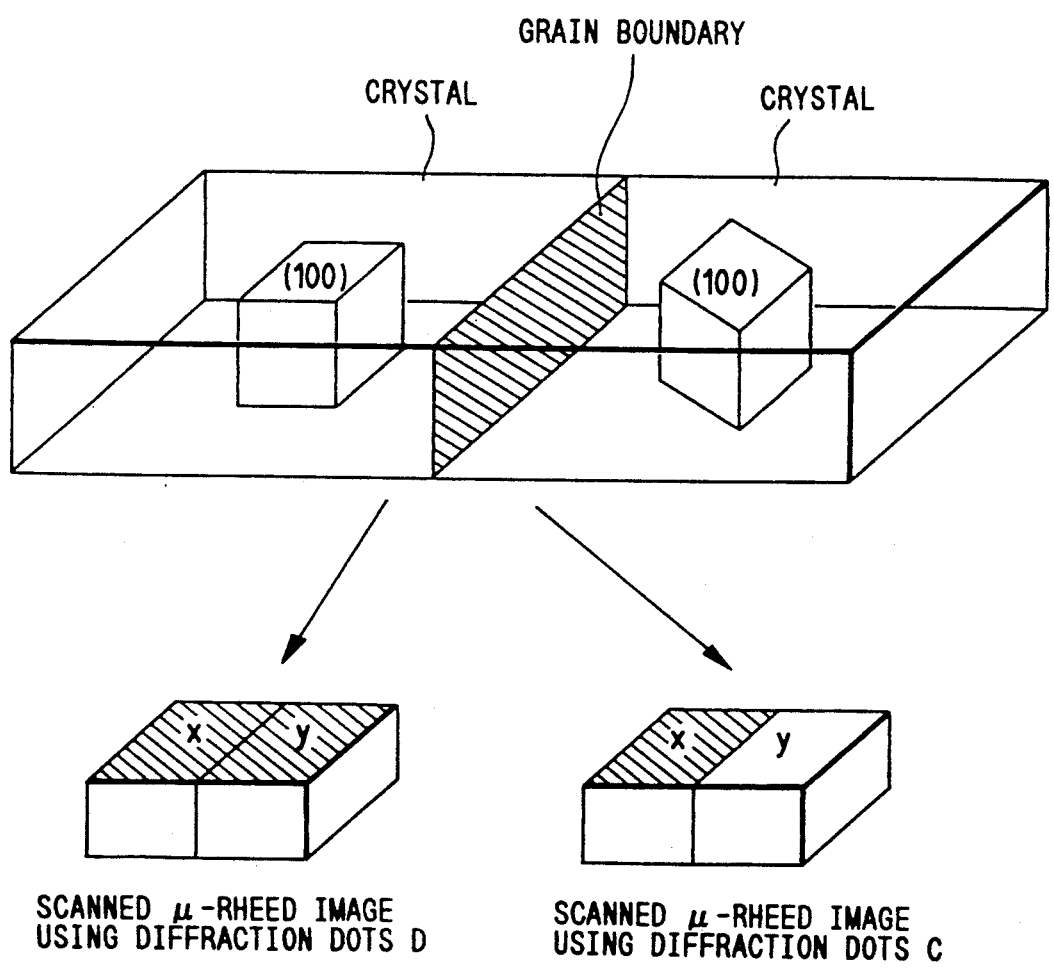
FIG. 13 is a schematic view showing the principle of observation with a scanning $\mu$-RHEED microscope.

The scanning $\mu$-RHEED microscope is disclosed in Extended Abstracts of the 21st Conference on Solid State Devices and Materials (1989) p.217 and Japanese Journal of Applied Physics Vol. 28, No. 11(1989) L2075. The conventional RHEED (reflection high energy electron diffraction) method is to irradiate the specimen surface with an electron beam at a shallow angle of 2–3° and to evaluate the crystallinity of the specimen surface from the diffraction pattern generated by the diffracted electron beam. It can only provide averaged information of the specimen surface, because the diameter of the electron beam is as large as 100 to several hundred $\mu$m. In the scanning $\mu$-RHEED microscope shown in FIG. 3, the diameter of the electron beam from the electron gun 20 is reduced to 0.1 $\mu$m, and the electron beam diffraction pattern from a specified small area on the specimen surface can be observed on the fluorescent plate 23. It is also possible to two-dimensionally scan the specimen surface with the electron beam 21, to guide the diffracted electron beam 22 to the fluorescent plate 23, to utilize the intensity change of an arbitrary diffraction spot on the diffraction pattern as image signals 26, 26', 26", and to obtain a two-dimensional image (scanning $\mu$-RHEED image) of the specimen surface by the diffraction spot intensity change on the CRT 28. In this method, observation of a scanning $\mu$-RHEED image employing different diffraction spots A, C on the diffraction pattern as shown in FIG. 12 allows to separately display the crystal grains in which the lattice planes are parallel to the specimen surface, for example to a plane (100) but are rotated in said plane. Said diffraction spot A is on a line l on which a plane of the diffraction spots and a sagittal plane of the incident electron beam perpendicularly cross, while the diffraction spot C is not on said line l. For example, as shown in FIG. 13, if a lattice plane (100) parallel to the specimen surface has mutual rotation in crystal grains x, y in said plane, the scanning $\mu$-RHEED image utilizing the diffraction spot A shows both the crystal grains x, y as high intensity areas, but the image utilizing the spot C shows only the crystal grain x as the high intensity area. Consequently observation of the scanning $\mu$-RHEED image utilizing the diffraction spots A and C as shown in FIG. 12 allows to identify whether the crystal in the observed area is polycrystalline including in-plane rotation or monocrystalline.

In the following there will be explained examples of monocrystalline transformation of Al on SiO$_2$ by a heat treatment.

There were employed the following specimens.

There were prepared specimens, bearing non-monocrystalline Al formed on a monocrystalline seed pattern as shown in FIG. 2A, 2B or 2C. In a checkered pattern shown in FIG. 2A, L1 was selected in a range of 0.5–20 $\mu$m. In a via hole pattern shown in FIG. 2B, L3 was selected not exceeding 20 $\mu$m. In a line-and-space pattern shown in FIG. 2C, L5 was selecting not exceeding 20 $\mu$m.

Such specimen, when evaluated by X-ray diffraction, only showed a peak of Al(111). Also the observation with the conventional RHEED apparatus with an electron beam diameter of 100 $\mu$m to 1 mm$\phi$ provided a circular pattern shown in FIG. 14A. Consequently the Al deposited over the entire area was identified as polycrystalline with an orientation (111).

Figure 14A:
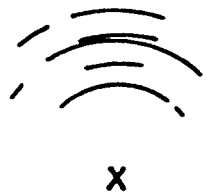
FIGS. 14A and 14B are views showing electron beam diffraction patterns.
Figure 14B:
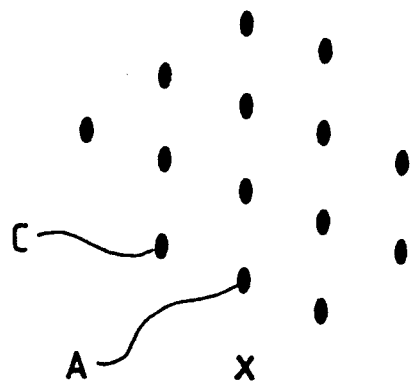
Figure 15A:
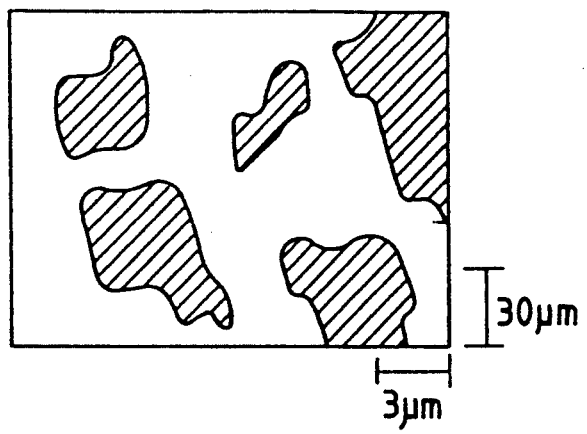

Such X-ray diffraction and conventional RHEED observation proved the polycrystalline state, but were unable to identify the size of the crystal grains. Observation with a scanning $\mu$-RHEED microscope with an electron beam diameter reduced to 0.1 $\mu$m$\phi$ provided a spot pattern shown in FIG. 14B though the intensity was weak. Also FIG. 15A shows the result of observation of the scanning $\mu$-RHEED image, utilizing the spot intensity variation on the diffraction pattern, wherein hatched areas indicate areas with a high diffraction spot intensity, while a white area indicates an area of weak intensity.

The size of the hatched areas suggests that the size of the crystal grains is in the order of several to ten microns.

Figure 15B:
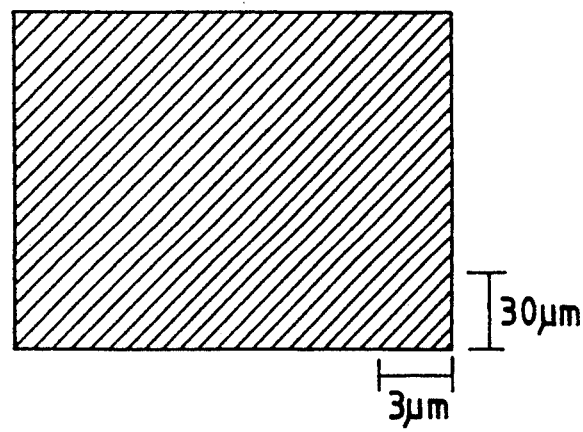
Figure 15C:
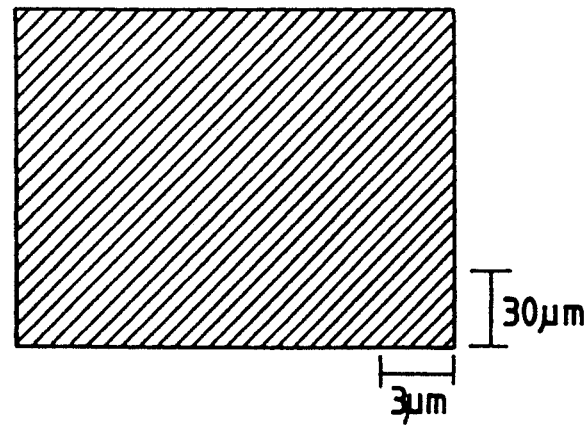

After the same specimen was heated in the scanning $\mu$-RHEED microscope for 15 minutes at 550° C., it was subjected to observation of the electron beam diffraction pattern and the scanning $\mu$-RHEED image. The electron beam diffraction pattern showed spots of higher intensity than those before heating, as shown in FIG. 14B. The spots in FIG. 14B were identified as a diffraction pattern generated when the electron beam is introduced from a direction [101] into the Al(111) plane. FIGS. 15B and 15C indicate the results of observation of the scanning $\mu$-RHEED image, utilizing the intensity of a spot A (111 diffracted spot) and a spot C (202 diffracted spot) on the diffraction pattern in FIG. 14B. In any position on the specimen surface, the spots A, C were both strong, suggesting that all the observed area has turned into monocrystalline state. It was therefore confirmed that an Al film even existing on SiO$_2$ could be transformed into monocrystalline state by heat treatment if monocrystalline Al was present under said Al film. The specimen after heat treatment, when evaluated by X-ray diffraction, showed only a peak of Al(111), and observation with the conventional RHEED apparatus provided a spot pattern indicating monocrystalline state as shown in FIG. 14B.

Figure 16A:
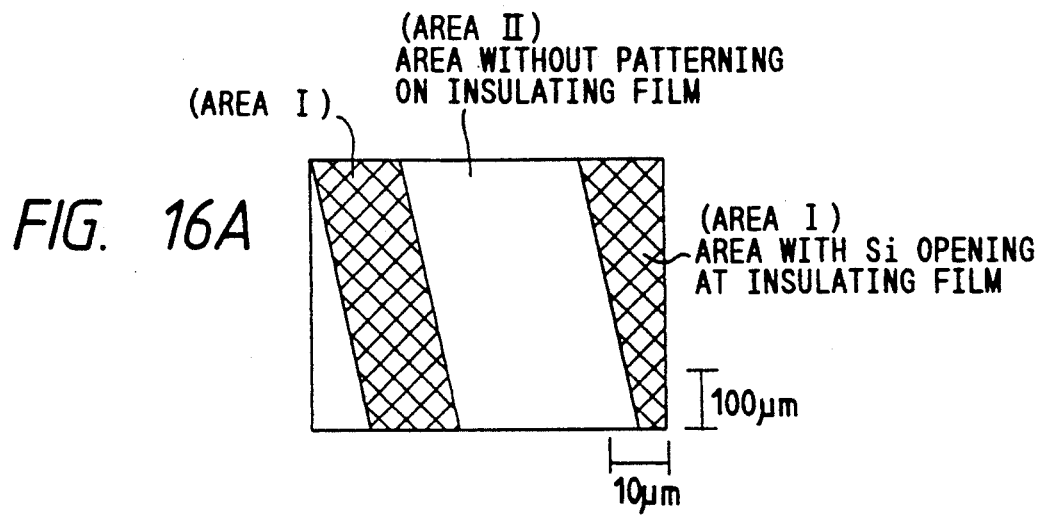

The monocrystalline transformation was also experimented with another specimen, which, as shown in FIG. 16A, is composed of an Si substrate bearing thereon a thermal silicon oxide film of a thickness of 1

μm and having apertures formed by dry etching in said film to expose the Si surface.

In an area I there is formed a checker pattern, a via hole pattern or a line-and-space pattern as shown in FIG. 2A, 2B or 2C, while an area II is entirely covered by SiO$_2$ without such pattern. The substrate with SiO$_2$ pattern as shown in FIG. 16A was at first subjected to deposition of the first Al selectively in the apertures by the CVD method utilizing DMAH and H$_2$, and, after a surface modifying step, the second Al was deposited over the entire surface of the substrate.

The evaluation by X-ray diffraction thereafter showed only an Al(111) peak. Also observation with the conventional RHEED apparatus with an electron beam diameter of 100 μm-1 mmφ provided a ring-shaped electron beam diffraction pattern as shown in FIG. 14A. Consequently the aluminum deposited on the entire surface was identified as polycrystals with an orientation (111). Also observation with the scanning μ-RHEED microscope with an electron beam diameter of 0.1 μm provided electron beam diffracted spots as shown in FIG. 14B though the intensity was weak. The scanning μ-RHEED image obtained by utilizing the diffraction spot intensity on the spot pattern suggested that the specimen consisted of crystal grains of a size of several to ten microns, as shown in FIG. 15A.

Figure 16B:
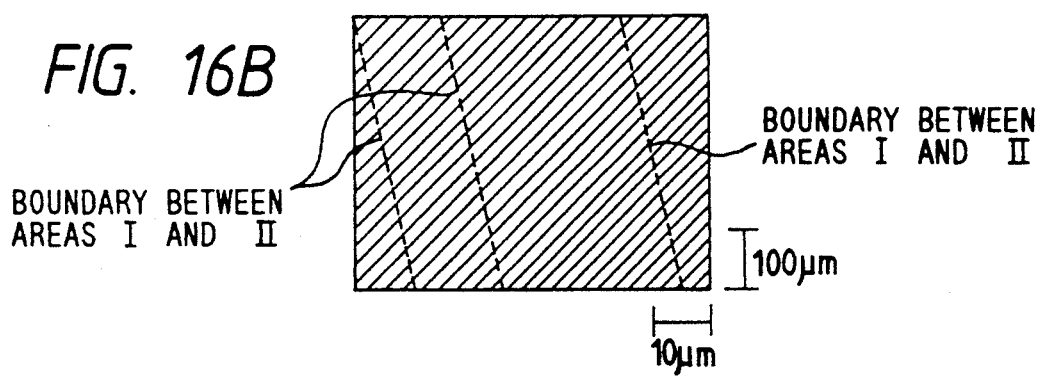
Figure 16C:
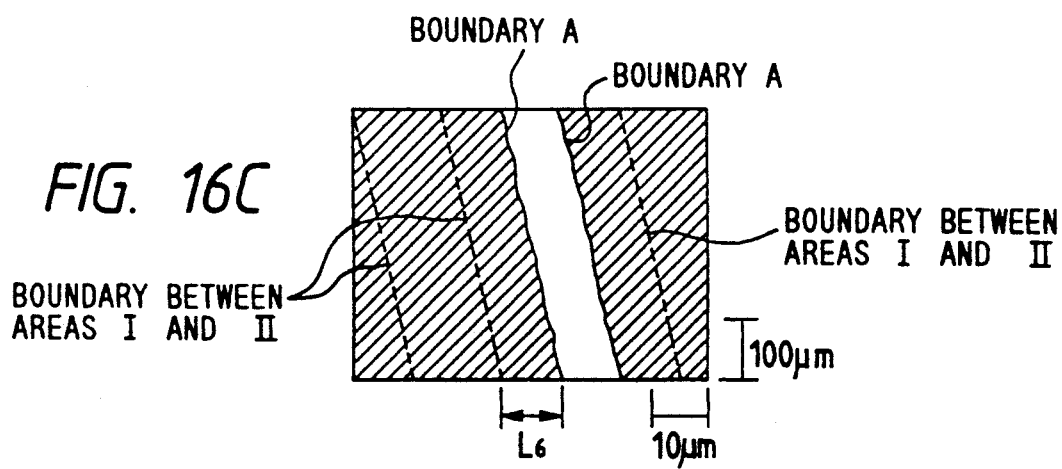

Said specimen was heated in the scanning μ-RHEED microscope for 15 minutes at 645° C., and was subjected to the observation of the electron beam diffraction pattern and the scanning μ-RHEED image. The electron beam diffraction provided a spot pattern as shown in FIG. 14B, with an increased intensity. Said pattern was identified to be generated when the electron beam was introduced from a direction [101] into the Al(111) plane. FIGS. 16B and 16C show the results of observation of the scanning μ-RHEED image, utilizing the intensity of a diffraction spot A (111 diffracted spot) and a diffraction spot C (202 diffracted spot) in the diffraction pattern shown in FIG. 14B. In FIGS. 16B and 16C, hatched areas indicate areas with high diffraction spot intensity, corresponding to (111) single crystal. FIGS. 16B and 16C suggest that the monocrystalline area extended by about 10 82 m from the area I including the apertures. It was therefore confirmed that the transformation to monocrystalline state by heat treatment extended by about 10 μm from the patterned area I, even in the absence of exposed Si under the Al film.

Said transformation extended for about 10 μm from the area I in any of (a) checkered pattern, (b) via hole pattern, and (c) line-and-space pattern shown in FIG. 2.

Within the SiO$_2$ thickness from 500 Å to 1 μm, the area of transformation to monocrystalline state by heat treatment was same as in FIGS. 16B and 16C, regardless of the thickness of SiO$_2$. Also within a range of 500 Å to 1 μm of the thickness of the Al film deposited on SiO$_2$, the area of transformation was the same as in FIGS. 16B and 16C.

In the heating method in which the heated area moves on the substrate, as in the laser heating, heating with linear heater, high frequency heating or electron beam heating, the area of monocrystalline transformation was measured in the following manner.

Figure 17A:
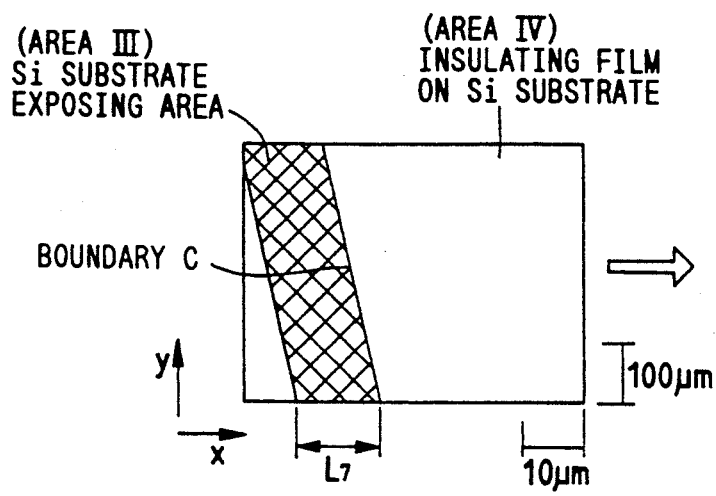

In FIG. 17A, an area III is provided with a checkered pattern, a via hole pattern or a line-and-space pattern as in the area I in FIG. 16A, while an area IV is provided with the first insulation film. The first Al and the second Al were formed on such substrate.

The second Al in deposited state was polycrystals with grains of several to ten microns in size.

With a laser beam as shown in FIG. 5, the scanning is conducted in a direction x shown in FIG. 17A. Also in case of heating with a flat laser beam as shown in FIG. 6, or in case of lamp heating, high frequency heating or electron beam heating, the heated area is moved in said direction x.

Figure 17B:
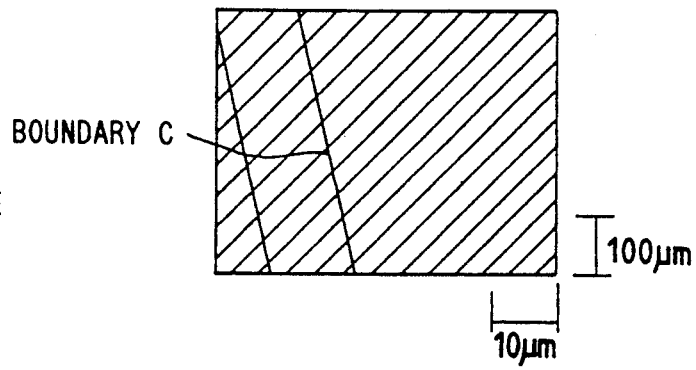
Figure 17C:
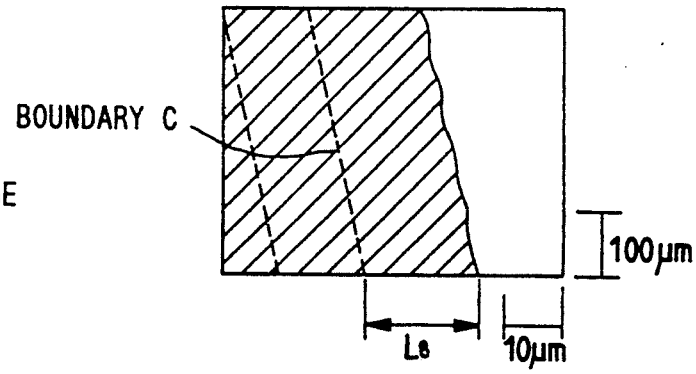

FIGS. 17B and 17C show the results of observation with the scanning μ-RHEED microscope after the heat treatment. The electron beam diffraction pattern by said microscope provided spots as shown in FIG. 14B, with increased intensity than before the heat treatment. The scanning μ-RHEED observation, utilizing the intensity of a diffraction spot A (111 diffracted spot) and a diffraction spot C (202 diffracted spot) in the pattern shown in FIG. 14B provided images shown in FIGS. 16B and 16C, wherein hatched areas indicate areas with high spot intensity. An area, where both spots A and C have high intensity, corresponds to (111) single crystal.

In FIG. 17C, a distance L8 indicates the area transformed to monocrystalline state by heat treatment.

FIG. 17A illustrates the pattern of insulation film, corresponding to FIGS. 17B and 17C. The above-mentioned specimen contains a stripe of the first Al in the area III, and the heated area is moved in the direction x shown in FIG. 17A. Though FIG. 17C shows L8 in a size of about 10 μm, but L8 reached ca. 1 cm in case of laser annealing, heating with linear heater, lamp heating, high frequency heating or electron beam heating.

It was therefore confirmed that the transformation to monocrystalline state extended by about 1 cm from the patterned area, even in the absence of exposed Si under the Al film.

Electromigration resistance was measured on the Al film subjected to monocrystalline transformation on SiO$_2$. The conventional Al or Al-Si wiring obtained by sputtering shows an average service life of $1 \times 10^2$–$10^3$ hours with a wiring cross section of 1 μm$^2$, in a current test of $1 \times 10^6$ A/cm$^2$ at 250° C. On the other hand, the moncrystalline Al wiring of the present invention provided a service life of $10^4$–$10^5$ hours with a cross section of 1 μm$^2$ in the above-mentioned test. Also a wiring with a width of 0.8 μm and a thickness of 0.3 μm provided an average service life of $10^3$–$10^4$ hours in said test.

Also the percentage of wiring breakage was measured by patterning the monocrystalline Al into a width of ca. 1 μm, depositing a silicon nitride film thereon by a CVD method, and applying stress for 1000 hours at 150° C. In the conventional sputtered Al wiring of a length of 1 mm, the percentage of breakage in 1000 lines was 10–20%, but, in the monocrystalline Al wiring of the present invention, no breakage was observed in 1000 lines.

In this manner the monocrystalline Al wiring can drastically improve the resistance to electromigration and stress migration.

Still another preferred embodiment of the present invention utilizes monocrystalline Al formed in a via hole which is formed in an insulation film as a seed crystal, and converts non-monocrystalline Al in other areas into monocrystalline state by heating. It is particularly preferable, after formation of monocrystalline Al by selective deposition of Al in the via hole, to non-selectively deposit Al also on the insulation film, and, after ion implantation, to apply heat treatment thereby converting Al on the insulation film into monocrystalline state. Such method allows to obtain a flat Al film, without formation of a recess in the Al film on the via hole.

The non-monocrystalline Al film is once converted into amorphous or microcrystalline state, and is then transformed into monocrystalline state by heating, employing the monocrystalline Al as a seed crystal.

According to the present invention, the non-monocrystalline Al film, formed as explained above, is subjected to the implantation of $H^+$, $Ar^+$, $Si^+$ or $Al^+$ ions by a known ion implanting method. Although other ions may also be employed, the abovementioned four ions are preferably employed in order not to deteriorate the reliability of the Al or Al-Si wirings for ULSI, and $AL^+$ or $H^+$ ions are most preferable.

Said $H^+$, $Al^+$, $Ar^+$ or $Si^+$ ions are preferably implanted with an acceleration voltage of ca. 50 kV or higher and with a dose of ca. $1 \times 10^{15}$ cm$^{-2}$ or higher. Thus the second Al can be converted into amorphous or microcrystalline state, even when said second Al has a thickness of ca. 5000 Å.

The ion implantation transforms Al, which is polycrystalline when deposited, into amorphous state. Since the Al atoms can more easily flow in the amorphous state than in the polycrystalline state, the transformation to monocrystalline state is achieved at a lower temperature than in the heat treatment at the polycrystalline state. It is already known that a semiconductor having covalent bonds such as Si or GaAs on an insulating film is transformed into monocrystalline state by heat treatment. For example in a method called single phase epitaxy (SPE), silicon deposited on a monocrystalline Si substrate is converted into amorphous state by ion implantation, and is then converted to monocrystalline state by heat treatment for example in an electric oven. The present invention is based on a finding that even a metal film such as of Al present on an insulating film, after conversion into amorphous or microcrystalline state by ion implantation, can be transformed into monocrystalline state at a relatively low temperature. It is already known that an Al or Al-Si film on an insulating film can be grown into a polycrystalline film consisting of crystal grains of several microns by heat treatment of ca. 450° C. However transformation to the monocrystalline state by heat treatment has been impossible because the method of Al deposition for obtaining the structure shown in FIG. 1A has not been known, and also because the selectively deposited Al (first Al in FIG. 1A) has not been monocrystalline. The present invention has enabled, for the first time, to transform an Al film (second Al in FIG. 1A) on an insulating film into monocrystalline state by heat treatment after ion implantation, if selectively grown monocrystalline Al (first Al in FIG. 1A) is present thereunder.

The semiconductor substrate is most preferably a Si substrate, but it may also be composed of GaAs, InP or Ge. The cross sectional structure of the specimen after formation of Al of Al-Si is as shown in FIG. 1A.

In the following embodiments, the transformation to monocrystalline state is realized even if the second Al becomes thinner or thicker on the first Al. Also an insulation film 5 may be present on the second Al film as shown in FIG. 1B. Said insulation film 5 may be composed of $SiO_2$ obtained by normal pressure CVD, phosphor-doped oxide film (PSG), boron-doped oxide film (BSG), phosphor- and boron-doped oxide film (BPSG), silicon nitride film (SiN) obtained by low pressure CVD, or silicon nitride film obtained by ECR.

The method of heat treatment for monocrystalline transformation is same as explained in the foregoing.

In the following there will be explained examples of monocrystalline transformation of Al, including a step of conversion to amorphous or microcrystalline state.

Specimens were prepared with monocrystalline seed patterns as explained before, namely a checkered pattern as shown in FIG. 2A with L1 within a range of 0.5–20 μm, or a via hole pattern as shown in FIG. 2B with L3 of 20 μm or less, or a line-and-space pattern with L5 of 20 μm, and also with non-monocrystalline Al on such monocrystalline seed pattern.

Said specimens, when evaluated by X-ray diffraction, showed only a peak of Al(111). Also observation with the conventional RHEED apparatus with an electron beam diameter of 100 μm to 1 mmφ provided a circular electron beam diffraction pattern as shown in FIG. 14A. Thus the Al deposited over the entire surface was identified as polycrystals with an orientation (111).

Such X-ray diffraction and conventional RHEED observation proved the polycrystalline state, but were unable to identify the size of the crystal grains. Observation with a scanning μ-RHEED microscope with an electron beam diameter reduced to 0.1 μmφ provided a spot pattern shown in FIG. 14B though the intensity was weak. Also FIG. 15A shows the result of observation of the scanning μ-RHEED image, utilizing the spot intensity variation on the diffraction pattern, wherein hatched areas indicate areas with a high diffraction spot intensity, while a white area indicates an area of weak intensity.

The size of the hatched areas suggests that the size of the crystal grains is in the order of several to ten microns.

Said specimen was implanted for example with $Al^+$ ions with an acceleration voltage of 50 kV and with a dose of $1 \times 10^{16}$/cm$^2$.

Said ion implantation caused transformation of the second Al into amorphous or microcrystalline state. Said transformation was confirmed in the following manner. The X-ray diffraction showed a diffraction peak of Al(111) in the deposited state, but, after ion implantation, no longer showed diffraction peak for aluminum. Also observation of the electron beam diffraction pattern by the conventional RHEED apparatus did not show circular nor spot pattern but so-called hallow pattern, indicating that the Al or Al-Si film was transformed by the ion implantation into a state which is not monocrystalline nor polycrystalline but amorphous or microcrystalline.

After the same specimen was heated in the scanning μ-RHEED microscope for 15 minutes at 250° C., it was subjected to observation of the electron beam diffraction pattern and the scanning μ-RHEED image. The electron beam diffraction pattern showed spots of higher intensity than those before heating, as shown in FIG. 14B. The spots in FIG. 14B were identified as a diffraction pattern generated when the electron beam is introduced from a direction [101] into the Al(111) plane. FIGS. 15B and 15C indicate the results of observation of the scanning μ-RHEED image, utilizing the intensity of a spot A (111 diffracted spot) and a spot C (202 diffracted spot) on the diffraction pattern in FIG. 14B. In any position on the specimen surface, the spots A, C were both strong, suggesting that all the observed area has turned into monocrystalline state. It was therefore confirmed that an Al film even existing on $SiO_2$ could be transformed into monocrystalline state by heat treatment, if monocrystalline Al was present under said Al film. The specimen after heat treatment, when evaluated by X-ray diffraction, showed only a peak of Al(111), and observation with the conventional RHEED apparatus provided a spot pattern indicating monocrystalline state as shown in FIG. 14B.

The monocrystalline transformation was also experimented with another specimen, which, as shown in FIG. 16A, is composed of an Si substrate bearing thereon a thermal silicon oxide film of a thickness of 1 $\mu$m and having apertures formed by dry etching in said film to expose the Si surface.

In an area I there is formed a checkered pattern, a via hole pattern or a line-and-space pattern as shown in FIG. 2A, B or C, while an area II is entirely covered by $SiO_2$ without such pattern. The substrate with $SiO_2$ pattern as shown in FIG. 16A was at first subjected to deposition of the first Al selectively in the apertures by the CVD method utilizing DMAH and $H_2$, and, after a surface modifying step, the second Al was deposited over the entire surface of the substrate.

The evaluation by X-ray diffraction thereafter showed only an Al(111) peak. Also observation with the conventional RHEED apparatus with an electron beam diameter of 100 $\mu$m–1 mm$\phi$ provided a ring-shaped electron beam diffraction pattern as shown in FIG. 14A. Consequently the aluminum deposited on the entire surface was identified as polycrystals with an orientation (111). Also observation with the scanning $\mu$-RHEED microscope with an electron beam diameter of 0.1 $\mu$m provided electron beam diffracted spots as shown in FIG. 14B though the intensity was weak. The scanning $\mu$-RHEED image obtained by utilizing the diffraction spot intensity on the spot pattern suggested that the specimen consisted of crystal grains of a size of several to ten microns, as shown in FIG. 15A.

Said specimen was heated in the scanning $\mu$-RHEED microscope for 15minutes at 260° C., and was subjected to the observation of the electron beam diffraction pattern and the scanning $\mu$-RHEED image. The electron beam diffraction provided a spot pattern as shown in FIG. 14B, with an increased intensity. Said pattern was identified to be generated when the electron beam was introduced from a direction [101] into the Al(111) plane. FIGS. 16B and 16C show the results of observation of the scanning $\mu$-RHEED image, utilizing the intensity of a diffraction spot A (111 diffracted spot) and a diffraction spot C (202 diffracted spot) in the diffraction pattern shown in FIG. 14B. In FIGS. 16B and 16C, hatched areas indicate areas with high diffraction spot intensity, corresponding to (111) single crystal. FIGS. 16B and 16C suggest that the monocrystalline area extended by about 10 $\mu$m from the area I containing the apertures. It was therefore confirmed that the transformation to monocrystalline state by heat treatment extended by about 10 $\mu$m from the patterned area I, even in the absence of exposed Si under the Al film.

Said transformation extended for about 10 $\mu$m from the area I in any of A checkered pattern, B via hole pattern, and C line-and-space pattern shown in FIG. 2.

Within the $SiO_2$ thickness from 500 Å to 1 $\mu$m, the area of transformation to monocrystalline state by heat treatment was same as in FIGS. 16B and 16C, regardless of the thickness of $SiO_2$. Also with a range of 500 Å to 1 $\mu$m of the thickness of the Al film deposited on $SiO_2$, the area of transformation was same as in FIGS. 16B and 16C.

Electromigration resistance was measured on the Al film subjected to monocrystalline transformation on $SiO_2$. The conventional Al or Al-Si wiring obtained by sputtering shows an average service life of $1 \times 10^2$–$10^3$ hours with a wiring cross section of 1 $\mu m^2$, in a current test of $1 \times 10^6$ A/cm$^2$ at 250° C. On the other hand, the monocrystalline Al wiring of the present invention provided a service life of $10^4$–$10^5$ hours with a cross section of 1 $\mu m^2$ in the above-mentioned test. Also a wiring with a width of 0.8 $\mu$m and a thickness of 0.3 $\mu$m provided an average service life of $10^3$–$10^4$ hours in said test.

Also the percentage of wiring breakage was measured by patterning the monocrystalline Al into a width of ca. 1 $\mu$m, depositing a silicon nitride film thereon by a CVE method, and applying stress for 1000 hours at 150° C. In the conventional sputtered Al wiring of a length of 1 mm, the percentage of breakage in 1000 lines was 10–20%, but, in the monocrystalline Al wiring of the present invention, no breakage was observed in 1000 lines.

In this manner the monocrystalline Al wiring obtained after conversion to amorphous or microcrystalline state can drastically improve the resistance to electromigration and stress migration.

EXAMPLE 1

The specimen used in the measurement, having a cross-sectional structure as shown in FIG. 1A, was prepared in the following manner.

An Si wafer was subjected to thermal oxidation at 1000° C. by hydrogen combustion ($H_2$: 4 1/min., $O_2$: 2 1/min.). The surface orientation of the Si wafer was (100) or (111). The entire wafer was coated with photoresist and was exposed to a desired pattern by an exposure apparatus. After the photoresist was developed, reactive ion etching was conducted, utilizing the photoresist as a mask, to etch the underlying $SiO_2$, thereby locally exposing the Si surface.

Then an Al film was deposited by a low pressure CVD method, employing dimethylaluminum hydride and hydrogen, with a deposition temperature of ca. 270° C. and a pressure of ca. 1.5 Torr in the reactor tube. At first selective Al deposition (first Al) was conducted solely on the exposed Si surface, then a surface modifying step was conducted by generating plasma in the low pressure CVD apparatus when the Al film thickness became equal to the $SiO_2$ film thickness, and Al (second Al) was deposited on the entire surface.

Following $SiO_2$ patterns and Al film thicknesses were employed on the specimens. The $SiO_2$ film thickness was varied in 5 levels of 1000, 2500, 5000, 7500 and 10000 Å. The checkered pattern shown in FIG. 2A was used on the Si wafer, with size L1 varied in 8 levels of 0.25, 0.5, 1, 2, 3, 5, 10 and 20 $\mu$m. Thickness of the Al film deposited on the entire surface (second Al film 4 in FIG. 1) was varied in 5 levels of 1000, 2500, 5000, 7500 and 10000 Å. Each of the above-mentioned specimens was subjected to the observations of electron diffraction pattern and scanning $\mu$-RHEED image in the scanning $\mu$-RHEED microscope. Then the specimen was heated by energizing the heater, and the above-mentioned observations were conducted again. The heating in the scanning $\mu$-RHEED microscope was varied in 5 levels of (1) 550° C, 6 hrs., (2) 600° C., 2 hrs., (3) 645° C. 15 min., (4) 670° C., 5 min., and (5) 700° C., 5 min.

In the X-ray diffraction conducted after Al deposition but before loading in the scanning $\mu$-RHEED microscope, all the specimens showed only an Al (111) peak, regardless of the SiO2 thickness, size of the checkered pattern, or the second Al thickness. Also in the conventional RHEED apparatus with an electron beam diameter of 100 μm–1 mmφ, all the specimens showed ring-shaped electron beam diffraction patterns as shown in FIG. 14A. It was therefore confirmed that the Al deposited over the entire surface was polycrystals with an orientation (111).

Observation on the scanning μ-RHEED microscope with an electron beam reduced to a diameter of 0.1 μm provided spot electron beam diffraction patterns as shown in FIG. 14B, though the intensity was weak. Also the scanning μ-RHEED image utilizing the diffraction spot intensity on the spot diffraction pattern indicated that the specimens were polycrystals consisting of grains of several to ten microns, as shown in FIG. 15A.

After the heat treatment was conducted in the aforementioned 5 levels in the scanning μ-RHEED microscope, the electron diffraction pattern and the scanning μ-RHEED image were observed. All the specimens showed spot patterns as shown in FIG. 14B with higher intensity than before heating, regardless of the wafer surface orientation, SiO2 film thickness, checkered pattern size or second Al film thickness. The diffractin pattern shown in FIG. 14B was identified, from the spot positions, to be generated when the electron beam was introduced from a direction [101] into the Al(111) plane. The scanning μ-RHEED image obtained utilizing the intensity of the diffracted spot A (111 diffracted spot) and spot C (202 diffracted spot) of the diffracted pattern in FIG. 14B was similar to those shown in FIGS. 15B and 15C, wherein hatched areas indicate areas of high intensity of diffracted spots. The Al film deposited in the checker-patterned area showed high intensity both for the spots A and C, indicating the transformation to monocrystalline state by the heat treatment. Also in observation of the electron diffraction pattern with the conventional RHEED apparatus, all the specimens after heat treatment showed spot pattern as shown in FIG. 14B, indicating the monocrystalline state.

In heat treatment at 670° C., 5 min. or at 700° C., 5 min., the Al film on SiO2 was transformed into monocrystalline state, but showed unevenness in thickness. Also the distribution of elements in the direction of depth, measured by electron spectroscopy for chemical analysis (ESCA) and Auger dectron spectroscopy (AES) after heat treatment, showed diffusion of Al, Si and O at the interface between SiO2 and second Al. Also transformation to monocrystalline state did not take place by the heat treatment at 500° C., 6 hrs.

EXAMPLE 2

Specimens with a cross-section as shown in FIG. 1A were prepared in the same manner as in the example 1, and were heat treated in the scanning μ-RHEED microscope.

Diffrerent from the example 1, the via hole pattern shown in FIG. 2B was formed on the Si wafer, with L2 varied in 5 levels of 0.25, 0.5, 1, 2 and 5 μm and L3 in 5 levels of 1, 2, 5, 10 and 20 μm. Thus there were prepared 25 via hole patterns obtained by taking all the combinations of L2 and L3. The thickness of the SiO2 film and of the Al film (second Al 4 in FIG. 1) deposited over the entire surface were same as those in the example 1.

The specimens prepared as explained above were subjected to heat treatment and observations as in the example 1. The heat treating conditions were same as those in the example 1.

Based on the X-ray diffraction, the electron beam diffraction pattern obtained by the conventional RHEED apparatus, the electron diffraction pattern and scanning μ-RHEED image obtained by the scanning μ-RHEED microscope, the Al deposited on the entire surface (second Al) was identified as polycrystals with an orientation (111) consisting of crystal grains of several to ten microns, as in example 1.

After heat treatment in the aforementioned 5 levels in the scanning μ-RHEED microscope, the specimens were subjected to the observation of electron diffraction pattern and the scanning μ-RHEED image. All the specimens showed, as in the example 1, spot patterns as shown in FIG. 14B with a higher intensity than before the heating, regardless of the wafer surface orientation, SiO2 film thickness, via hole dimensions and second Al film thickness. The scanning μ-RHEED images utilizing the intensities of the diffracted spot A (111 diffracted spot) and C (202 diffracted spot) on the pattern shown in FIG. 14B were similar to those shown in FIG. 15B and 15C, as in the example 1. The Al film deposited in the area of via hole pattern showed strong intensities for both spots A and C, indicating transformation to monocrystalline state by the heat treatment.

As in the example 1, in two heat treating conditions of 670° C., 5 min. and 700° C., 5 min., the Al film on SiO2 was transformed into monocyrstalline state but showed uneven thickness after the heat treatment. Also the measurement of element distribution in the direction of depth by ESCA and AES indicated diffusion of Al, Si and O at the interface between SiO2 and second Al film. Also transformation to monocrystalline state did not occur in the heat treatment of 500° C., 6 hrs.

EXAMPLE 3

Specimens with a cross-section as shown in FIG. 1A were prepared in the same manner as in the example 1, and were heat treated in the scanning μ-RHEED microscope.

Different from the example 1, the line-and-space pattern shown in FIG. 2C was formed on the Si wafer, with L4 varied in 5 levels of 0.25, 0.5, 1, 2 and 5 μm, and L5 in 5 levels of 1, 2, 5, 10 and 20 μm. Thus there were prepared 25 line-and-space patterns obtained by taking all the combinations of L4 and L5. The thicknesses of the SiO2 film and of the Al film (second Al 4 in FIG. 1) deposited over the entire surface were same as those in the example 1. The specimens thus prepared were subjected to the heat treatment and observations in the same manner as in the example 1. The heat treating conditions were also same as those in the example 1.

Based on the results of X-ray diffraction, electron beam diffraction pattern by the conventional RHEED apparatus, electron beam diffraction pattern and scanning μ-RHEED image by the scanning μ-RHEED microscope prior to the heat treatment, the Al deposited on the entire surface (second Al) in all the specimens was identified, as in the example 1, as polycrystals of an orientation (111), consisting of crystal grains of several to ten microns.

After the heat treatment in the aforementioned 5 levels in the scanning μ-RHEED microscope, there were observed the electron beam diffraction pattern and the scanning μ-RHEED image. All the specimens showed spot diffraction patterns as shown in FIG. 14B, with a higher intensity than before heat treatment, regardless of the wafer surface orientation, $SiO_2$ film thickness, line-and-space dimensions or second Al film thickness, as in the example 1. The scanning μ-RHEED images, obtained by utilizing the intensity of the diffraction spot A (111 diffracted spot) and spot C (202 diffracted spot) of the diffraction pattern in FIG. 14B were similar to those shown in FIGS. 15B and 15C, as in the example 2. Thus the Al film deposited on the line-and-space pattern showed high intensities both in the diffraction spots A and C, and was therefore confirmed to have been transformed into monocrystalline state.

As in the example 1, in two heat treating conditions of 670° C., 5 min. and 700° C., 5 min., the Al film on $SiO_2$ was transformed into monocrystalline state but showed uneven thickness after the heat treatment. Also the measurement of element distribution in the direction of depth by ESCA and AES indicated diffusion of Al, Si and O at the interface between $SiO_2$ and second Al film. Also transformation to monocrystalline state did not occur in the heat treatment of 500° C., 6 hrs.

EXAMPLE 4

Specimens with a cross-section as shown in FIG. 1A were prepared in the same manner as in the example 1, and were heat treated in the scanning μ-RHEED microscope.

Said specimens were different from those of the example 1 in the pattern formed on the Si wafer. As shown in FIG. 16A, the $SiO_2$ film is provided with apertures in an area I but is free from such apertures in an area II. The pattern in the area I was the checkered pattern, via hole pattern or line-and-space pattern shown in FIG. 2A, 2B or 2C. In the checkered pattern, the size L1 was varied in 6 levels of 0.25, 0.5, 1, 2, 3 and 5 μm. In the via hole pattern, L2 was varied in 5 levels of 0.25, 0.5, 1, 2 and 5 μm while L3 was varied in 3 levels of 1, 2 and 5 μm, and 15 different patterns were prepared by the combinations of L2 and L3. In the line-and-space pattern, L4 was varied in 4 levels of 0.25, 0.5, 1 and 2 μm while L5 in 3 levels of 1, 2 and 5 μm, and 12 different patterns were prepared by the combinations of L4 and L5. The thicknesses of the $SiO_2$ film and of the Al film deposited on the entire surface (second Al film 4 in FIG. 1A) were same as those in the Example 1. These specimens prepared as explained above were subjected to the heat treatment and the observations in the same manner as in the example 1. The heat treating conditions were same as those in the example 1.

Based on the results of X-ray diffraction, electron beam diffraction pattern by the conventional RHEED apparatus, electron beam diffraction pattern and scanning μ-RHEED image by the scanning μ-RHEED microscope prior to the heat treatment as in the example 1, the Al deposited on the entire surface (second Al) in all the specimens was identified as polycrystals with an orientation (111), consisting of crystal grains of several to ten microns.

After the heat treatment in the aforementioned 5 levels in the scanning μ-RHEED microscope, there were observed the electron beam diffraction pattern and the scanning μ-RHEED image. All the specimens showed spot diffraction patterns as shown in FIG. 14B, with a higher intensity than before the heat treatment, regardless of the wafer surface orientation, $SiO_2$ film thickness, form and dimension of the pattern formed in the area I, and second Al film thickness, as in the example 1. The scanning μ-RHEED images, obtained by utilizing the intensity of the diffraction spot A (111 diffracted spot) and spot C (202 diffracted spot) of the diffraction pattern in FIG. 14B were similar to those shown in FIG. 16B and 16C, wherein hatched areas indicate areas with high intensity of diffracted spots, and a (III) monocrystalline state is present where the diffracted spots A and C are both strong. As shown in FIGS. 16B and 16C, it was found that the area transformed into monocrystalline state extended by about 10 μm (corresponding to L6 in FIG. 16C) from the area I containing apertures. It was thus confirmed that the monocrystalline transformation by heat treatment extended by about 10 μm from the patterned area I even in the absence of the exposed silicon under the Al film.

As in the example 1, in two heat treating conditions of 670° C., 5 min. and 700° C., 5 min., the Al film on $SiO_2$ was transformed into monocrystalline state but showed uneven thickness after the heat treatment. Also the measurement of element distribution in the direction of depth by ESCA and AES indicated diffusion of Al, Si and O at the interface between $SiO_2$ and second Al film. Also transformation to monocrystalline state did not occur in the heat treatment of 500° C., 6 hrs.

EXAMPLE 5

In the examples 1, 2, 3 and 4, the insulation film was composed of $SiO_2$ obtained by thermal oxidation. In the present example, similar specimens as in the foregoing examples were prepared employing, as the insulation film, a $SiO_2$ film obtained by normal pressure CVD (hereinafter represented as CVD $SiO_2$), a boron-doped oxide film obtained by normal pressure CVD (BSG), a phosphor-doped oxide film obtained by normal pressure CVD (PSG), a boron- and phosphor-doped oxide film obtained by normal pressure CVD (BPSG), a nitride film obtained by plasma CVD (P-SiN), a thermal nitride film (T-SiN), a thermal nitride film obtained by low pressure CVD (LP-SiN), and a nitride film obtained by ECR apparatus (ECR-SiN). These specimens were subjected to observations of the X-ray diffraction pattern and the electron beam diffraction pattern by the conventional RHEED apparatus, heat treatment in the scanning μ-RHEED microscope, and observations of the electron beam diffraction pattern and of the scanning μ-RHEED image. The thickness of the insulation films was selected as ca. 5000 Å, except that the thermal nitride film (T-SiN) was made with a thickness of ca. 100 Å. The thickness of the second Al film was selected as ca. 7500 Å. Formed patterns were same as those in the examples 1, 2, 3 and 4.

There were obtained results similar to those in the examples 1, 2, 3 and 4.

EXAMPLE 6

In the examples 1, 2, 3, 4 and 5, the first and second Al films were both prepared by low pressure CVD. In the present example, the second Al film was prepared by sputtering, but other conditions were maintained same as in the examples 1, 2, 3, 4 and 5.

There were obtained similar results to those in the examples 1, 2, 3, 4 and 5.

EXAMPLE 7

In the examples 1, 2, 3, 4, 5 and 6, the first and second Al films were both composed of pure aluminum. In the present example, pure aluminum was replaced by Al-Si, with Si content varied as 0.2, 0.5 or 1.0%.

There were obtained similar results to those in the examples 1, 2, 3, 4, 5 and 6.

EXAMPLE A1

There were prepared specimens same as those in the example 1.

Based on the results of X-ray diffraction, electron beam diffraction pattern by the conventional RHEED apparatus, electron beam diffraction pattern and scanning μ-RHEED image by the scanning μ-RHEED microscope prior to the heat treatment as in the example 1, the Al deposited on the entire surface (second Al) in all the specimens was identified as polycrystals with an orientation (111), consisting of crystal grains of several to ten microns.

These specimens were subjected to heat treatment in the RTA apparatus shown in FIG. 4, with substrate temperature varied in 5 levels of 450°, 500°, 550°, 600° and 650° C., measured with a radiation thermometer employing a PbS probe. The temperature raising time to the heat treating temperature was 10 seconds, and the heat treating time was selected as 10, 20, 40 or 60 seconds.

Then the heat treated specimens were subjected to the observations of the electron beam diffraction pattern and the scanning μ-RHEED image in the scanning μ-RHEED microscope shown in FIG. 3. All the specimens showed the spot electron beam diffraction patterns as shown in FIG. 14B, with a higher intensity than before the heat treatment, regardless of the Si wafer surface orientation, SiO$_2$ film thickness, checkered pattern size or second Al film thickness. The diffraction pattern shown in FIG. 14B was identified, from the position of the diffraction spots, to be generated by the electron beam introduced from a direction [101] into the Al(111) plane. The scanning μ-RHEED images, utilizing the intensity of the diffraction spot A (111 diffracted spot) and spot C (202 diffracted spot) on the diffraction pattern in FIG. 14B were similar to those shown in FIGS. 15A and 15C, wherein hatched areas indicate those with high diffraction spot intensity. The Al film deposited on the checker-patterned area showed high intensities for both the spots A and C, indicating transformation to the monocrystalline state by heat treatment. Also in the observation of the electron diffraction pattern in the conventional RHEED apparatus, all the specimens after the heat treatment showed spot patterns as shown in FIG. 14B indicating the monocrystalline state.

In the heat treatment at 650° C., the Al film on SiO$_2$ was transformed into monocrystalline state but showed unevenness in the thickness after the heat treatment. Also the measurements of element distribution in the direction of depth by electron spectroscopy for chemical analysis (ESCA) and Auger electron spectroscopy (AES), the specimen heat treated at 650° C. showed diffusion of Al, Si and O at the interface between SiO$_2$ and second Al film. Also transformation to monocrystalline state did not occur by the heat treatment at 500° C. or lower.

EXAMPLE A2

Specimens with via hole pattern shown in FIG. 2B were prepared as in the example 2, and subjected to heat treatment in the RTA apparatus. The sizes of the via holes were same as in the example 2.

The specimens mentioned above were subjected to heat treatment and observations in the same manner as in the example A1. The heat treating conditions were same as in the example A1.

Based on the results of X-ray diffraction, electron beam diffraction pattern by the conventional RHEED apparatus, and electron beam diffraction pattern and scanning μ-RHEED image by the scanning μ-RHEED microscope prior to the heat treatment as in the example A1, the Al deposited on the entire surface (second Al) in all the specimens was identified as polycrystals with an orientation (111), consisting of crystal grains of several to ten microns.

After the heat treatment in the RTA apparatus, there were conducted observations of the electron diffraction pattern and the scanning μ-RHEED image. All the specimens showed spot electron beam diffraction patterns as shown in FIG. 14B, with an intensity higher than that before the heat treatment, regardless of the Si wafer surface orientation, SiO$_2$ film thickness, via hole dimensions or second Al film thickness as in the example 1. The scanning μ-RHEED images obtained by utilizing the intensities of the diffraction spot A (111 diffracted spot) and spot C (202 diffracted spot) of the diffraction pattern in FIG. 14B were similar to those shown in FIGS. 15B and 15C, as in the example A1. The Al film deposited on the area of via hole pattern showed high intensities for both spots A and C, indicating transformation to monocrystalline state by heat treatment.

As in the example A1, in the heat treatment at 650° C., the Al film on SiO$_2$ was transformed into monocrystalline state but showed unevenness in the thickness after the heat treatment. Also the measurements of element distribution in the direction of depth by electron spectroscopy for chemical analysis (ESCA) and Auger electron spectroscopy (AES), the specimen heat treated at 650° C. showed diffusion of Al, Si and O at the interface between SiO$_2$ and second Al film. Also transformation to monocrystalline state did not occur by the heat treatment at 500° C.

EXAMPLE A3

Specimens were prepared with the line-and-space patterns as in the example 3 and subjected to heat treatment in the RTA apparatus.

The specimens were subjected to heat treatment and observations in the same manner as in the example A1. The heat treating conditions were same as those in the example A1.

Based on the results of X-ray diffraction, electron beam diffraction pattern by the conventional RHEED apparatus, and electron beam diffraction pattern and scanning μ-RHEED image by the scanning μ-RHEED microscope prior to the heat treatment as in the example A1, the Al deposited on the entire surface (second Al) in all the specimens was identified as polycrystals with an orientation (111), consisting of crystal grains of several to ten microns.

After heat treatment in the RTA apparatus, there were conducted observations of the electron beam diffraction pattern and the scanning μ-RHEED image. All the specimens showed spot electron beam diffraction patterns as shown in FIG. 14B, with a higher intensity than before the heat treatment, regardless of the Si wafer surface orientation, SiO$_2$ film thickness, via hole dimensions or second Al film thickness as in the example A1. The scanning μ-RHEED images obtained by utilizing the intensities of the diffraction spot A (111 diffracted spot) and spot C (202 diffracted spot) of the diffraction pattern in FIG. 14B were similar to those shown in FIGS. 15B and 15C, as in the example A1 The Al film deposited on the area of line-and-space pattern showed high intensities for both spots A and C, indicating transformation to monocrystalline state by heat treatment.

As in the example A1, in the heat treatment at 650° C., the Al film on $SiO_2$ was transformed into monocrystalline state but showed unevenness in the thickness after the heat treatment. Also the measurements of element distribution in the direction of depth by electron spectroscopy for chemical analysis (ESCA) and Auger electron spectroscopy (AES), of Al, Si and O at the interface between $SiO_2$ and second Al film. Also transformation to monocrystalline state did not occur by the heat treatment at 500° C.

EXAMPLE A4

Specimens with a cross-section as shown in FIG. 1A were prepared in the same manner as in the example 1 or A1, and were heat treated in the scanning $\mu$-RHEED microscope.

Said specimens were different from those of the example A1 in the pattern formed on the Si wafer. As shown in FIG. 16A, the $SiO_2$ film is provided with apertures in an area I but is free from such apertures in an area II. The pattern in the area I was the checkered pattern, via hole pattern or line-and-space pattern shown in FIG. 2A, 2B or 2C. In the checkered pattern, the size L1 was varied in 6 levels of 0.25, 0.5, 1, 2, 3 and 5 $\mu$m. In the via hole pattern, L2 was varied in 5 levels of 0.25, 0.5, 1, 2 and 5 $\mu$m while L2 in 3 levels or 1, 2 and 5 $\mu$m, and 15 different patterns were prepared by the combinations of L2 and L3. In the line-and-space pattern, L3 was varied in 4 levels of 0.25, 0.5, 1 and 2 $\mu$m while L5 in 3 levels of 1, 2 and 5 $\mu$m, and 12 different patterns were prepared by the combinations of L4 and L5. The thicknesses of the $SiO_2$ film and of the Al film deposited on the entire surface (second Al film 4 in FIG. 1A) were same as those in the example A1. These specimens prepared as explained above were subjected to the heat treatment and the observations in the same manner as in the example A1. The heat treating conditions were same as those in the example A1.

Based on the results of X-ray diffraction, electron beam diffraction pattern by the conventional RHEED apparatus, and electron beam diffraction pattern and scanning $\mu$-RHEED image by the scanning $\mu$-RHEED microscope prior to the heat treatment as in the example A1, the Al deposited on the entire surface (second Al) in all the specimens was identified as polycrystals with an orientation (111), consisting of crystal grains of several to ten microns.

After the heat treatment in the RTA apparatus, there were conducted observations of the electron diffraction pattern and the scanning $\mu$-RHEED image. All the specimens showed spot electron beam diffraction patterns as shown in FIG. 14B, with a higher intensity than before the heat treatment, regardless of the Si wafer surface orientation, $SiO_2$ film thickness, shape and dimension of the pattern formed in the area I, or second Al film thickness, as in the example A1. The scanning $\mu$-RHEED images obtained by utilizing the intensities of the diffraction spot A (111 diffracted spot) and spot C (202 diffracted spot) of the diffraction pattern in FIG. 14B were similar to those shown in FIGS. 15B and 15C, as in the example A1, wherein hatched areas indicate areas with high intensity of diffracted spots, and a (111) monocrystalline state is present were the diffracted spots A and C are both strong. As shown in FIGS. 16B and 16C, it was found that the area transformed into monocrystalline state extended by about 10 $\mu$m (corresponding to L6 in FIG. 16C) from the area I containing apertures. It was thus confirmed that the monocrystalline transformation by heat treatment extended by about 10 $\mu$m from the patterned area I even in the absence of the exposed silicon under the Al film.

As in the example A1, in the heat treatment at 650° C., the Al film on $SiO_2$ was transformed into monocrystalline state but showed unevenness in the thickness after the heat treatment. Also the measurements of element distribution in the direction of depth by electron spectroscopy for chemical analysis (ESCA) and Auger electron spectroscopy (AES), the specimen heated treated at 650° C. showed diffusion of Al, Si and O at the interface between $SiO_2$ and second Al film. Also transformation to monocrystalline state did not occur by the heat treatment at 500° C.

EXAMPLE A5

In the examples A1, A2, A3 and A4, the first insulation film was composed of $SiO_2$ obtained by thermal oxidation. In the present example, similar specimens as in the foregoing examples were prepared employing, as the first insulation film, an $SiO_2$ film obtained by normal pressure CVD (hereinafter represented as CVD $SiO_2$), a boron-doped oxide film obtained by normal pressure CVD (BSG), a phosphor-doped oxide film obtained by normal pressure CVD (PSG), a boron-and phosphor-doped oxide film obtained by normal pressure CVD (BPSG), a nitride film obtained by plasma CVD (P-SiN), a thermal nitride film (T-SiN), a thermal nitride film obtained by low pressure CVD (LP-SiN), and a nitride film obtained by ECR apparatus (ECR-SiN). These specimens were subjected to observation of the X-ray diffraction pattern and the electron beam diffraction pattern by the conventional RHEED apparatus, then heat treat in the scanning $\mu$-RHEED microscope, and observations of the electron beam diffraction pattern and of the scanning $\mu$-RHEED image. The thickness of the first insulation films was selected as ca. 5000 Å, except that the thermal nitride film (T-SiN) was made with a thickness of ca. 100 Å. The thickness of the second Al film was selected as ca. 7500 Å. Formed patterns were same as those in the examples A1, A2, A3 and A4.

There were obtained similar results to those in the examples A1, A2, A3 and A4.

EXAMPLE A6

In the examples A1, A2, A3, A4 and A5, the first and second Al films were both prepared by low pressure CVD. In the present example, the second Al film was prepared by sputtering, but other conditions were maintained same as in the examples A1, A2, A3, A4 and A5.

There were obtained similar results to those in the examples A1, A2, A3, A4 and A5.

EXAMPLE A7

In the examples A1, A2, A3, A4, A5 and A6, the first and second Al films were both composed of pure aluminum. In the present example, pure aluminum was replaced by Al-Si, with Si content varied as 0.2, 0.5 or 1.0%.

There were obtained similar results to those in the examples A1, A2, A3, A4, A5 and A6.

EXAMPLE A8

In the examples A1–A7, the specimens had the cross-sectional structure as shown in FIG. 1A. After the deposition of the first and second Al as in the examples A1–A7, the specimens were subjected to the formation of a second insulation film 5 as shown in FIG. 1B, and to heat treatment in the RTA apparatus. Conditions were maintained same as in the examples A1–A7, except for the cross-sectional structure. The crystallinity of the second Al film after the heat treatment was observed, after the removal of the second insulation film 5, by the conventional RHEED apparatus and the scanning $\mu$-RHEED microscope.

The insulation film 5 in FIG. 1B was composed of $SiO_2$, PSG, BSG or BPSG obtained by normal pressure CVD, silicon nitride film obtained by plasma CVD, or silicon nitride film obtained by ECR apparatus. The film thickness was varied in 3 levels of 1000, 3000 and 5000 Å in each of said films.

There were obtained similar results to those in the examples A1–A7.

EXAMPLE B1

There were employed specimens same as those in the example 1.

Based on the results of X-ray diffraction, electron beam diffraction pattern by the conventional RHEED apparatus, and electron beam diffraction pattern and scanning $\mu$-RHEED IMAGE BY THE SCANNING $\mu$-RHEED microscope prior to the heat treatment as in the example 1, the Al deposited on the entire surface (second Al) in all the specimens was identified as polycrystals with an orientation (111), consisting of crystal grains of several to ten microns.

The above-mentioned specimens were subjected to laser heating in the following manner. There was employed a continuously oscillated Ar laser (wavelength ca. 488 and 514.5 nm; maximum oscillation output: 20 W), with a beam diameter on the specimen of ca. 20, 30, 70 or 100 $\mu$m. There were conducted scanning motions repeated in one direction, as shown in FIG. 5A. The pitch of the scanning motions was selected approximately equal to the beam diameter. The scanning speed of the laser beam was ca. 0.5, 1, 2, 5 or 10 cm/min. The substrate surface temperature, measured with a radiation thermometer employed a PbS probe, was selected as ca. 450°, 550°, 600°, 650° or 700° C.

The substrate surface temperature was dependent on the laser beam diameter, laser output and laser beam scanning speed. In the following experiments, for each given set of laser beam diameter, laser beam scanning speed and scanning pitch, the laser output was so regulated as to obtain the surface temperature of ca. 450°, 550°, 600°, 650° or 700° C.

The laser heating was conducted in hydrogen gas of atmospheric pressure.

After the heat treatment in the above-mentioned laser heating conditions, there were conducted observations of the electron beam diffraction pattern and the scanning $\mu$-RHEED image in the scanning $\mu$-RHEED microscope. All the specimens showed spot electron beam diffraction patterns as shown in FIG. 14B, with a higher intensity than before heating, if the surface temperature is at least equal to 550° C., regardless of the Si wafer surface orientation, $SiO_2$ film thickness, checkered pattern size or second Al film thickness and also regardless of the laser beam diameter, scanning speed or scanning pitch. The diffraction pattern in FIG. 14B was identified, from the spot position, as generated by the electron beam introduced from a direction [101] into the Al(111) plane. The scanning $\mu$-RHEED images obtained by utilizing the intensities of the diffraction spot A (111 diffracted spot) and spot C (202 diffracted spot) of the diffraction pattern in FIG. 14B were similar to those shown in FIGS. 15B and 15C, wherein hatched areas indicate areas with high intensity of diffracted spots. The Al film deposited on the checker-patterned area showed high intensities for both spots A and C, indicating transformation to monocrystalline state by the heat treatment. Also in the observation of the heat treated specimen by the electron beam diffraction pattern by the conventional RHEED apparatus, all the specimens showed spot pattern indicating monocrystalline state, as shown in FIG. 14B.

In this manner, aluminum which had been in polycrystalline state when deposited was transformed into monocrystalline state by laser heating. In the measurements of element distribution in the direction of depth by Auger electron spectroscopy and secondary ion mass spectroscopy, the specimens treated at 650° C. or higher showed diffusion Si and Al at the interface between the insulation film on the substrate surface and the second Al film.

EXAMPLE B2

Specimens with checkered patterns were prepared in the same manner as in the example 2. The thicknesses of the $SiO_2$ film and of the Al film deposited on the entire wafer surface (second Al film 4 in FIG. 1) were same as those in example 1. Thus prepared specimens were subjected to the heat treatment and the observations in the same manner as in the example B1. The heat treating conditions were same as in the example B1.

Based on the results of X-ray diffraction, electron beam diffraction pattern by the conventional RHEED apparatus, and electron beam diffraction pattern and scanning $\mu$-RHEED image by the scanning $\mu$-RHEED microscope, prior to the heat treatment as in the example B1, the Al deposited on the entire surface (second Al) in all the specimens was identified as polycrystals with an orientation (111), consisting of crystal grains of several to ten microns.

Then heat treatment with laser beam irradiation was conducted in the same conditions as in the example B1, and there were conducted observations of the electron beam diffraction pattern and the scanning $\mu$-RHEED image. As in the example B1, all the specimens treated at a surface temperature of 550° C. or higher were confirmed to be transformed into monocrystalline state, regardless of the Si wafer surface orientation, $SiO_2$ film thickness, checkered pattern size or second Al film thickness and also regardless of the laser beam diameter, scanning speed or scanning pitch. In the measurement of element distribution in the direction of depth by Auger electron spectroscopy or secondary ion mass spectroscopy, the specimens treated at a surface temperature of 650° C. or higher showed diffusion of Si and Al at the interface of the insulation film on the substrate surface and the second Al film, as in the example 1.

EXAMPLE B3

Specimens with a cross section as shown in FIG. 1A were prepared in the same manner as in the example B1 and were subjected to laser heating.

Different from the example B1, said specimens were given line-and-space patterns shown in FIG. 2C, with dimensions L4 and L5 same as in the example 3.

Thus prepared specimens were subjected to the heat treatment and the observations in the same manner as in the example B1. The heat treating conditions were also same as in the example B1.

Based on the results of X-ray diffraction, electron beam diffraction pattern by the conventional RHEED apparatus, and electron beam diffraction pattern and scanning $\mu$-RHEED image by the scanning $\mu$-RHEED microscope, prior to the heat treatment as in the example B1, the Al deposited on the entire surface (second Al) in all the specimens was identified as polycrystals with an orientation (111), consisting of crystal grains of several to ten microns.

Then heat treatment with laser beam irradiation was conducted in the same conditions as in the example B1, and there were conducted observations of the electron beam diffraction pattern and the scanning $\mu$-RHEED image in the scanning $\mu$-RHEED microscope. As in the example B1, all the speciments treated at a surface temperature of 550° C. or higher were confirmed to be transformed into monocrystalline state, regardless of the Si wafer surface orientation, $SiO_2$ film thickness, line-and-space pattern dimensions or second Al film thickness and also regardless of the laser beam diameter, scanning speed of scanning pitch. In the measurement of element distribution in the direction of depth by Auger electron spectroscopy or secondary ion mass spectroscopy, the specimens treated at a surface temperature of 650° C. or higher showed diffusion of Si and Al at the interface between the insulation film on the substrate surface and the second Al film, as in the example B1.

EXAMPLE B4

Specimens were prepared in the same manner as in the examples B1, B2 and B3. The present example is different from said examples in the shape of the laser beam and the scanning method thereof.

The above-mentioned specimens were subjected to heating by a laser, which was a continuously oscillated Ar laser (wavelength ca. 488 and 514.5 nm). The beam on the specimen was a flat parallel beam as shown in FIG. 6A. A circular beam 67 was transformed into a parallel beam 71 by an optical system 70 employing a cylindrical lens. The shape of the parallel beam was ca. 20 $\mu$m $\times$ 1 cm, 50 $\mu$m $\times$ 1 cm or 100 $\mu$m $\times$ 1 cm. The scanning was conducted in one direction as shown in FIG. 6A, with a speed of ca. 0.5, 1, 2, 5 or 10 cm/min. The substrate surface temperature, measured by a radiation thermometer employing a PbS probe, was selected at ca. 450°, 550°, 600°, 650° or 700° C.

The substrate surface temperature was dependent on the shape, output and scanning speed of the laser beam. In the following experiments, for each given set of diameter and scanning speed of the laser beam, the laser output was so regulated as to obtain the surface temperature of ca. 450°, 550°, 600°, 650° or 700° C. mentioned above. The laser heating was conducted in hydrogen gas of atmospheric pressure.

After the heating with the laser beam, the results of observations with the scanning $\mu$-RHEED microscope, X-ray diffraction and convention RHEED apparatus indicated that the second Al was transformed into monocrystalline state, as in the examples B1, B2 and B3, when the substrate surface temperature was ca. 550° C. or higher.

Also as in the examples B1, B2 and B3, the measurement of element distribution in the direction of depth by Auger electron spectroscopy or secondary ion mass spectroscopy showed the diffusion of Si and Al at the interface between the insulation film on the substrate surface and the second Al film, when the substrate surface temperature was 650° C. or higher.

EXAMPLE B5

In the examples B1, B2 and B3, the second Al film was formed on the entire surface of the specimen as shown in cross section in FIG. 1A. In the present example, an insulation film 5 was formed on the specimens of the examples B1, B2 and B3, as shown in FIG. 1B, and the heat treatment with laser was conducted in the same manner as in said foregoing examples. The insulation film on the second Al film was composed of a $SiO_2$ film obtained by normal pressure CVD (hereinafter expressed as CVD $SiO_2$), a boron-doped oxide film obtained by normal pressure CVD (BSG), a phosphor-doped oxide film obtained by normal pressure CVD (PSG), a boron- and phosphor-doped oxide film obtained by normal pressure CVD (BPSG), a nitride film obtained by plasma CVD (P-SiN), or a nitride film obtained by CER apparatus (ECR-SiN). The insulation film on the second Al film will hereinafter be called the second insulation film. The thickness of said second insulation film was selected as 1000, 2000, 5000 or 10000 Å. The laser heating conditions were same as in the examples B1, B2 and B3. After the heating with laser beam, the specimens were subjected to the removal of the second insulation film by etching and then subjected to the observations of the electron beam diffraction pattern and the scanning $\mu$-RHEED image in the scanning $\mu$-RHEED microscope, as in the examples B1, B2 and B3. As in said examples, the obtained results indicated that the second Al was transformed into monocrystalline state when the substrate temperature was 550° C. or higher. Also as in the examples B1, B2 and B3, the measurement of element distribution in the direction of depth by Auger electron spectroscopy or secondary ion mass spectroscopy indicated diffusion of Si and Al at the interface between the insulation film on the substrate surface and the second Al film when the substrate surface temperature was equal to 650° C. or higher

EXAMPLE B6

In the example B4, the second Al film was formed on the entire surface of the specimen as shown in cross section in FIG. 1A. In the present example, a second Al film was formed on the specimens of the example B4 as shown in FIG. 1B, and the laser heating was conducted in the same manner as in said example B4. The insulation film on the second Al film was composed of CVD $SiO_2$, BSG, PSG, BPS, P-SiN or ECR-SiN. Said insulation film on the second Al film will hereinafter be called a second insulation film. The thickness of said second insulation film was selected as 1000, 2000, 5000 or 10000 Å. The laser heating conditions were same as those in the example B4. After the heating with the laser beam, the specimens were subjected to the removal of the second insulation film by etching, and to the observations of the electron beam diffraction pattern and the scanning $\mu$-RHEED image by the scanning $\mu$-RHEED microscope as in the example B4. The obtained results indicated, as in the example B4, that the second Al film was transformed into monocrystalline state when the substrate temperature was 550° C. or higher. Also the measurement of element distribution in the direction of depth by Auger electron spectroscopy or secondary ion mass spectroscopy indicated the diffusion of Si and Al at the interface between the insulation film on the substrate surface and the second Al film, when the substrate surface temperature was 650° C. or higher, as in the example B4.

EXAMPLE B7

In the examples B1, B2, B3 and B4, the insulation film formed on the Si substrate as shown in FIG. 1A was composed of $SiO_2$, formed by thermal oxidation. In the present example, the insulation film on the Si substrate was composed of CVD $SiO_2$, BSG, PSG, BPSG, P-SiN, T-SiN, LP-SiN or ECR-SiN, with thicknesses of 5 levels of 1000, 2500, 5000, 7500 and 10000 Å.

The thicknesses of the first and second Al films, and the laser heating conditions were same as those in the examples B1, B2, B3 and B4.

As in the examples B1, B2 B3 and B4, the second Al was transformed to monocrystalline state when the substrate temperature was 550° C. or higher. Also as in said examples, the measurement of element distribution in the direction of depth by Auger electron spectroscopy or secondary ion mass spectroscopy indicated diffusion of Si and Al at the interface between the insulation film on the substrate surface and the second Al film, when the substrate surface temperature was 650° C. or higher.

EXAMPLE B8

In the example B7, the second Al film was formed over the entire surface of the specimen, as shown in cross section in FIG. 1A. In the present example, an insulation film was formed on the second Al film of the specimens of the example B7, as shown in FIG. 1B, and the heat treatment with the laser beam was conducted in the same manner as in the example B7. The insulation film on the second Al was composed of CVD-$SiO_2$, BSG, PSG, BPSG, P-SiN, T-SiN, LP-SiN or ECR-SiN, with a thickness varied in 5 levels of 1000, 2500, 5000, 7500 and 10000 Å.

The thicknesses of the first and second Al films and the laser heating conditions were same as in the examples B1, B2, B3 and B4. As in the example B7, the second Al was transformed into monocrystalline state when the substrate temperature was 550° C. or higher. Also as in the example B7, the measurement of element distribution in the direction of depth by Auger electron spectroscopy or secondary ion mass spectroscopy indicated diffusion of Si and Al at the interface between the insulation film on the substrate surface and the second Al film, when the substrate surface temperature was 650° C. or higher.

EXAMPLE B9

There was measured the area of monocrystalline transformation of the second Al by laser heating. The specimen had a structure schematically shown in FIG. 5A and a cross section shown in FIG. 1A. The insulation film on the Si substrate was provided with a line of a width L10, which was varied in 6 levels of 0.5, 1, 2, 5, 10 and 20 μm. The surface orientation of the Si substrate was selected as (100) or (111). The insulation film was composed of $SiO_2$ obtained by thermal oxidation, with a thickness varied in 5 levels of 1000, 2500, 5000, 7500 and 10000 Å. Al deposited over the entire surface (second Al 4 in FIG. 1A or second Al 63 in FIG. 5A) had a thickness of 5 levels of 1000, 2500, 5000, 7500 and 10000 Å. By taking combinations of the above-mentioned 4 conditions, namely the Si substrate surface orientation, $SiO_2$ film thickness, width L10 of the first Al and second Al film thickness, there were prepared 2×5×8×6=480 specimens.

Based on X-ray diffraction, electron beam diffraction pattern obtained by the conventional RHEED apparatus, and electron beam diffraction pattern and scanning μ-RHEED image obtained by the scanning μ-RHEED microscope, the second Al was identified as polycrystals consisting of crystal grains of several to ten microns, as in the example 1.

For heating there was employed a continuously oscillated Ar laser (wavelength ca. 488 and 514.5 nm, maximum oscillation output: 20 W). The beam diameter on the specimen was ca. 20, 30, 70 or 100 μm, and the scanning was conducted in one direction in repeated manner as shown in FIG. 5A. The pitch of scanning was selected approximately same as the beam diameter. The scanning speed of the laser beam was ca. 0.5, 1, 2, 5 or 10 cm/min. The substrate surface temperature, measured by a radiation thermometer employing a PbS probe, was selected as ca. 450°, 550°, 600°, 650° or 700° C. The substrate surface temperature was dependent on the diameter, output and scanning speed of the laser beam In the following experiments, for each given set of diameter, scanning speed and scanning pitch of the laser beam, the laser output was so regulated as to obtain the above-mentioned surface temperature of ca. 450°, 550°, 600°, 650° or 700° C. The laser heating was conducted in hydrogen gas of atmospheric pressure.

After the heating with laser, the electron diffraction pattern and the scanning μ-RHEED image were observed in the scanning μ-RHEED microscope. The electron diffraction pattern showed spots with a higher intensity than before the heat treatment, as in the example B1 (FIG. 14B). The scanning μ-RHEED images obtained utilizing the 111 and 202 diffracted spots were similar to those shown in FIGS. 17B and 17C. The direction of the first Al is parallel to y-direction in FIG. 17A, and the scanning direction of the laser beam is parallel to x-direction. The length of area transformed into monocrystalline state can be determined by measuring L8 in FIG. 17C. Though L8 is illustrated as about 10-20 μm in FIG. 17C, it was in fact about 1 cm when the substrate temperature was 550° C. or higher. Stated differently, the second Al film on $SiO_2$ was transformed into monocrystalline state over a length of 1 cm, utilizing monocrystalline first Al as the seed. As in the examples B1, B2, B3 and B4, the measurement of element distribution in the direction of depth by Auger electron spectroscopy or secondary ion mass spectroscopy indicated diffusion of Si and Al at the interface between the insulation film on the substrate surface and the second Al film, when the substrate surface temperature was 650° C. or higher.

EXAMPLE B10

Specimens were prepared in the same manner as in the example B9, and were subjected to heat treatment by laser.

The specimens were different in the cross-sectional structure from those of the example B9. In the specimens of the example B9, the second Al film was formed on the entire surface of the specimen as shown in FIG. 1A or 5A. In this example, an insulation film was formed on the second Al as shown in FIG. 1B or 5B, and the heat treatment with the laser beam was conducted in the same manner as in the example B9. The insulation film, hereinafter called the second insulation film, on the second Al was composed of CVD-SiO$_2$, PSG, BSG, BPSG, P-SiN or ECR-SiN. The thickness of the second insulation film was selected as 1000, 2000, 5000 or 10000 Å. The laser heating conditions were same as in the examples B1, B2 and B3. After the laser heating, the second insulation film was removed by etching, and the electron beam diffraction pattern and the scanning μ-RHEED image were observed in the scanning μ-RHEED microscope. The obtained results indicated, as in the example B9, that the second Al was transformed into monocrystalline state when the substrate temperature was 550° C. or higher. Observation of the area transformed into monocrystalline state by the scanning μ-RHEED image as in the example B9 provided similar results to those shown in FIGS. 17B and 17C, with L8 of ca. 1 cm. Also as in the example B9, the measurement of element distribution in the direction of depth by Auger electron spectroscopy or secondary ion mass spectroscopy indicated diffusion of Si and Al at the interface between the insulation film on the substrate surface and the second Al film, when the substrate surface temperature was 650° C. or higher.

EXAMPLE B11

There was measured the area of monocrystalline transformation of the second Al by laser heating. The specimens had a structure schematically shown in FIG. 6A and a cross section shown in FIG. 1B. The insulation film on the Si substrate was provided with a line of a width L10, and the dimensions of the specimens were same as in the example B9. Based on X-ray diffraction, electron beam diffraction pattern obtained by the conventional RHEED apparatus, and electron beam diffraction pattern and scaning μ-RHEED image obtained by the scanning μ-RHEED microscope, the second Al was identified as polycrystals consisting of crystal grains of several to ten microns, as in the example B9.

The above-mentioned specimens were subjected to heating by a laser, which was a continuously oscillated Ar laser (wavelength ca. 488 and 514.5 nm). The beam on the specimen was a flat parallel beam as shown in FIG. 6A. A circular beam was converted into a parallel beam by an optical system 70 employing a cylindrical lens. The shape of said parallel beam was ca. 20 μm×1 cm, 50 μm×1 cm or 100 μm×1 cm. The scanning was conducted in one direction as shown in FIG. 6A, with a speed of ca. 0.5, 1, 2, 5 or 10 cm/min. The substrate surface temperature, measured by a radiation thermometer employing a PbS probe, was selected at ca. 450°, 550°, 600°, 650° or 700° C.

The substrate surface temperature was dependent on the shape, output and scanning speed of the laser beam. In the following experiments, for each given set of diameter and scanning speed of the laser beam, the laser output was so regulated as to obtain the above-mentioned surface temperature of ca. 450°, 550°, 600°, 650° or 700° C. The laser heating was conducted in hydrogen gas of atmospheric pressure.

After the heating with laser, the electron diffraction pattern and the scanning μ-RHEED image were observed in the scanning μ-RHEED microscope. The electron diffraction pattern showed spots with a higher intensity than before the heat treatment as in the example B9 (FIG. 14B). The scanning μ-RHEED images obtained utilizing the 111 and 202 diffracted spots were similar to those shown in FIGS. 17B and 17C. The direction of the first Al was parallel to y-direction in FIG. 17A, and the scanning direction of the laser beam was parallel to x-direction. The length of area transformed to monocrystalline state can be determined by measuring L8 in FIG. 17C. Though L8 is illustrated as about 10–20 μm in FIG. 17C, it was in fact about 1 cm when the substrate temperature was 550° C. or higher. Stated differently, the second Al film on SiO$_2$ was transformed into monocrystalline state over a length of 1 cm, utilizing monocrystalline first Al as the seed. As in the examples B1, B2, B3 and B4, the measurement of element distribution in the direction of depth by Auger electron spectroscopy or secondary ion mass spectroscopy indicated diffusion of Si and Al at the interface between the insulation film on the substrate surface and the second Al film, when the substrate surface temperature was 650° C. or higher.

EXAMPLE B12

Specimens were prepared in the same manner as in the example B11, and were subjected to heat treatment by laser. The specimens were different in the cross-sectional structure from those of the example B11. In the specimens of the example B11, the second Al film was formed on the entire surface of the specimen as shown in FIG. 1A or 5A. In this example, an insulation film was formed on the second Al as shown in FIG. 1B or 5B, and the heat treatment with the laser beam was conducted in the same manner as in the example B11. The insulation film, hereinafter called the second insulation film, on the second Al was composed of CVD-SiO$_2$, PSG, BSG, BPSG, P-SiN or ECR-SiN. The thickness of the second insulation film was selected as 1000, 2000, 5000 or 10000 Å. After the laser heating, the second insulation film was removed by etching, and the electron beam diffraction pattern and the scanning μ-RHEED image were observed in the scanning μ-RHEED microscope as in the example B11. The obtained results indicated, as in the example B11, that the second Al was transformed into monocrystalline state when the substrate temperature was 550° C. or higher. Observation of the area transformed into monocrystalline state by the scanning μ-RHEED image as in the example B11 provided similar results to those shown in FIGS. 17B and 17C, with L8 of ca. 1 cm. Also as in the example B11, the measurement of element distribution in the direction of depth by Auger electron spectroscopy or secondary ion mass spectroscopy indicated diffusion of Si and Al at the interface between the insulation film on the substrate surface and the second Al film, when the substrate surface temperature was 650° C. or higher.

EXAMPLE B13

Laser heating was conducted in the same method and procedure as in the examples B9 and B10 with specimens which are however different in shape from those in said examples The structure of the specimens is shown in FIG. 7A. The insulation film on the second Al (second insulation film) was formed uniformly on the specimen in the example B10, but, in the present example, it was formed in stripes substantially perpendicular to the direction of the first Al (line direction) as shown in FIG. 7A. The second insulation film was composed of CVD-SiO₂, PSG, BSG, BPSG, P-SiN or ECR-SiN, with a thickness of 1000, 2000, 5000 or 10000 Å. The stripes of the second insulation film were formed in 16 different dimensions, by taking combinations of L14 as 1, 2, 5 and 10 μm and L15 as 1, 2, 5 and 10 μm. The laser heating conditions were same as those in the examples B1, B2 and B3. After the laser heating, the second insulation film was removed by etching, and the electron beam diffraction pattern and the scanning μ-RHEED image were observed by the scanning μ-RHEED microscope, as in the example B9.

The obtained results indicated, as in the example B9, that the second Al was transformed into monocrystalline state when the substrate temperature was 550° C. or higher. The scanning μ-RHEED images observed in the area of monocrystalline transformation as in the example B9 were similar to those shown in FIGS. 17B and 17C, with L8 being about 1 cm. Also as in the example B9, the measurement of element distribution in the direction of depth by Auger electron spectroscopy or secondary ion mass spectroscopy indicated diffusion of Si and Al at the interface between the insulation film on the substrate surface and the second Al film, when the substrate surface temperature was 650° C. or higher.

EXAMPLE B14

Specimens were prepared in the same manner as in the example B13 and subjected to heat treatment by laser. This example is however different in the laser beam scanning method from said example B13. There was employed a continuously oscillated Ar laser (wavelength: ca. 488.5 and 415.5 nm) with a parallel flat beam on the specimen surface, as shown in FIG. 7B. A circular beam was converted into a parallel beam by an optical system 70 employing a cylindircal lens. The dimension of said parallel beam was ca. 20 μm×1 cm, 50 μm×1 cm or 100 μm×1 cm, and the scanning was conducted in one direction as shown in FIG. 7B.

The scanning speed was ca. 0.5, 1, 2, 5 or 10 cm/min. The substrate surface temperature, measured with a radiation thermometer employing a PbS probe, was ca. 450°, 550°, 600°, 650° or 700° C. The substrate surface temperature was dependent on the shape, output and scanning speed of the laser beam. In the following experiments, for each given set of the diameter and the scanning speed of the laser beam, the laser output was so regulated as to obtain the above-mentioned surface temperature of ca. 450°, 550°, 600°, 650° or 700° C. The laser heating was conducted in hydrogen gas of atmospheric pressure.

As in the example B13, the obtained results indicated that the second Al was transformed into monocrystalline state when the substrate temperature was 550° C. or higher. The scanning μ-RHEED images observed in the monocrystalline area as in the example B13 were similar to those shown in FIGS. 17B and 17C, with L8 being ca. 1 cm. Also as in the example B13, the measurement of element distribution in the direction of depth by Auger electron spectroscopy or secondary ion mass spectroscopy indicated diffusion of Si and Al at the interface between the insulation film on the substrate surface and the second Al film, when the substrate surface temperature was 650° C. or higher.

EXAMPLE B15

In the examples B9, B10, B11, B12, B13 and B14, the insulation film formed on the Si substrate as shown FIGS. 5A, 5B, 6A, 6B, 7A or 7B was composed of SiO₂ obtained by thermal oxidation. In the present example, the insulation film on the Si substrate was CVD-SiO₂, BSG, PSG, BPSG, P-SiN, T-SiN, LP-SiN or ECR-SiN, with a thickness of 1000, 2000, 5000, 7500 or 10000 Å. The thicknesses of the first and second Al films were same as those in the examples B1, B2, B3 and B4.

As in the examples B9, B10, B11, B12, B13 and B14, the monocrystalline transformation of the second Al film occurred when the substrate temperature was 550° C. or higher. Also as in the examples B9, B10, B11, B12, B13 and B14, the measurement of element distribution in the direction of depth by Auger electron spectroscopy or secondary ion mass spectroscopy indicated diffusion of Si and Al at the interface between the insulation film on the substrate surface and the second Al film, when the substrate surface temperature was 650° C. or higher.

EXAMPLE B16

In the examples B1–B15, the first and second Al films were composed of pure aluminum obtained by the LP-CVD method utilizing DMAH (dimethylaluminum hydride) and hydrogen. In this example, pure aluminum was replaced by Al-Si, deposited by the addition of Si₂H₆ in the LP-CVD method utilizing DMAH and hydrogen. The Si content in the first and second Al-Si films was varied as 0.2, 0.5 or 1.0%.

The heat treatment was conducted in the same manner as in the examples B1–B15, with mere replacement Al by Al-Si. The obtained results were similar to those obtained in said examples B1–B15.

EXAMPLE B17

In the examples B1–B15, the first and second Al films were both formed by the LP-CVD method employing DMAH and hydrogen. In order to transform the second Al film by heat treatment into monocrystalline state, the first Al film has to be monocrystalline. Said LP-CVD method has the advantage of being capable of depositing the first and second Al films in succession in a same apparatus, but the second Al film need not be formed by a CVD method as long as it is polycrystalline or amorphous.

The present example was conducted in the same manner as the examples B1–B15, except that the second Al film alone was formed by sputtering. Based on the X-ray diffraction, electron beam diffraction pattern obtained by the conventional RHEED apparatus, and electron beam diffraction pattern and scanning μ-RHEED image obtained by the scanning μ-RHEED microscope, the second Al film in deposited state was identified as polycrystalline, consisting of crystal grains of about 1 μm or less.

By the heat treatment in same conditions in the examples B1–B15, there were obtained results, as in the examples B1–B15, that the second Al was transformed into monocrystalline state when the substrate temperature was 550° C. or higher. However the transformed monocrystalline area L8, measured as in the examples B9–B14, was about 0.8 cm, smaller than 1 cm obtained when the CVD method was employed for the second Al film. Also as in the examples B1–B15, the measurement of element distribution in the direction of depth, by Auger electron spectroscopy or secondary ion mass spectroscopy, indicated diffusion of Si and Al at the interface between the insulation film on the substrate surface and the second Al film when the substrate surface temperature was 650° C. or higher.

EXAMPLE B18

In this example, the specimen structure and the heating conditions were same as in the examples B1-B15, but the first Al was composed of Al-Si formed by LP-CVD method employing DMAH, hydrogen and $Si_2H_6$, while the second Al was composed of pure aluminum formed by LP-CVD utilizing DMAH and hydrogen.

The Si content in the first Al-Si film was selected as 0.2, 0.5 or 1.0%.

There were obtained results similar to those in examples B1-B15.

EXAMPLE B19

In this example, the specimen structure and the heating conditions were same as in the examples B1-B15, but the first Al was composed of Al-Si formed by LP-CVD employing DMAH, hydrogen and $Si_2H_6$ while the second Al was composed of Al-Si formed by sputtering. The Si content in the first Al-Si film was selected as 0.2, 0.5 or 1.0%.

There were obtained similar results to those in the examples B1-B15. However the transformed monocrystalline area L8, measured as in the examples B9-B14, was ca. 0.8 cm, which was shorter than 1 cm obtained when the second Al was formed by CVD.

EXAMPLE B20

In the examples B1-B19, the heating was conducted by laser beam irradiation from the top surface of specimen. In this example, heating was conducted by heating from the bottom side of the specimen, in addition to the laser beam irradiation from the top surface. The bottom side heating was achieved by resistance heating of a specimen support (not shown). The temperature of the bottom surface of the specimen was selected as ca. 250, 300 or 350° C. The laser irradiating conditions were same as in the examples B1-B19.

There were obtained results similar to those in the examples B1-B19. Transformation to monocrystalline state in the examples B1-B19 occurred at 550° C., but in the present example at a substrate surface temperature of ca. 500° C. This is presumably because the flow of Al atoms in the second Al or Al-Si film at the surface was facilitated by a smaller irradiation energy due to the heating of specimen from the bottom side thereof.

EXAMPLE C1

Specimens with first and second Al films were prepared as explained in the examples 1, 2 and 3, and were heat treated with a linear heater. The first insulation film was patterned in the checkered pattern, via hole pattern and line-and-space pattern shown in FIGS. 2A, 2B and 2C, with dimensions L1-L5 same as in the examples B1-B3. Also the surface orientation of the Si substrate and the thicknesses of the first insulation film and the second Al film were same as in the examples B1-B3.

In X-ray diffraction after the deposition of the first and second Al films, all the specimens showed an Al(111) peak only, regardless of the $SiO_2$ film thickness, pattern size or second Al film thickness. Also in the electron beam diffraction pattern observed in the conventional RHEED apparatus with an electron beam diameter of 100 $\mu m$-1 mm$\phi$, all the specimens showed ring patterns as shown in FIG. 14A. Thus the Al deposited over the entire surface was confirmed as polycrystals with an orientation (111). Also in the observation of the electron beam diffraction pattern with an electron beam reduced to 0.1 $\mu m$ in the scanning $\mu$-RHEED microscope, there were obtained spot patterns as shown in FIG. 14B, though the intensity was weak. Also the scanning $\mu$-RHEED image utilizing the intensity of diffraction spots in the diffraction pattern indicated polycrystalline state consisting of crystal grains of several to ten microns, as shown in FIG. 15A.

The above-mentioned specimens were heat treated with a linear heater in the following manner.

FIG. 8 illustrates the heating method with the linear heater. The substrate 82 is placed on a heating support 81 made of carbon. Above said substrate 82 there is provided a linear heater 83 which is also of carbon and is energized by a power source 84. The heating support 81 is also heated by a heater (not shown) provided on the bottom side thereof. The linear heater 83 moves in a direction 85. The heating was conducted in hydrogen gas of atmospheric pressure.

The linear heater 83 was moved in the direction 85, with a speed of ca. 0.5, 1, 2, 5 or 10 cm/min. The substrate surface temperature directly below the linear heater 83, measured with a radiation thermometer employing a PbS probe, was ca. 450°, 500°, 600°, 650° or 700° C.

After the heat treatment under the above-mentioned heating conditions, the electron beam diffraction pattern and the scanning $\mu$-RHEED image were observed in the scanning $\mu$-RHEED microscope. All the specimens showed spot patterns as shown in FIG. 14B, with a higher intensity than before the heating, regardless of the Si wafer surface orientation, $SiO_2$ film (first insulation film) thickness, shape and size of the pattern, or second Al film thickness, as long as the substrate surface temperature directly below the linear heater 83 was 550° C. or higher. The diffraction pattern in FIG. 14B was identified, from the position of the spots, as being generated by the electron beam introduced from a direction [101] into the Al (111) plane. The scanning $\mu$-RHEED images obtained utilizing the intensities of a diffraction spot A (111 diffracted spot) and a spot C (202 diffracted spot) in the pattern shown in FIG. 14B were similar to those shown in FIG. 15B and 15C, wherein areas of diffraction spots with high intensity are hatched. The Al film deposited on the checkered pattern, via hole pattern or line-and-space pattern (second Al film) provided high intensities both in the spots A and C, indicating the transformation to monocrystalline state by the heat treatment. Also in the electron beam diffraction pattern observed in the conventional RHEED apparatus after the heat treatment, all the specimens provided spot patterns indicating monocrystalline state as shown in FIG. 14B.

Thus the polycrystalline Al when deposited was transformed into monocrystalline state by heating. Measurement of element distribution in the direction of depth, by Auger electron spectroscopy (AES), indicated diffusion of Al, Si and O at the interface between $SiO_2$ and the second Al. The transformation to monocrystalline state did not occur by heat treatment of 500° C., 6 hrs.

EXAMPLE C2

In the example C1, the second Al film was formed on the entire surface of the specimen, as shown in cross section in FIG. 1A. In this example, an insulation film was formed on the second Al film at shown in FIG. 1B, and the heat treatment with the linear heater was conducted in the same manner as in the example C1. The insulation film on the second Al, to be hereinafter called the second insulation film, was composed of a SiO$_2$ film obtained by normal pressure CVD (hereinafter represented as CVD-SiO$_2$), a boron-doped oxide film obtained by normal pressure CVD (BSG), a phosphor-doped oxide film obtained by normal pressure CVD (PSG), a boron- and phosphor-doped oxide film obtained by normal pressure CVD (BPSG), a nitride film obtained by plasma CVD (P-SiN), or a thermal nitride film obtained by the ECR apparatus (ECR-SiN), with a thickness of 1000, 2000, 5000 or 10000 Å. The heating conditions were same as in the example C1. After the heat treatment, the second insulation film was removed by etching, and the electron beam diffraction pattern and the scanning μ-RHEED image were observed in the scanning μ-RHEED microscope as in the example C1. The obtained results indicated, as in the example C1, that the second Al was transformed into monocrystalline state when the substrate temperature was 550° C. or higher. Also as in the example C1, the measurement of element distribution in the direction of depth, by Auger electron spectroscopy or secondary ion mass spectroscopy, indicated the diffusion of Si and Al at the interface between the insulation film on the substrate surface and the second Al film, when the substrate surface temperature was 650° C. or higher.

EXAMPLE C3

In the example C1, the first insulation film formed on the Si substrate, shown in FIG. 1A, was composed of SiO$_2$ obtained by thermal oxidation. In the present example, the first insulation film on the Si substrate was composed of CVD-SiO$_2$, BSG, PSG, BPSG, P-SiN, T-SiN, LP-SiN or ECR-SiN, with a thickness of 1000, 2500, 5000, 7500 or 10000 Å.

The surface orientation of the Si substrate, thicknesses of the first and second Al films and heating conditions with the linear heater were selected same as in the example C1.

As in the example C1, the transformation of the second Al film into monocrystalline state occurred when the substrate temperature was 550° C. or higher. Also as in the example C1, the measurement of element distribuion in the direction of depth, by Auger electron spectroscopy or secondary ion mass spectroscopy, indicated the diffusion of Si and Al at the interface between the insulation film on the substrate surface and the second Al film, when the substrate surface temperature was 650° C. or higher.

EXAMPLE C4

In the example C3, the second Al was formed on the entire surface of the specimen as shown in cross section in FIG. 1A. In this example, an insulation film was formed on the second Al film as shown in FIG. 1B, and the heat treatment with the linear heater was conducted in the same manner as in the example C1. Said insulation film, on the second Al, was composed of CVD-SiO$_2$, BSG, PSG, BPSG, P-SiN, LP-SiN or EC-SiN, with thickness varied in 5 levels of 1000, 2500, 5000, 7500 and 10000 Å.

The surface orientation of the Si substrate, thicknesses of the first and second Al films, and heating conditions of the linear heater were same as in the example C3. As in said example, the monocrystalline transformation of the second Al occurred when the substrate temperature was 550° C. or higher. Also as in the example C3, the measurement of element distribution in the direction of depth, by Auger electron spectroscopy or secondary ion mass spectroscopy, indicated diffusion of Si and Al at the interface between the insulation film on the substrate surface and the second Al film, when the substrate surface temperature was 650° C. or higher.

EXAMPLE C5

There was measured the area of transformation of the second Al into monocrystalline state by the heating with linear heater. The specimen structure was as shown in FIG. 5A, and same as that in the example B9 employing laser heating, with a cross-sectional structure as shown in FIG. 1A. The insulation film on the Si substrate is provided with a line of width L10, which was varied in 6 levels of 0.5, 1, 2, 5, 10 and 20 μm. The surface orientation of the Si wafer was selected as (100) or (111). The insulation film was composed of SiO$_2$ obtained by thermal oxidation, with thickness varied in 5 levels of 1000, 2500, 5000, 7500 and 10000 Å. Also the thickness of the Al deposited on the entire surface (second Al 4 in FIG. 1, or second Al 63 in FIG. 5A), was varied in 5 levels of 1000, 2500, 5000, 7500 and 10000 Å. By taking combinations of the above-mentioned four conditions, namely Si substrate surface orientation, SiO$_2$ film thickness, width L10 of the first Al film and thickness of the second Al, there were prepared 2×5×8×6=480 specimens.

Based on X-ray diffraction, electron beam diffraction pattern obtained by the conventional RHEED apparatus, and electron beam diffraction pattern and scanning μ-RHEED image obtained by the scanning μ-RHEED microscope, the second Al film was identified as polycrystals consisting of crystal grains of several to ten microns, as in the examples B1 and C1.

The heating was conducted in the same manner as in the example C1, with a moving speed of ca. 0.5, 1, 2, 5 or 10 cm/min. The substrate surface temperature directly below the linear heater, measured with a radiation thermometer employing a PbS probe, was selected as ca. 450°, 550°, 600°, 650° or 700° C. The heating was conducted in hydrogen gas of atmospheric pressure.

After the heat treatment, the electron beam diffraction pattern and the scanning μ-RHEED image were observed in the scanning μ-RHEED microscope. The electron beam diffraction patterns were dot patterns as shown in FIG. 14B, with intensities higher than before the heating, as in the example C1. The scanning μ-RHEED images utilizing the intensities of the 111 and 202 diffracted spots were similar to those shown in FIGS. 17B and 17C. The direction of first Al (line direction) is parallel to the y-direction in FIG. 17A, while the heater scanning direction is parallel to the x-direction. The length of the area transformed into monocrystalline state can be determined from the measurement of L8 in FIG. 17C. Though L8 in FIG. 17C is illustrated in the order of 10–20 μm, it was in fact about 1 cm when the substrate temperature was 550° C. or higher. Stated differently, the second Al film on SiO$_2$ was transformed into monocrystalline state over a length of 1 cm, utilizing monocrystalline first Al as the seed. As in the example C1, the measurement of element distribution in the direction of depth, by Auger electron spectroscopy or secondary ion mass spectroscopy, indicated diffusion of Si and Al at the interface between the insulation film on the substrate surface and the second Al film, when the substrate surface temperature was 650° C. or higher.

EXAMPLE C6

Specimens were prepared in the same manner as in the example C5, and were heat treated with the linear heater. Said specimens were however different in cross-sectional structure from those in the example C5. In the example C5, the second Al film was formed on the entire surface of the specimen, as shown in cross section in FIG. 1A or 5A. In this example, an insulation film was formed on the second Al, as shown in FIG. 1B or 5B, and the heat treatment with the linear heater was conducted in the same manner as in the example C5. The insulatiln film on the second Al, to be called the second insulation film, was composed of CVD-$SiO_2$, PSG, BSG, BPSG, P-SiN or ECR-SiN, with a thickness of 1000, 2000, 5000 or 10000 Å. The heating conditions with the linear heater were same as those in the example C1. After the heat treatment, the second insulation film was removed by etching, and the electron beam diffraction pattern and the scanning $\mu$-RHEED image were observed in the scanning $\mu$-RHEED microscope as in the example C5. The obtained results indicated, as in the example C5, that the second Al was transformed to monocrystalline state when the substrate temperature was 550° C. or higher. As in the example C5, there were obtained the scanning $\mu$-RHEED images similar to FIGS. 17B and 17C, and the area L8 of monocrystalline transformation was ca. 1 cm. Also as in the example C5, the measurement of element distribution in the direction of depth, by Auger electron spectroscopy or secondary ion mass spectroscopy, indicated diffusion of Si and Al at the interface between the insulation film on the substrate surface and the second Al film, when the substrate surface temperature was 650° C. or higher.

EXAMPLE C7

In the examples C5 and C6, the insulation film formed on the Si substrate, in the structures shown in FIGS. 5A and 5B, was composed of $SiO_2$ obtained by thermal oxidation. In the present example, the insulation film on the Si substrate was composed of CVD-$SiO_2$, BSG, PSG, BPSG, P-SiN, T-SiN, LP-SiN or ECR-SiN, with thickness varied in 5 levels of 1000, 2500, 5000, 7500 and 10000 Å. Surface orientation of the Si substrate, thicknesses of the first and second Al films, and heating conditions with the linear heater were same as those in the example C1.

As in the examples C5 and C6, the second Al was transformed to monocrystalline state when the substrate temperature was 550° C. or higher. Also as in the examples C5 and C6, there were obtained the scanning $\mu$-RHEED images similar to those in FIGS. 17B and 17C, with the transformed monocrystalline area L8 of ca. 1 cm. Further, as in the examples C5 and C6, the measurement of element distribution in the direction of depth, by Auger electron spectroscopy or secondary ion mass spectroscopy, indicated diffusion of Si and Al at the interface between the insulation film on the substrate surface and the second Al film, when the substrate surface temperature was 650° C. or higher.

EXAMPLE C8

In the examples C1-C7, the first and second Al films were both composed of pure aluminum obtained by LP-CVD utilizing DMAH and hydrogen.

In the present example, pure aluminum was replaced by Al-Si, deposited by the addition of $Si_2H_6$ in the LP-CVD method employing DMAH and hydrogen. The Si content in the first and second Al-Si films was selected as 0.2, 0.5 and 1.0%. The heat treatment was conducted in the same manner as in the examples C1-C7.

There were obtained similar results to those in the examples C1-C7.

EXAMPLE C9

In the examples C1-C7, the first and second Al films were formed by a LP-CVD method utilizing DMAH and hydrogen. In order to transform the second Al into monocrystalline state by heat treatment, the first Al has to be monocrystalline. The LP-CVD method has the advantage of being capable of depositing the first and second Al films in succession in the same apparatus, but the second Al film need not be formed by CVD as long as it is polycrystalline or amorphous.

The present example employed the specimens and heating conditions same as those in the examples C1-C7, except that the second Al film alone was formed by sputtering. Based on X-ray diffraction, electron beam diffraction pattern obtained by the conventional RHEED apparatus, and electron beam diffraction pattern and scanning $\mu$-RHEED image obtained by the scanning $\mu$-RHEED microscope, the second Al film in the deposited state was identified as polycrystal consisting of crystal grains of about 1 $\mu$m or less.

Heat treatment same as in the example C1-C7 provided results same as in said examples, that the second Al film was transformed into monocrystalline state when the substrate temperature was 550° C. or higher. However, the transformed monocrystalline area L8, measured as in the examples C5-C7, was about 0.8 cm, which was shorter than 1 cm when the second Al was formed by CVD. Also as in the examples C1-C7, the measurement of element distribution in the direction of depth, by Auger electron spectroscopy or secondary ion mass spectroscopy, indicated diffusion of Si and Al at the interface between the insulation film on the substrate surface and the second Al film, when the substrate surface temperature was 650° C. or higher.

EXAMPLE C10

Specimen structure and heating conditions were same as in the examples C1-C7. The first Al film was composed of Al-Si formed by LP-CVD employing DMAH, hydrogen and $Si_2H_6$, while the second Al film was composed of pure aluminum formed by LP-CVD employing DMAH and hydrogen.

The Si content in the first Al-Si film was selected as 0.2, 0.5 or 1.0%.

There were obtained results similar to those in the examples C1-C7.

EXAMPLE C11

There were employed same specimen structure and heating conditions as in the examples C1-C7, except that the first Al film was composed of Al-Si formed by LP-CVD employing DMAH, hydrogen and $Si_2H_6$, while the second Al film was composed of Al-Si formed by sputtering. The Si content in the first Al-Si was selected as 0.2, 0.5 or 1.0%.

There were obtained results similar to those in the examples C1-C7. However the transformed monocrystalline area L8, measured as in the examples C5-C7, was ca. 0.8 cm which was shorter than 1 cm obtained when the second Al was formed by CVD.

EXAMPLE D1

Specimens were prepared in the same manner as in the examples C1-C11, and were subjected to heat treatment with lamp.

FIG. 9 illustrates the heating method with lamp.

The substrate 92 to be heated was placed on a substrate support 91, made of carbon. There was employed linear Xe lamp 93. The light therefrom was condensed by a reflector 94 into a line form on the substrate. The support 91 was also heated by a heater (not shown) mounted on the bottom side thereof. The heating area 95 was moved on the substrate, by the movement of the lamp. The heating was conducted in hydrogen gas of atmospheric pressure.

The heating area was moved by the movement of the support 91, with a moving speed of ca. 0.5, 1, 2, 5 or 10 cm/min.

The substrate surface temperature in the heating area 95, measured with the radiation thermometer employing PbS probe, was ca. 450, 550, 600, 650 or 700° C.

With the heating as explained above, there were obtained results similar to those in the examples C1–C11.

EXAMPLE E1

Specimens were prepared in the same manner as in the examples C1–C11, and were heated by high frequency heating.

FIG. 10 illustrates the heating method by high frequency heating.

The substrate 103 to be heated was placed on a heating substrate support 101, made of carbon. Also there were provided quartz plates 102. As shown in FIG. 10, the heating support, on which the substrate was placed, was heated by a high frequency coil (not shown) provided therearound. Since the quartz plates 102 are not heated by high frequency, a part 104 of the substrate was heated to the highest temperature.

The heated area 104 moves on the wafer, by the movement thereof in a direction 105. The heating was conducted in hydrogen gas of atmospheric pressure. The moving speed was ca. 0.5, 1, 2, 5 or 10 cm/min. The substrate surface temperature of the heated area 104, measured by the radiation thermometer employing PbS probe, was ca. 450°, 550°, 600°, 650° or 700° C.

With the heating as explained above, there were obtained results similar to those in the examples C1–C11.

EXAMPLE F1

Specimens were prepared in the same manner as in the examples C1–C11, and were heat treated with an electron beam.

FIG. 11 illustrates the heating method with electron beam. An electron beam 113 from a filament 112 is focused into a line on a substrate 114 to be heated, by a focusing and scanning coil 115, and deflecting plates 115'. On said substrate, a linear portion 111 is heated to a high temperature. By the movement of the wafer in a direction 116, the heated portion 114 also moves on the wafer. The heating was conducted in vacuum of a pressure of $10^{-8}$ Torr or lower.

The moving speed of the substrate was ca. 0.5, 1, 2, 5 or 10 cm/min. The substrate surface temperature in the heated portion, measured with the radiation thermometer with PbS probe, was ca. 450°, 550°, 600°, 650° or 700° C.

With the heating explained above, there were obtained results similar to those in the examples C1–C11.

As explained in the foregoing examples, the monocrystalline Al can be formed on a substrate surface of any material.

Also there can be obtained Al wirings with preferred characteristics for use in semiconductor devices, such as surface properties, antimigration resistance, adhesion to the underlying silicon etc.

EXAMPLE G1

The specimens used in the measurement, having a cross-sectional structure as shown in FIG. 1A, were prepared in the following manner.

A Si wafer was subjected to thermal oxidation at 1000° C. by hydrogen combustion ($H_2$: 4 l/min., $O_2$: 2 l/min.). The surface orientation of Si wafer was (100) or (111). The entire wafer was coated with photoresist and was exposed to a desired pattern by an exposure apparatus. After the photoresist was developed, reactive ion etching was conducted, utilizing the photoresist as a mask, to etch the underlying $SiO_2$, thereby locally exposing the Si surface.

Then an Al film was deposited by a low pressure CVD method, employing dimethylaluminum hydride and hydrogen, with a deposition temperature of ca. 270° C. and a pressure of ca. 1.5 Torr in the reactor tube. At first selective Al deposition (first Al) was conducted solely on the exposed Si surface, then a surface modifying step was conducted by generating plasma in the low pressure CVD apparatus when the Al film thickness became equal to the $SiO_2$ film thickness, and Al (second Al) was deposited on the entire surface.

Following $SiO_2$ patterns and Al film thicknesses were employed on the specimens. The $SiO_2$ film thickness was varied in 5 levels of 1000, 2500, 500, 7500 and 10000 Å. The checkered pattern shown in FIG. 2A was used on the Si wafer, with size L1 varied in 8 levels of 0.25, 0.5, 1, 2, 3, 5, 10 and 20 μm. Thickness of the Al film deposited on the entire surface (second Al film 4 in FIG. 1) was varied in 3 levels of 100, 2500 and 5000 Å. By taking combinations of the above-mentioned four conditions, namely substrate surface orientation, $SiO_2$ film thickness, checkered pattern size L1 and second Al film thickness, there were prepared $2 \times 5 \times 8 \times 3 = 240$ specimens.

In the X-ray diffraction conducted after the deposition of the first and second Al films, all the specimens showed only an Al(111) peak, regardless of the $SiO_2$ film thickness, size of the checkered pattern or second Al film thickness. Also in the observation of the electron beam diffraction pattern by the conventional RHEED apparatus with an electron beam diameter of 100 μm–1 mmφ, all the specimens showed ring-shaped patterns as shown in FIG. 14A. It was therefore confirmed that the Al deposited over the entire surface was polycrystals with an orientation (111). Also observation of the electron beam diffraction pattern in the scanning μ-RHEED microscope with an electron beam reduced to a diameter of 0.1 μm provided a spot pattern as shown in FIG. 14B, though utilizing the diffracted spot intensity of the diffraction pattern provided an image as shown in FIG. 15A, wherein hatched areas indicate areas of high diffraction spot intensity, indicating polycrystalline state consisting of crystal grains of several to ten microns.

In such specimens, the second Al was subjected to $Al^+$ implantation by known ion implanting method, with an acceleration voltage of 50 kV and a dose of $5 \times 10^{15}$ cm$^{-2}$ or $1 \times 10^{16}$ cm$^{-2}$.

Said ion implantation caused transformation of the second Al into amorphous or microcrystalline state, and said transformation was confirmed in the following manner. X-ray diffraction in the deposited state showed an Al(111) diffracted peak, but did no longer show the peak relating to Al after ion implantation. Also the electron beam diffraction in the conventional RHEED apparatus showed so-called hallow pattern which is neigher ring-shaped nor spot-shaped pattern. Thus, as a result of ion implantation, the Al or Al-Si film was transformed into a state which is not monocrystalline nor ordinary polycrystalline but amorphous or microcrystalline.

The iron implanted specimens were heated treated in an electric over, at temperatures of 9 levels of 200°, 250°, 300°, 350°, 400°, 450°, 550° and 600° C., for about 3 hours, in hydrogen gas atmospheric pressure.

After the heat treatment in the above-mentioned conditions, the specimens were subjected to the observation of electron beam diffracted pattern and scanning μ-RHEED image in the scanning μ-RHEED microscope.

All the specimens treated at 250° C. or higher showed spot patterns as shown in FIG. 14B, with higher intensities than before the heat treatment, regardless of the Si wafer surface orientation, $SiO_2$ film thickness, size of the checkered pattern or second Al film thickness. The diffraction pattern in FIG. 14B was identified, from the position of the diffracted spots, as being generated by the electron beam introduced from a direction [101]into the Al(111) plane. The scanning μ-RHEED images, obtained utilizing the intensities of a diffracted spot A (111 diffracted spot) and a spot C (202 diffracted spot) on the diffraction pattern in FIG. 14B were similar to those shown in FIGS. 15B and 15C, wherein areas of high diffraction spot intensity are hatched. The Al film deposited in the area of checkered pattern provided high intensities both for the spots A and C, indicating the transformation to monocrystalline state by heat treatment. In observation of the electron beam diffraction pattern in the conventional RHEED apparatus, all the specimens after heat treatment showed spot patterns indicating monocrystalline state, as shown in FIG. 14B.

Thus the second Al film, which had been polycrystals when deposited by the LP-CVD method, was transformed into monocrystalline state by heat treatment, after transformation into amorphous state by ion implantation.

At the substrate surface temperature of 600° C., the measurement of element distribution, by Auger electron spectroscopy or secondary ion mass spectroscopy, indicated diffusion of Si and Al at the interface of the insulation film on the substrate surface and the second Al film.

EXAMPLE G2

In the example G1, Al+ ions were implanted into the second Al film. In this example Si+ ions were implanted in the same specimens and procedures as in said example G1.

Si+ ion implantation was conducted with an acceleration voltage of 80 kV and a dose of $5 \times 10^{15}$ cm$^{-2}$ or $1 \times 10^{16}$ cm$^{-2}$.

There were obtained results similar to those in the example G1. The second Al was transformed by ion implantation into amorphous or microcrystalline state, and then to monocrystalline state at the heat treating temperature of 250° C. or higher.

EXAMPLE G3

In contrast to Al+ ion implantation to the second Al in the example G1, the present example conducted implantation of H+ ions in the same specimens and procedure as in the example G1.

H+ ion implantation was conducted with an acceleration voltage of 20 kV and a dose of $5 \times 10^{16}$ cm$^{-2}$ or $1 \times 10^{17}$ cm$^{-2}$.

There were obtained results similar to those in the example G1. The second Al was transformed by ion implantation into amorphous or microcrystalline state, and then to monocrystalline state at the heat treating temperature of 250° C. or higher.

EXAMPLE G4

In contrast to Al+ ion implantation to the second Al in the example G1, the present example conducted implantation of Ar+ ions in the same specimens and procedure as in the example G1.

Ar+ ion implantation was conducted with an acceleration voltage of 80 kV, and a dose of $5 \times 10^{16}$ cm$^{-2}$ or $5 \times 10^{16}$ cm$^{-2}$.

There were obtained similar results to those in the example G1. The second Al was transformed by ion implantation into amorphous or microcrystalline state, and then to monocrystalline state at the heat treating temperature of 250° C. or higher

EXAMPLE G5

Specimens with a cross-sectional structure shown in FIG. 1A were prepared in the same manner as in the example G1, and were subjected to ion implantation and heat treatment.

Different from the example G1, the via hole pattern shown in FIG. 2B was formed on the Si wafer, with size L2 varied in 5 levels of 0.25, 0.5, 1, 2 and 5 μm and size L3 varied in 5 levels of 1, 2, 5, 10 and 20 μm. Thus there were prepared 25 different via hole patterns, taking combinations of said L2 and L3. The thicknesses of the $SiO_2$ film and the Al film deposited on the entire wafer (second Al 4 in FIG. 1) were same as in the example G1. The specimens prepared as explained above were subjected to Al+ ion implantation in the same manner as in the example G1, then to heat treatment in the electric oven and subsequently observed. The Al+ ion implanting conditions and the heat treating conditions were same as in the example G1.

Based on X-ray diffraction, electron beam diffraction pattern obtained in the conventional RHEED apparatus, and electron beam diffraction pattern and scanning μ-RHEED image obtained by the scanning μ-RHEED microscope as in the example G1, the second Al in the deposited state by the LP-CVD method was identified, in any speciment, as polycrystals with an orientation (111), consisting of crystal grains of several to ten microns.

After the Al+ ion implantation, it was confirmed, as in the example G1, that all the specimens were converted into amorphous or microcrystalline state.

Then the heat treatment in the electric oven was conducted in the same conditions as in the example G1, and the electron beam diffraction pattern and the scanning μ-RHEED image were observed in the scanning μ-RHEED microscope. The scanning μ-RHEED images indicated, as in the example G1, that all the specimens treated at 250° C. or higher were transformed into monocrystalline state, regardless of the surface orientation of the Si wafer, size of the checkered pattern or second Al film thickness. Also as in the example G1, the measurement of element distribution in the direction of depth, by Auger electron spectroscopy or secondary ion mass spectroscopy, indicated diffusion of Si and Al at the interface between the insulation film on the substrate surface and the second Al film when the substrate surface temperature was 600° C. or higher.

EXAMPLE G6

In contrast to Al+ ion implantation into the second Al in the example G5, the present example conducted Si+ ion implantation with the same specimens and procedure as in the example G5.

The Si+ ion implanting conditions were same as those in the example G2.

There were obtained similar results as those in the example G5, wherein the second Al was transformed by ion implantation into amorphous or microcrystalline state, and into monocrystalline state at the heat treating temperature of 250° C. or higher.

EXAMPLE G7

In contrast to the example G5 employing Al+ ion implantation into the second Al, the present example conducted H+ ion implantation with the same specimens and procedure as in the example G5.

The H+ ion implanting conditions were same as those in the example G3.

There were obtained similar results as those in the example G5, wherein the second Al was transformed by ion implantation into amorphous or microcrystalline state, and into monocrystalline state at the heat treating temperature of 250° C. or higher.

EXAMPLE G8

In contrast to the example G5 employing Al+ ion implantation into the second Al, the present example conducted Ar+ ion implantation with the same specimens and procedure as in the example G5.

The Ar+ ion implanting conditions were same as those in the example G4.

There were obtained similar results as those in the example G1, wherein the second Al was transformed by ion implantation into amorphous or microcrystalline state, and into monocrystalline state at the heat treating temperature of 250° C. or higher.

EXAMPLE G9

Specimens of a cross-sectional structure as shown in FIG. 1A were prepared in the same manner as in the example G1, and were subjected to ion implantation and heat treatment. Different from the example G1, the line-and-space pattern shown in FIG. 2C was formed on the Si wafer, with the size L4 varied in 5 levels of 0.25, 0.5, 1, 2 and 5 μm and size L5 in 5 levels of 1, 2, 5, 10 and 20 μm. Thus 25 different line-and-space patterns were prepared by taking the combinations of L4 and L5. The thicknesses of the SiO2 film and the Al deposited on the entire surface (second Al 4 in FIG. 1) were same as in the example G1.

The specimens prepared as explained above were subjected to Al+ ion implantation in the same manner as in the example G1, then to heat treatment in the electric oven and were observed. The Al+ ion implanting conditions and heat treating conditions were same as those in the example G1.

Based on X-ray diffraction, electron beam diffraction pattern obtained in the convetional RHEED apparatus, and electron beam diffraction pattern and scanning μ-RHEED image obtained by the scanning μ-RHEED microscope, the Al deposited on the entire surface (second Al) in any specimen was identified, as in the example G1, as polycrystals with an orientation (111), consisting of crystal grains of several to ten microns.

It was also confirmed, as in the example G1, that all the specimens were transformed into amorphous or microcrystalline state by Al+ ion implantation.

Then heat treatment with the electric oven was conducted in the same manner as in the example G1, and the electron beam diffraction pattern and the scanning μ-RHEED image were observed in the scanning μ-RHEED microscope. The scanning μ-RHEED image indicated, as in the example G1, that all the specimens treated at 250° C. or higher were transformed to monocrystalline state regardless of the Si wafer surface orientation, SiO2 film thickness, size of the checkered pattern or second Al film thickness. Also as in the example G1, the measurement of element distribution in the direction of depth, by Auger electron spectroscopy or secondary ion mass spectroscopy, indicated diffusion of Si and Al at the interface between the insulation film on the substrate surface and the second Al film, when the substrate surface temperature was 600° C. or higher.

EXAMPLE G10

In contrast to the example G9 employing Al+ ion implantation into the second Al, the present example conducted Si+ ion implantation with the same specimens and procedure as in the example G9.

The Si+ ion implanting conditions were same as those in the example G3.

There were obtained similar results to those in the example G9, wherein the second Al was transformed into amorphous or microcrystalline state by ion implantation, and to monocrystalline state by heat treatment at 250° C. or higher.

EXAMPLE G11

In contrast to the example G9 employing Al+ ion implantation into the second Al, the present example conducted H+ ion implantation with the same specimens and procedure as in the example G9.

The H+ ion implanting conditions were same as those in the example G3.

There were obtained similar results to those in the example G9, where the second Al was transformed into amorphous or microcrystalline state by ion implantation, and to monocrystalline state by heat treatment at 250° C. or higher.

EXAMPLE G12

In contrast to the example G9 employing Al+ ion implantation into the second Al, the present example conducted Ar+ ion implantation with the same specimens and procedure as in the example G9.

The Ar+ ion implanting conditions were same as in the example G4.

There were obtained similar results to those in the example G9, wherein the second Al was transformed into amorphous or microcrystalline state by ion implantation, and to monocrystalline state by heat treatment at 250° C. or higher.

EXAMPLE G13

In the examples G1-G12, the second Al was formed on the entire surface of the speciment, as shown in cross section in FIG. 1A. In the present example, an insulation film was formed on the second Al of the specimens of the examples G1-G12 as shown in FIG. 1B, and ion implantation and heat treatment with the electric oven were conducted in the same manner as in the examples G1–G12. In this example, after the deposition of the first and second Al films, there were conducted the ion implantation and then the heat treatment in the electric oven. The conditions of ion implantation and heat treatment were same as in the examples G1–G12. The insulation film on the second Al film was composed of a $SiO_2$ film obtained by normal pressure CVD (hereinafter expressed as $CVD-SiO_2$), a boron-doped oxide film obtained by normal pressure CVD (BSG), a phosphor-doped oxide film obtained by normal pressure CVD (PSG), a boron- and phosphor-doped oxide film obtained by normal pressure CVD (BPSG), a nitride film obtained by plasma CVD (P-SiN), or a nitride film obtained by ECR apparatus (ECR-SiN). Said insulation film on the second Al will hereinafter be called the second insulation film.

The thickness of the second insulation film was selected as 1000, 2000, 5000 or 10000 Å. The heat treating temperature was same as in the examples G1–G12. After the heat treatment, the second insulation film was removed by etching, and the electron beam diffraction pattern and the scanning μ-RHEED image were observed, as in the examples G1–G12, in the scanning μ-RHEED microscope. There were obtained similar results to those in the examples G1–G12, indicating that the second Al was transformed into monocrystalline state when the substrate temperature was 250° C. or higher. Also as in the examples G1–G12, the measurement of element distribution in the direction of depth, by Auger electron spectroscopy or secondary ion mass spectroscopy, indicated diffusion of Si and Al at the interface between the insulation film on the substrate surface and the second Al film, when the substrate surface temperature was 600° C. or higher.

EXAMPLE G14

In the examples G1–G12, the second Al film was formed on the entire surface of the specimen, as shown in cross section in FIG. 1A. In the present example, an insulation film was formed on the second Al as shown in FIG. 1B, and ion implantation and heat treatment with the electric over were conducted in the same manner as in the examples G1–G12. In contrast to the example G13 in which conducted in succession were the ion implantation, the deposition of the second insulation film and the heat treatment with the electric over, the present example conducted in succession the deposition of the first and second Al films, the deposition of the second insulation film, the ion implantation and the heat treatment with the electric oven. The conditions of ion implantation and heat treatment were same as in the examples G1–G12. The insulation film on the second Al was composed of $CVD-SiO_2$, BSG, PSG, BPSG, P-SiN or ECR-SiN, with temperature was same as in the examples G1–G12. After the heat treatment, the second insulation film was removed by etching, and the electron beam diffraction pattern and the scanning μ-RHEED image were observed, as in the examples G1–G12, by the scanning μ-RHEED microscope. There were obtained similar results to those in the examples G1–G12, and the second Al was transformed to monocrystalline state when the substrate temperature was 250° C. or higher. Also as in the examples G1–G12, the measurement of element distribution in the direction of depth, by Auger electron spectroscopy or secondary ion mass spectroscopy, indicated diffusion of Si and Al at the interface between the insulation film on the substrate surface and the second Al film, when the substrate surface temperature was 600° C. or higher.

EXAMPLE G15

In the examples G1–G14, the first insulation film formed on the Si substrate, as shown in FIG. 1A, was composed of $SiO_2$ formed by thermal oxidation. In the present example, the insulation film on the Si substrate was composed of $CVD-SiO_2$, BSG, PSG, BPSG, P-SiN, T-SiN, LP-SiN or ECR-SiN, with a thickness of 1000, 2500, 5000, 7500 or 10000 Å.

The thicknesses of the first and second Al films, and the ion implanting conditions were same as those in the examples G1–G14.

As in the examples G1–G14, the second Al film was transformed into monocrystalline state when the substrate temperature was 250° C. or higher. Also as in the examples G1–G14, the measurement of element distribution in the direction of depth, by Auger electron spectroscopy or secondary ion mass spectroscopy, indicated diffusion of Si and Al at the interface between the insulation film on the substrate surface and the second Al film, when the substrate surface temperature was 600° C. or higher.

EXAMPLE G16

Figure 18:
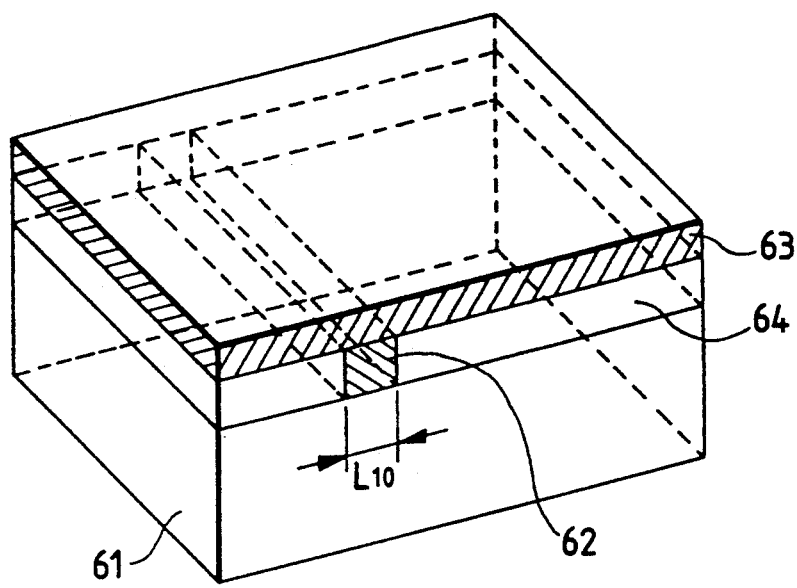
FIGS. 18 and 19 are schematic perspective views of a specimen prior to single crystal formation.

There was measured the area of monocrystalline transformation of the second Al film. The structure and cross section of the specimens are as shown in FIG. 18 and FIG. 1A. The insulation film on the Si substrate was provided with a gap of a width L10, in which monocrystalline Al (first Al) was formed. Said width was varied in 6 levels of 0.5, 1, 2, 5, 10 and 20 μm. The surface orientation of the Si wafer was selected as (100) or (111). The insulation film was composed of $SiO_2$ formed by thermal oxidation, with a thickness varied in 5 levels of 1000, 2500, 5000, 7500 and 10000 Å. The thickness of the Al deposited on the entire surface (second Al film 4 in FIG. 1, or second Al film 63 in FIG. 18) was varied in 3 levels of 1000, 2500 and 5000 Å. By taking combinations of the above-mentioned four parameters, namely the Si substrate surface orientation, $SiO_2$ film thickness, width L10 of the gap in first Al and second Al film thickness, there were prepared $2 \times 5 \times 6 \times 3 = 180$ different specimens.

Based on X-ray diffraction, electron beam diffraction pattern obtained by the conventional RHEED apparatus, and electron beam diffraction pattern and scanning μ-RHEED image obtained by the scanning μ-RHEED microscope, the second Al was identified, as in the example G1, as polycrystals consisting of crystal grains of several to ten microns.

Al+ ions were implanted under the same conditions as those in the example G1, whereby the second Al was transformed into amorphous or microcrystalline state. Thereafter heat treatment in the electric oven was conducted in the same conditions as in the example G1.

After the heat treatment, the electron beam diffraction pattern and the scanning μ-RHEED image were observed in the scanning μ-RHEED microscope. The electron beam diffraction provided, as in the example G1, a spot pattern as shown in FIG. 14B, with a higher intensity than before the heat treatment. The scanning μ-RHEED images obtained utilizing the 111 and 202 diffracted spots were similar to those shown in FIGS. 17B and 17C. FIG. 17A shows the pattern on the Si substrate, wherein the direction of first Al (line direction) is parallel to the y-direction in FIG. 17A. The length of the transformed monocrystalline area can be determined by measuring L8 in FIG. 17C.

Though L8 is illustrated in the order of 10–20 μm in FIG. 17C, it was in fact about 1 cm when the substrate temperature was 250° C. or higher. Stated differently, the second Al on $SiO_2$ was transformed into monocrystalline state over a length of 1 cm, utilizing monocrystalline first Al as the seed. Also as in the examples G1–G12, the measurement of element distribution in the direction of depth, by Auger electron spectroscopy or secondary ion mass spectroscopy, indicated diffusion of Si and Al at the interface between the insulation film on the substrate surface and the second Al film, when the substrate surface temperature was 600° C. or higher.

EXAMPLE G17

In contrast to the example G16 employing $Al^+$ ion implantation into the second Al, the present example conducted $Si^+$ ion implantation with the same specimens and procedure as in the example G16.

The $Si^+$ ion implanting conditions were same as those in the example G2.

There were obtained similar results to those in the example G16, wherein the second Al was transformed into amorphous or microcrystalline state by ion implantation, and further to monocrystalline state by heat treatment at 250° C. or higher.

EXAMPLE G18

In contrast to the example G16 employing $Al^+$ ion implantation to the second Al, the present example conducted $H^+$ ion implantation with the same specimens and procedure as in the example G16.

The $H^+$ ion implanting conditions were same as those in the example G3.

There were obtained similar results to those in the example G16, wherein the second Al was transformed into amorphous or microcrystalline state by ion implantation, and further to monocrystalline state by heat treatment at 250° C. or higher.

EXAMPLE G19

In contrast to the example G16 employing $Al^+$ ion implantation to the second Al, the present example conducted $Ar^+$ ion implantation with same specimens and procedure as in the example G1.

The $Ar^+$ ion implanting conditions were same as those in the example G4.

There were obtained similar results to those in the example G16, wherein the second Al was transformed into amorphous or microcrystalline state by ion implantation, and further to monocrystalline state by heat treatment at 250° C. or higher.

EXAMPLE G20

Figure 19:
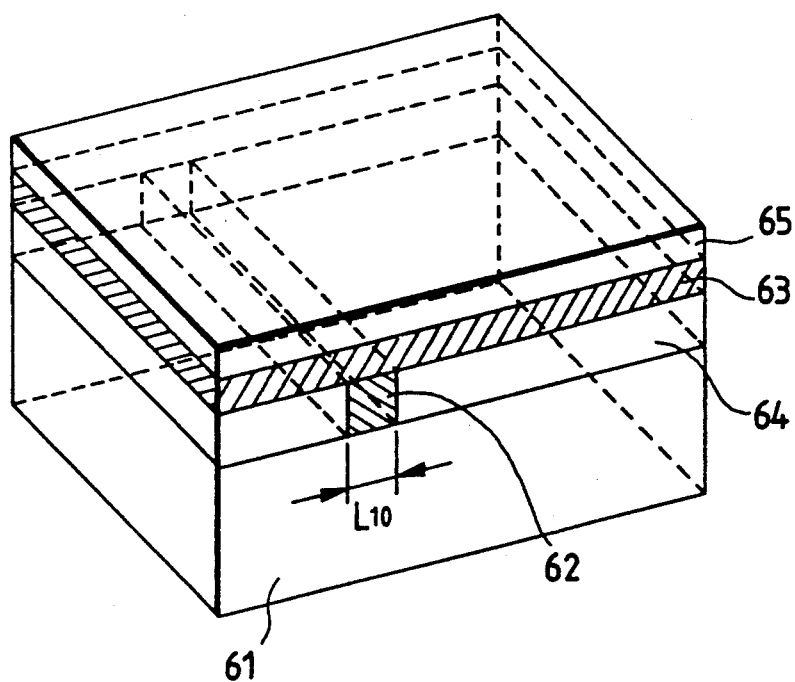

In the examples G16–G19, the second Al was formed on the entire surface of the specimen, as shown in FIG. 18. In the present example, an insulation film was formed on the second Al film as shown in FIG. 19 and ion implantation and heat treatment with the electric oven were conducted in the same manner as in the examples G16–G19. In the present example, the deposition of the first and second Al films was followed by ion implantation and then heat treatment in the electric oven. The conditions of said ion implantation and heat treatment were same as in said examples G16–G19. The insulation film (second insulation film) on the second Al film was composed of $CVD-SiO_2$, BSG, PSG, BPSG, P-SiN or ECR-SiN, with a thickness of 1000, 2000, 5000 or 10000 Å. The heat treating temperature was same as in the examples G16–G19. After the heat treatment, the second insulation film was removed by etching, and the electron beam diffraction pattern and the scanning μ-RHEED image were observed in the scanning μ-RHEED microscope, as in the examples G16–G19. There were obtained similar results to those in said examples, wherein the second Al was transformed into monocrystalline state with heat treatment at 250° C. or higher.

Also as in the examples G16–G19, the measurement of element distribution in the direction of depth, by Auger electron spectroscopy or secondary ion mass spectroscopy, indicated diffusion of Si and Al at the interface between the insulation film on the substrate surface and the second Al film, when the substrate surface temperature was 600° C. or higher.

EXAMPLE G21

In the examples G16–G19, the second Al was formed on the entire surface of the specimen as shown in cross section in FIG. 1A. In the present example, an insulation film was formed on the second Al in the specimens of the examples G1–G12, and ion implantation and heat treatment with the electric oven were conducted in the same manner as in the examples G16–G19. In contrast to the example G20 in which ion implantation, deposition of the second insulation film and heat treatment in the electric oven are conducted in succession, the present example conducted, after the deposition of the first and second Al films, the deposition of the second insulation film, ion implantation and heat treatment by the electric oven. The conditions of ion implantation and heat treatment were same as in the examples G16–G19.

The insulation film on the second Al was composed of $CVD-SiO_2$, BSG, PSG, BPSG, P-SiN or ECR-SiN, with a thickness of 500 or 1000 Å. The heat treating temperature was same as in the examples G16–G19. After the heat treatment, the second insulation film was removed by etching, and the electron beam diffraction pattern and the scanning μ-RHEED were observed, as in the examples G16–G19, in the scanning results to those in the examples G16–G19, wherein the second Al was transformed into monocrystalline state when the substrate temperature was 250° C. or higher. Also as in the examples G16–G19, the measurement of element distribution in the direction of depth, by Auger electron spectroscopy or secondary ion mass spectroscopy indicated diffusion of Si and Al at the interface between the insulation film on the substrate surface and the second Al film, when the substrate surface temperature was 600° C. or higher.

EXAMPLE G22

In the examples G16–G21, the first insulation film formed on the Si substrate of the structure shown in FIG. 18 or 19 was composed of $SiO_2$ obtained by thermal oxidation. In the present example, the insulation film on the Si substrate was composed of $CVD-SiO_2$, BSG, PSG, BPSG, P-SiN, T-Sin, LP-SiN, or ECR-SiN, with a thickness varied in 5 levels of 1000, 2500, 5000, 7500 and 10000 Å.

The thicknesses of the second Al film and of the second insulation film, and the ion implanting conditions, were same as those in the examples G16–G21.

As in said examples, the second Al was transformed into monocrystalline state when the substrate temperature was 250° C. or higher. Also as in said examples, the measurement of element distribution in the direction of depth, by Auger electron spectroscopy or secondary ion mass spectroscopy, indicated diffusion of Si and Al at the interface between the insulation film on the substrate surface and the second Al film, when the substrate surface temperature was 600° C. or higher.

EXAMPLE G23

In the examples G1-G22, the first and second Al films were both composed of pure aluminum formed by a LP-CVD method employing DMAH (dimethylaluminum hydride) and hydrogen. In the present example, pure aluminum was replaced by Al-Si, deposited by the addition of $Si_2H_6$ in LP-CVD in addition to DMAH and hydrogen. The Si content in the first and second Al-Si films was selected as 0.2, 0.5 or 1.0%.

The heat treatment was conducted in the same manner as in the examples G1-G22, except that Al was replaced by Al-Si.

There were obtained similar results to those in said examples G1-G22.

EXAMPLE G24

In the examples G1-G22, the first and second Al films were both formed by the LP-CVD method employing DMAH and hydrogen. In order to convert the second Al film into monocrystalline state by heat treatment, the first Al has to be monocrystalline. The LP-CVD method has the advantage of being capable of depositing the first and second Al films in succession in the same apparatus, but the second Al film need not be formed by CVD as long as it is polycrystalline or amorphous.

The present example employed the same specimens and heat treating conditions as those in the examples G1-G22, but the second Al film alone was formed by sputtering. Based on X-ray diffraction, electron beam diffraction pattern obtained by the conventional RHEED apparatus, and electron beam diffraction pattern and scanning $\mu$-RHEED image obtained by the scanning $\mu$-RHEED microscope, the second Al film in the deposited state was identified as polycrystals consisting of crystal grains of 1 $\mu$m or smaller.

By ion implantation and heat treatment in the same conditions as in the examples G1-G22, there were obtained similar results to those in said examples, wherein the second Al was transformed into monocrystalline state when the substrate temperature was 250° C. or higher. However the transformed monocrystalline area L3, measured in the same manner as in the examples G16-G22, was about 0.8 cm, which was shorter than 1.0 cm obtained when the second Al film was formed by CVD. Also as in the examples G1-G22, the measurement of element distribution in the direction of depth, by Auger electron spectroscopy or secondary ion mass spectroscopy indicated diffusion of Si and Al at the interface between the insulation film on the substrate surface and the second Al film, when the substrate surface temperature was 600° C. or higher.

EXAMPLE G25

There were employed same specimen structure and heating conditions as those in the examples G1-G22, but the first Al film was composed of Al-Si formed by LP-CVD employing DMAH, hydrogen and $Si_2H_6$, while the second Al film was composed of pure aluminum formed by LP-CVD employing DMAH and hydrogen. The Si content in the first Al-Si film was selected as 0.2, 0.5 or 1.0%.

There were obtained similar results to those in the examples G1-G22.

EXAMPLE G26

There were employed same specimen structure and heating conditions as in the examples G1-G22, but the first Al film was composed of Al-Si formed by LP-CVD employing DMAH, hydrogen and $Si_2H_6$, while the second Al film was composed of Al-Si formed by sputtering. The Si content in the first Al-Si film was selected as 0.2, 0.5 or 1.0%.

There were obtained similar results to those in the examples G1-G22. However the transformed monocrystalline area L8, measured as in the examples G16-G22, was 0.8 cm, which was shorter than 1.0 cm when the second Al was formed by CVD.

As explained in detail in the foregoing, the present invention can achieve transformation into monocrystalline state by a heat treatment, even in an Al film present on $SiO_2$, if said $SiO_2$ is so patterned to expose a Si surface and monocrystalline Al is present on thus exposed Si surface. Said monocrystalline transformation can be achieved with heat treatment of a low temperature. Said transformed monocrystalline Al can be utilized in wirings and can improve the resistances to migration phenomena.

We claim:

1. A metal film forming method for a semiconductor device, comprising the steps of:
    forming an insulation film on a principal surface of a semiconductor body;
    forming an aperture in said insulation film thereby exposing the surface of said semiconductor body therein;
    selectively depositing a first monocrystalline metal consisting essentially of aluminum, in said aperture;
    forming a non-monocrystalline metal film consisting essentially of aluminum on said first monocrystalline metal and on said insulation film by non-selective deposition; and
    heating said non-monocrystalline metal film to convert at least a part thereof to monocrystalline state, utilizing said first monocrystalline metal as a crystal seed.

2. A method according to claim 1, wherein an aluminum single crystal is selectively deposited as said first monocrystalline metal, in said aperture by a CVD method employing dimethylaluminum hydride gas and hydrogen gas.

3. A method according to claim 1, wherein said heating is conducted after a second insulation film is formed on said non-monocrystalline metal film.

4. A method according to claim 1, wherein said non-monocrystalline metal film is heated to 550° C. or higher.

5. A method according to claim 4, wherein said non-monocrystalline metal film is heated by resistance heating method.

6. A method according to claim 4, wherein said non-monocrystalline metal film is heated by radiation heating method.

7. A method according to claim 4, wherein said non-monocrystalline metal film is heated by laser beam heating method.

8. A method according to claim 4, wherein said non-monocrystalline metal film is heated by electron beam heating method.

9. A method according to claim 4, wherein said non-monocrystalline metal film is heated by induction heating method.

10. A metal film forming method for a semiconductor device, comprising the steps of:
   forming an insulation film on a principal surface of a semiconductor body;
   forming an aperture in said insulation film thereby exposing the surface of said semiconductor body;
   selectively depositing a first monocrystalline metal consisting essentially of aluminum, in said aperture;
   forming a polycrystalline metal film consisting essentially of aluminum, on said first monocrystalline metal and on said insulation film;
   converting said polycrystalline metal film into amorphous or microcrystalline metal film; and
   heating said amorphous or microcrystalline metal film to convert at least a part thereof into monocrystalline state, by utilizing said first monocrystalline metal as a seed crystal.

11. A method according to claim 10, wherein an aluminum single crystal is selectively deposited as said first monocrystalline metal, in said aperture by a CVD method employing dimethylaluminum hydride gas and hydrogen gas.

12. A method according to claim 10, wherein said conversion to amorphous or microcrystalline state is conducted by ion implantation.

13. A method according to claim 10, wherein said heating is conducted after a second insulation film is formed on said amorphous or microcrystalline metal film.

14. A method according to claim 10, wherein said amorphous or microcrystalline metal film is heated to 250° C. or higher.

* * * * *

UNITED STATES PATENT AND TRADEMARK OFFICE
CERTIFICATE OF CORRECTION

PATENT NO.   : 5,208,187
DATED        : May 4, 1993
INVENTOR(S)  : KAZUO TSUBOUCHI, ET AL.

It is certified that error appears in the above-identified patent and that said Letters Patent is hereby corrected as shown below:

On title page,

IN [76] INVENTORS

"2-chrome" should read --2-chome-- and
"1-chrome" should read --1-chome--.

IN [56] REFERENCES CITED

Under FOREIGN PATENT DOCUMENTS, "62-123716  11/1985  Japan" should read --62-123716  6/1987  Japan--.

SHEET 2 OF 15

FIG. 2B, "BEAR" should read --VIA--.

COLUMN 1

Line 9, "wirings" should read --wirings,--.
Line 54, "specy" should read --species--.

COLUMN 2

Line 4, "errosion" should read --erosion--.

COLUMN 3

Line 12, "above.  There" should read --above, there--.

COLUMN 5

Line 41, "speed" should read --seed--.
Line 57, "electrondonating" should read --electron-donating--.

--

UNITED STATES PATENT AND TRADEMARK OFFICE
CERTIFICATE OF CORRECTION

PATENT NO. : 5,208,187
DATED : May 4, 1993
INVENTOR(S) : KAZUO TSUBOUCHI, ET AL.

It is certified that error appears in the above-identified patent and that said Letters Patent is hereby corrected as shown below:

COLUMN 6

Line 38, "AlCVD method" should read --Al-CVD method--.
Line 65, "three or" should read --three- or--.

COLUMN 8

Line 35, "thermocouple 32" should read --thermocouple 33--.

COLUMN 9

Line 52, "Å A" should read --Å--.

COLUMN 12

Line 19, "specimen," should read --specimens,--.

COLUMN 13

Line 43, "10 82 m" should read --10 µm--.
Line 53, "same" should read --the same--.

COLUMN 15

Line 12, "abovementioned" should read --above-mentioned--.
Line 35, "treatment" should read --treatment,--.
Line 57, "cross sectional" should read --cross-sectional--.
Line 58, "of Al-Si" should read --or Al-Si--.

UNITED STATES PATENT AND TRADEMARK OFFICE
CERTIFICATE OF CORRECTION

PATENT NO. : 5,208,187
DATED : May 4, 1993
INVENTOR(S) : KAZUO TSUBOUCHI, ET AL.

It is certified that error appears in the above-identified patent and that said Letters Patent is hereby corrected as shown below:

COLUMN 16

Line 2, "same" should read --the same--.
Line 10, "pattern" should read --pattern as shown in FIG. 2C--.
Line 47, "hallow" should read --halo--.

COLUMN 17

Line 38, "15minutes" should read --15 minutes--.

COLUMN 19

Line 26, "diffractin" should read --diffraction--.
Line 48, "dectron" should read --electron--.

COLUMN 25

Line 2, "Al The" should read --Al.  The--.
Line 13, "(AES), of" should read --(AES), the specimen heat treated at 650°C. showed diffusion of--.

COLUMN 26

Line 1, "were" should read --where--.
Line 16, "heated" should read --heat--.
Line 31, "boron-and" should read --boron- and--.
Line 40, "treat" should read --treated--.

UNITED STATES PATENT AND TRADEMARK OFFICE
CERTIFICATE OF CORRECTION

PATENT NO. : 5,208,187
DATED : May 4, 1993
INVENTOR(S) : KAZUO TSUBOUCHI, ET AL.

It is certified that error appears in the above-identified patent and that said Letters Patent is hereby corrected as shown below:

COLUMN 27

Line 30, "IMAGE BY THE SCANNING" should read --image by the scanning--.
Line 47, "employed" should read --employing--.
Line 60, "and-the" should read --and the--.

COLUMN 29

Line 28, "of" should read --or--.
Line 66, "convention" should read --conventional--.

COLUMN 32

Line 30, "beam In" should read --beam. In--.

COLUMN 33

Line 40, "scaning" should read --scanning--.

COLUMN 35

Line 32, "415.5 nm)" should read --514.5 nm)--.

COLUMN 36

Line 29, "replacement" should read --replacement of--.

COLUMN 37

Line 30, "of speci-" should read --of the speci- --.

UNITED STATES PATENT AND TRADEMARK OFFICE
CERTIFICATE OF CORRECTION

PATENT NO. : 5,208,187
DATED : May 4, 1993
INVENTOR(S) : KAZUO TSUBOUCHI, ET AL.

It is certified that error appears in the above-identified patent and that said Letters Patent is hereby corrected as shown below:

COLUMN 38

Line 49, "in-the" should read --in the--.

COLUMN 39

Line 59, "EC-SiN," should read --ECR-SiN,--.

COLUMN 41

Line 9, "insulatiln" should read --insulation--.

COLUMN 44

Line 29, "500," should read --5000,--.
Line 54, "though utilizing" should read --though the intensity was weak. Also the scanning μ-RHEED image utilizing--.

COLUMN 45

Line 3, "hallow" should read --halo--.
Line 4, "neigher" should read --neither--.
Line 9, "iron" should read --ion-- and "heated" should read --heat--.
Line 10, "over," should read --oven,--.

COLUMN 46

Line 17, "$5 \times 10^{16} cm^{-2}$." should read --$1 \times 10^{16} cm^{-2}$.--.
Line 49, "speciment," should read --specimen,--.

UNITED STATES PATENT AND TRADEMARK OFFICE
CERTIFICATE OF CORRECTION

PATENT NO. : 5,208,187
DATED : May 4, 1993
INVENTOR(S) : KAZUO TSUBOUCHI, ET AL.

It is certified that error appears in the above-identified patent and that said Letters Patent is hereby corrected as shown below:

COLUMN 47

Line 38, "example GI," should read --example G1,--.
Line 64, "convetional" should read --conventional--.

COLUMN 48

Line 64, "speciment," should read --specimen,--.
Line 67, "G1-G12" should read --G1-G12,--.

COLUMN 49

Line 43, "over" should read --oven--.
Line 47, "over," should read --oven--.
Line 55, "with temperature" should read --with a thickness of 500 or 1000 Å. The heat treating temperature--.

COLUMN 52

Line 24, "in-the" should read --in the--.
Line 43, "scanning results" should read --scanning µ-RHEED microscope. There were obtained similar results--.

UNITED STATES PATENT AND TRADEMARK OFFICE
CERTIFICATE OF CORRECTION

PATENT NO. : 5,208,187
DATED : May 4, 1993
INVENTOR(S) : KAZUO TSUBOUCHI, ET AL.

It is certified that error appears in the above-identified patent and that said Letters Patent is hereby corrected as shown below:

COLUMN 53

Line 57, "spectroscopy" should read --spectroscopy,--.

Signed and Sealed this

Eighteenth Day of October, 1994

Attest:

BRUCE LEHMAN

Attesting Officer         Commissioner of Patents and Trademarks